(12) United States Patent  (10) Patent No.: US 8,659,959 B2
Kim et al.  (45) Date of Patent: Feb. 25, 2014

(54) ADVANCED MEMORY DEVICE HAVING IMPROVED PERFORMANCE, REDUCED POWER AND INCREASED RELIABILITY

(75) Inventors: Kyu-Hyoun Kim, Yorktown Heights, NY (US); George L. Chiu, Yorktown Heights, NY (US); Paul W. Coteus, Yorktown Heights, NY (US); Daniel M. Dreps, Austin, TX (US); Kevin C. Gower, Poughkeepsie, NY (US); Hillery C. Hunter, Yorktown Heights, NY (US); Charles A. Kilmer, Essex Junction, VT (US); Warren E. Maule, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/567,353

(22) Filed: Aug. 6, 2012

(65) Prior Publication Data
US 2012/0300563 A1  Nov. 29, 2012

Related U.S. Application Data

(62) Division of application No. 12/553,400, filed on Sep. 3, 2009.

(51) Int. Cl.
*G11C 7/00* (2006.01)
(52) U.S. Cl.
USPC ... 365/193; 365/189.07; 365/194; 365/233.1; 714/805; 714/707; 714/709
(58) Field of Classification Search
None
See application file for complete search history.

(56) References Cited

U.S. PATENT DOCUMENTS

| | | | |
|---|---|---|---|
| 3,814,922 A | 6/1974 | Nibby et al. | |
| 5,956,352 A | 9/1999 | Tatosian et al. | |
| 6,426,908 B1 | 7/2002 | Hidaka | |
| 6,496,897 B2 | 12/2002 | Ware et al. | |
| 7,307,909 B2 | 12/2007 | Matsui et al. | |
| 7,522,440 B2 | 4/2009 | Park et al. | |
| 7,755,402 B1 * | 7/2010 | Ku et al. | 327/153 |
| 7,865,784 B1 | 1/2011 | White et al. | |
| 8,019,957 B1 * | 9/2011 | White et al. | 711/167 |
| 2002/0064079 A1 | 5/2002 | Sato et al. | |
| 2002/0160558 A1 * | 10/2002 | Ernst et al. | 438/200 |

(Continued)

OTHER PUBLICATIONS

Apparatus, System and Method for Providing Error Protection for Data-Masking Bits; U.S. Appl. No. 12/107,908, filed Apr. 23, 2008; pp. 44.

(Continued)

*Primary Examiner* — John Trimmings
(74) *Attorney, Agent, or Firm* — Cantor Colburn LLP; Daniel Morris

(57) ABSTRACT

An advanced memory having improved performance, reduced power and increased reliability. A memory device includes a memory array, a receiver for receiving a command and associated data, error control coding circuitry for performing error control checking on the received command, and data masking circuitry for preventing the associated data from being written to the memory array in response to the error control coding circuitry detecting an error in the received command. Another memory device includes a programmable preamble. Another memory device includes a fast exit self-refresh mode. Another memory device includes auto refresh function that is controlled by the characteristic device. Another memory device includes an auto refresh function that is controlled by a characteristic of the memory device.

5 Claims, 56 Drawing Sheets

(56) References Cited

U.S. PATENT DOCUMENTS

| | | |
|---|---|---|
| 2002/0191467 A1 | 12/2002 | Matsumoto et al. |
| 2003/0081486 A1 | 5/2003 | Yamauchi et al. |
| 2004/0042330 A1 | 3/2004 | Matsubara |
| 2005/0034006 A1* | 2/2005 | Schoenfeld et al. .......... 713/401 |
| 2006/0007760 A1* | 1/2006 | Schaefer ....................... 365/194 |
| 2006/0069948 A1 | 3/2006 | Seo et al. |
| 2007/0101073 A1 | 5/2007 | Macri et al. |
| 2007/0104327 A1 | 5/2007 | Macri et al. |
| 2008/0163007 A1 | 7/2008 | Shaeffer et al. |
| 2008/0253214 A1 | 10/2008 | Stimak et al. |
| 2009/0147608 A1 | 6/2009 | Klein |
| 2009/0187794 A1 | 7/2009 | Kim et al. |
| 2009/0268539 A1 | 10/2009 | Ruckerbauer et al. |
| 2011/0209036 A1 | 8/2011 | Yang et al. |
| 2012/0096218 A1* | 4/2012 | Ahmad et al. ................ 711/103 |

OTHER PUBLICATIONS

ELPIDA—Technical Note "Low Power Function of Mobile RAM Auto Temperature Compensated Self Refresh (ATCSR)", Elpida Memory, Inc., Nov. 2005, Japan; url: http://www.elpida.com; document No. E0599E20; 4 pgs.

* cited by examiner

Type-II
- MC sends 4 more bits through Address
  - DRAM compares # of '1's in parity and # of masked bytes, if matched perform masking

| A14 | A2 | A1 | A0 |                        |
|-----|----|----|----|------------------------|
| 0   | X  | X  | X  | No DM                  |
| 1   | 0  | 0  | 0  | Type-I                 |
| 1   | 0  | 0  | 1  | Type-II (#masked bytes=1) |
| 1   | 0  | 1  | 0  | Type-II (#masked bytes=2) |
| 1   | 0  | 1  | 1  | Type-II (#masked bytes=3) |
| 1   | 1  | 0  | 0  | Type-II (#masked bytes=4) |
| 1   | 1  | 0  | 1  | Type-II (#masked bytes=5) |
| 1   | 1  | 1  | 0  | Type-II (#masked bytes=6) |
| 1   | 1  | 1  | 1  | Type-II (#masked bytes=7) | parity vector: 01010010, 00101000, 11010111, 10110010, 10110010, 10110010, 10110010, 10110010

FIG. 23

| Ax | Ay | PL |
|---|---|---|
| 0 | 0 | 1 |
| 0 | 1 | 2 |
| 1 | 0 | 3 |
| 1 | 1 | 4 |

Fig. 30

ADVANCED MEMORY DEVICE HAVING IMPROVED PERFORMANCE, REDUCED POWER AND INCREASED RELIABILITY

This application is a divisional of U.S. patent application Ser. No. 12/553,400, filed Sep. 3, 2009, the disclosure of which is incorporated by reference herein in its entirety.

BACKGROUND

This invention relates generally to memory within a computing environment, and more particularly to memory devices.

Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the interconnect interface(s).

Extensive research and development efforts are invested by the industry, on an ongoing basis, to create improved and/or innovative solutions to maximizing overall computer system performance and density by improving the memory devices utilized, in addition to the memory systems/subsystems making use of such devices. It is important that memory device improvements meet the increased performance, reduced power and increased reliability of future systems by integrating enhanced features and functions to enable the design of memory systems that can efficiently and effectively make use of such improvements. High-availability systems present further challenges as related to overall system reliability due to customer expectations that new computer systems will markedly surpass existing systems in regard to mean-time-between-failure (MTBF), in addition to offering additional functionality, increased performance, increased storage, lower operating costs, etc. Other frequent customer requirements further exacerbate the computer system design challenges, and include such items as ease of upgrade and reduced system environmental impact (such as space, power, and cooling).

BRIEF SUMMARY

An exemplary embodiment of the present invention is a memory device. The memory device includes: a memory array; a receiver for receiving a command and associated data; error control coding circuitry for performing error control checking on the received command; and data masking circuitry for preventing the associated data from being written to the memory array in response to the error control coding circuitry detecting an error in the received command.

Another exemplary embodiment is memory device. The memory device includes an internal clock for generating clock signals; a command receiver for receiving commands; a data strobe driver for generating a data strobe signal, the data strobe signal utilized to capture data on a data bus, the capturing upon completion of a data strobe preamble time, wherein the completion of the data strobe preamble time indicates that the data strobe signal has achieved a steady switching state and is measured from receipt of a command on the command receiver; and programmable preamble control circuitry in communication with the data strobe driver for determining when the data strobe preamble is completed, the programmable preamble control circuitry programmed during memory device initialization.

A further exemplary embodiment is a memory device. The memory device includes: a memory array including memory cells; self-refresh circuitry for operating the memory device in a self-refresh mode, the self-refresh circuitry including a clock for initiating a refresh of one or more memory cells on the memory array when the memory device is in a self refresh mode; and memory device circuitry for updating one or more programmable memory device settings in response to a current operating environment of the memory device, the updating performed in response to the clock during the self-refresh mode. The updating of one or more of the programmable circuits of the memory array expedites a return of the memory device to normal operation upon exiting the self-refresh mode.

A further exemplary embodiment is a memory device. The memory device includes: a sensor for measuring a characteristic of the memory device; a receiver for receiving refresh commands; and refresh circuitry. The refresh circuitry is for: determining if a refresh should be performed at the memory device in response to receiving a refresh command, the determining responsive to the characteristic of the memory device; performing the refresh at the memory device in response to determining that the refresh command should be performed; and not performing the refresh at the memory device in response to determining that the refresh command should not be performed.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 23 depicts an alternate exemplary embodiment that may be implemented to perform data masking;

FIG. 30 depicts a mode register bit decoding table for preamble length (PL) that may be implemented by an exemplary embodiment;

DETAILED DESCRIPTION

Figure 1:
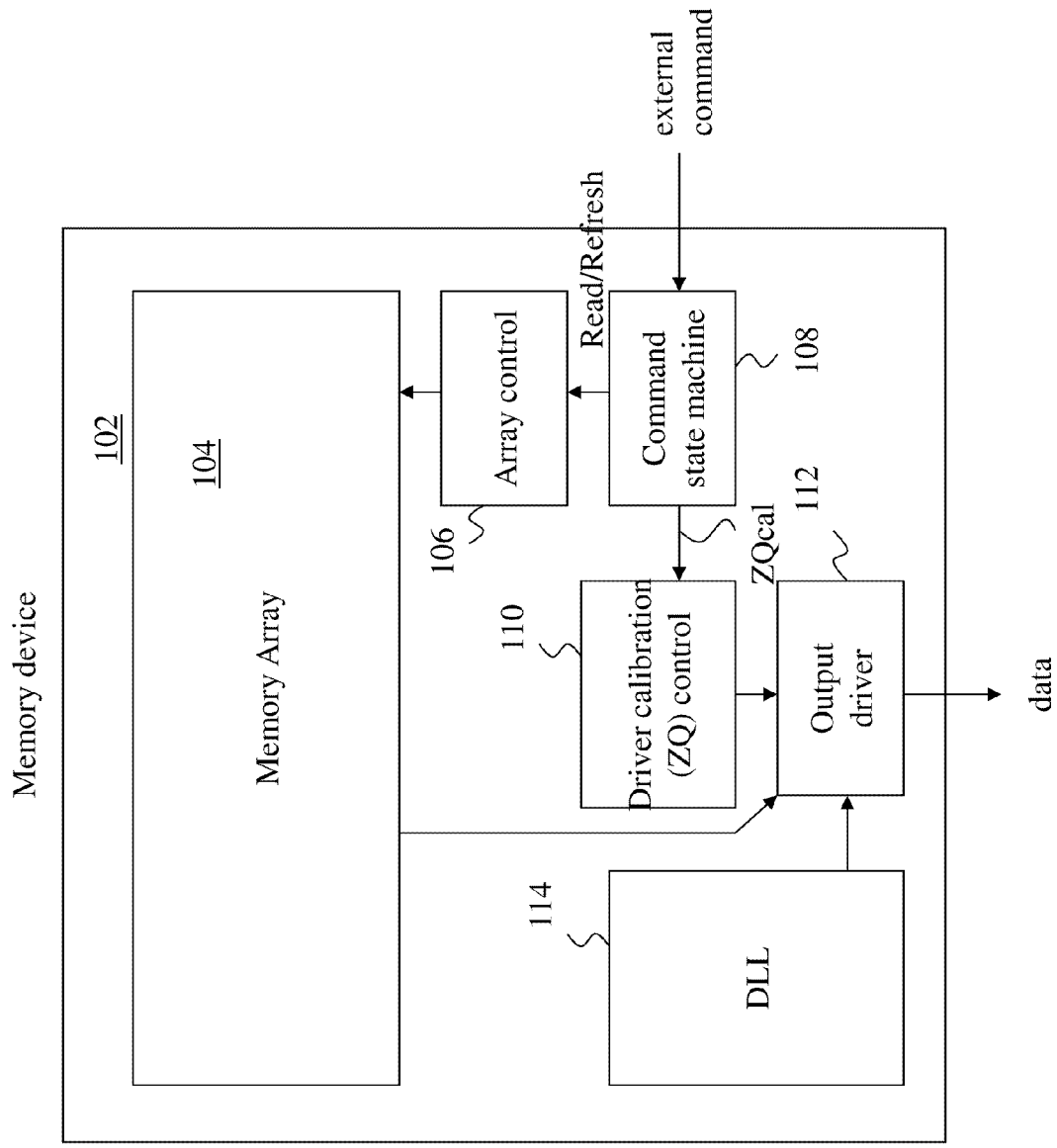
FIG. 1 depicts a block diagram of a contemporary memory device.

An exemplary embodiment includes a memory device that reduces power consumption by synchronizing a delay locked loop (DLL) in the memory device on a periodic basis. A new command is provided to instruct the memory device to perform the synchronizing of the DLL. Exemplary embodiments are contrasted to contemporary memory devices, where the DLL is updated on a continuous basis and consumes power on a continuous basis to perform the synchronization.

Another exemplary embodiment includes a memory device that improves data integrity by preventing data associated with a faulty command from being written to memory. This is performed without increasing the latency for memory write commands by processing a write command in a normal fashion and blocking a data path from being written using existing data masking circuitry if a parity error is detected on the address/command line.

Another exemplary embodiment includes a method of writing data masking bits without requiring a dedicated pin on the memory device or an additional clock cycle to transfer the masking bits. The masking bits are encoded into the bytes to be masked so that the receiving memory device can determine which bytes to write to memory and which bytes not to write to memory such that write data masking can be completed without a reduction in data transfer bandwidth or an increase in device pin count.

Another exemplary embodiment allows the number of preamble cycles to be programmable so that the length of the preamble can vary based on factors such as the current data rate and bus loading conditions. This provides an increase in bandwidth because the preamble time no longer has to be set to take into account a worst case scenario, but instead can be set in response to a current environment or command.

A further exemplary embodiment includes a self-refresh mode with no need to re-lock the DLL during or upon self-refresh exit. This provides an increase in bandwidth and a viable means of reducing power in a system because fewer cycles are required to exit self-refresh. The decrease in power usage is achievable as self-refresh may be used more frequently because it takes fewer clock cycles to access the dynamic random access memory (DRAM) after exiting self-refresh. In an exemplary embodiment, during self-refresh the DLL is periodically woken up, updated to reflect the current conditions after which the DLL is shut down.

A further exemplary embodiment includes a memory device that controls how often to perform refreshes based on a current temperature of the memory device. External refresh commands are typically issued by a memory controller or other interface device, apply to a group of DRAMS (e.g., all DRAMs in a memory rank and/or on a memory module), and may be issued in response to only one (or some other subset) of the DRAMs in the group requiring a refresh due to its local temperature exceeding a pre-defined limit. Exemplary embodiments provide a self-adjusting method of controlling a refresh rate inside a DRAM by skipping (or ignoring) external refresh commands (e.g. auto-refresh commands) when the device local temperature is such that a refresh is not required. In an exemplary embodiment, the rate of refresh is determined by each individual DRAM based on the temperature of the DRAM.

Exemplary embodiments reduce power consumption at a memory device by updating a DLL located within the memory device on a periodic basis. Standby power consumption represents a large percentage of power usage in high capacity memory systems where there may be a large number of ranks of memory in the memory system. However, at any given point in time most of the ranks are in a standby mode while only a subset of the ranks (e.g., one rank) is being accessed. Powering the DLL takes a large share of the memory standby power and typically the DLL circuitry (e.g., the phase detector, replica tree, up/down counter, etc.) are continuously active and monitoring changes to the environment—thus, the DLL signal path and control path are both powered on in all but conventional self-refresh operations. This results in the need to fully relock the DLL upon exit of self-refresh—thereby incurring a significant delay prior to having access to data in the memory device. In contrast, and as implemented by an exemplary embodiment described herein, the DLL signal path and DLL control path are independently operable. This allows the DLL control path not to be continuously running and to be updated periodically as needed to compensate for factors such as voltage (e.g. VDD) drift and temperature drift.

Exemplary embodiments utilize a new command referred to as the "memory calibration" or MEMcal" command to control the DLL control path independently of the DLL signal path. When the MEMcal command is issued to a memory device that is in normal operating mode (e.g. not in a self-refresh state), the memory device initiates the DLL variable delay adjustments by turning on the DLL control path (also referred to herein as a DLL feedback loop). After the digital control bits in the DLL feedback loop are updated (e.g. for one or a small number of cycles), the DLL feedback loop is turned off automatically, and the memory is ready to receive new commands—thereby reducing the power consumption of the device during normal operation. Further, conventional memory devices (e.g., DDR3 synchronous DRAMs, or DDR3 SDRAMs) have a driver calibration (ZQcal) command and exemplary embodiments merge the existing ZQcal command with a DLL update command into the single MEMcal command to hide the time (and command bandwidth) required for the DLL update. In additional exemplary embodiments, other calibrations (such as receiver calibration) are performed while the driver is being calibrated and/or the DLL is being updated.

FIG. 1 depicts a memory device 102 having a memory array 104, an array control 106, a DLL 114, a ZQcal control 110, an output driver 112, and a command state machine 108. As depicted in FIG. 1, an external command (e.g., a write command, a read command, a calibrate command) comes into the command state machine 108. The command state machine 108 decodes the command. If the command is a memory access command (e.g., a read, write, refresh) then the command is sent to the array control 106 which interfaces with the memory array to complete the command. If the command is a ZQcal command, then the command is sent to the ZQcal control 110. The ZQcal control 110 controls when the driver drives the data (received from the memory array 104) relative to an internal clock received from the DLL 114. Typically, a ZQcal command is sent by the memory controller periodically to perform calibration of the output driver 112 such that the driver 112 outputs data at the appropriate time in a given environment. Also shown in FIG. 1 is a DLL 114, which generates a clock internal to the memory device 102. In contemporary memory devices, such as the memory device 102 depicted in FIG. 1, the DLL is running and being re-locked (or re-synchronized) continuously while the memory device 102 is powered on and not in the contemporary "self refresh" mode. As is known in the art, the power required to operate the DLL is a major component of main memory device power when the device is not processing data (e.g. during "standby").

Figure 2:
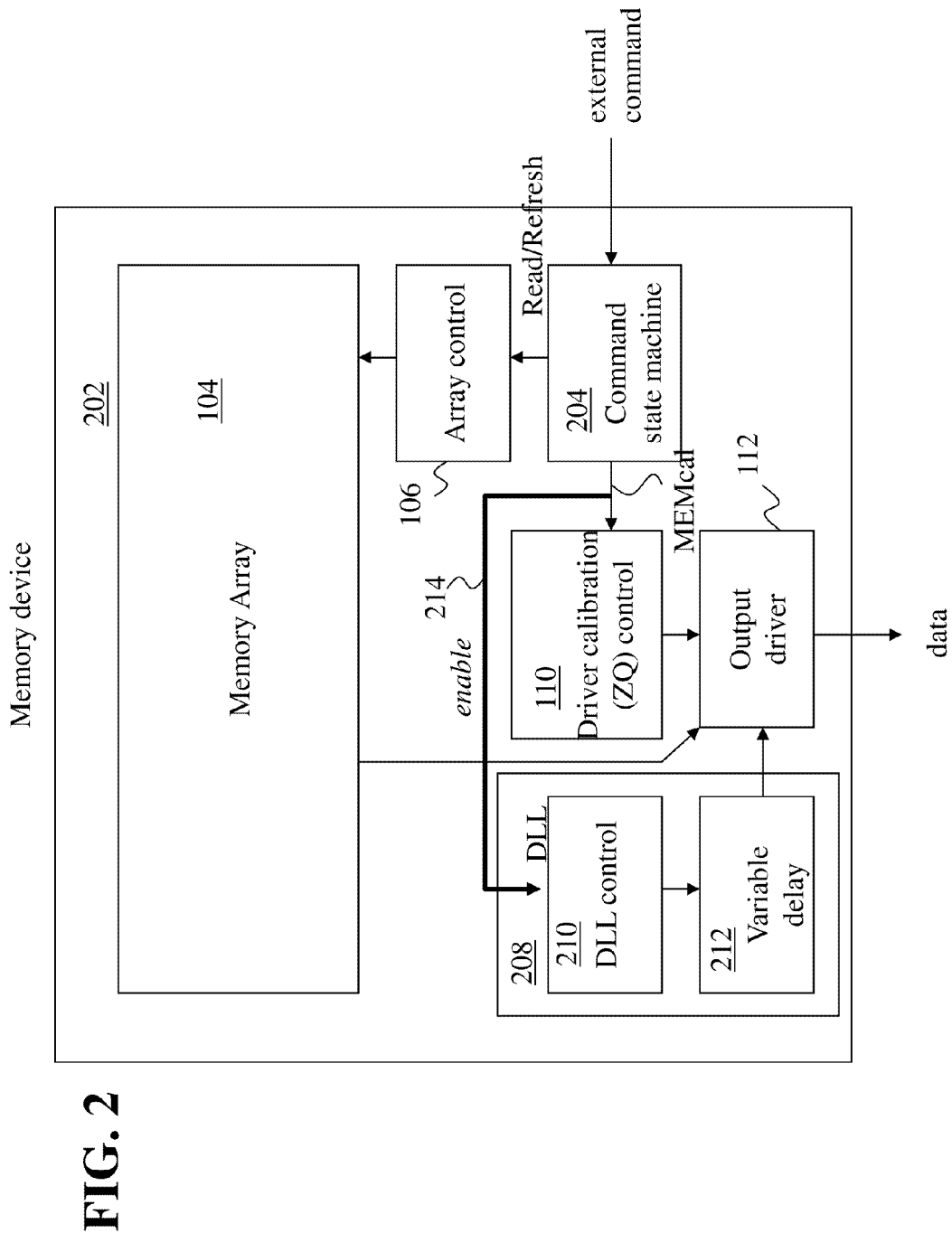
FIG. 2 depicts a memory device that may be implemented by an exemplary embodiment.

FIG. 2 depicts a memory device 202 that may be implemented by an exemplary embodiment. It includes components that are similar to the memory device 102 depicted in FIG. 1, with the addition of an enable line 214 between the command state machine 204 and the DLL 208. The memory device 202 depicted in FIG. 2 includes a memory array 104, an array control 106, a DLL 208, a ZQcal control 110, an output driver 112, and a command state machine 204. The DLL 208 depicted in FIG. 2 shows a DLL control block 210 (circuitry that includes the replica clock path and up/down counter) and a variable delay block 212 (circuitry that determines the timing of the clock output from the DLL 208 relative to the clock received by the DLL) that are part of the DLL 208. The memory device 202 depicted in FIG. 2 supports a new command, MEMcal, that in an exemplary embodiment includes the functions of the previously discussed ZQcal command—initiating both the ZQ calibration operation as well as enabling the DLL to update via the DLL control 210 portion of the DLL 208. As depicted in FIG. 2, an external command (e.g., a write command, a read command, a calibrate command) is received by the command state machine 204, and the command state machine 204 decodes the command. If the command is a MEMcal command, then the command is sent to the ZQcal control 110 and a signal is sent across the enable line 214 to the DLL control circuitry 210.

Figure 3:
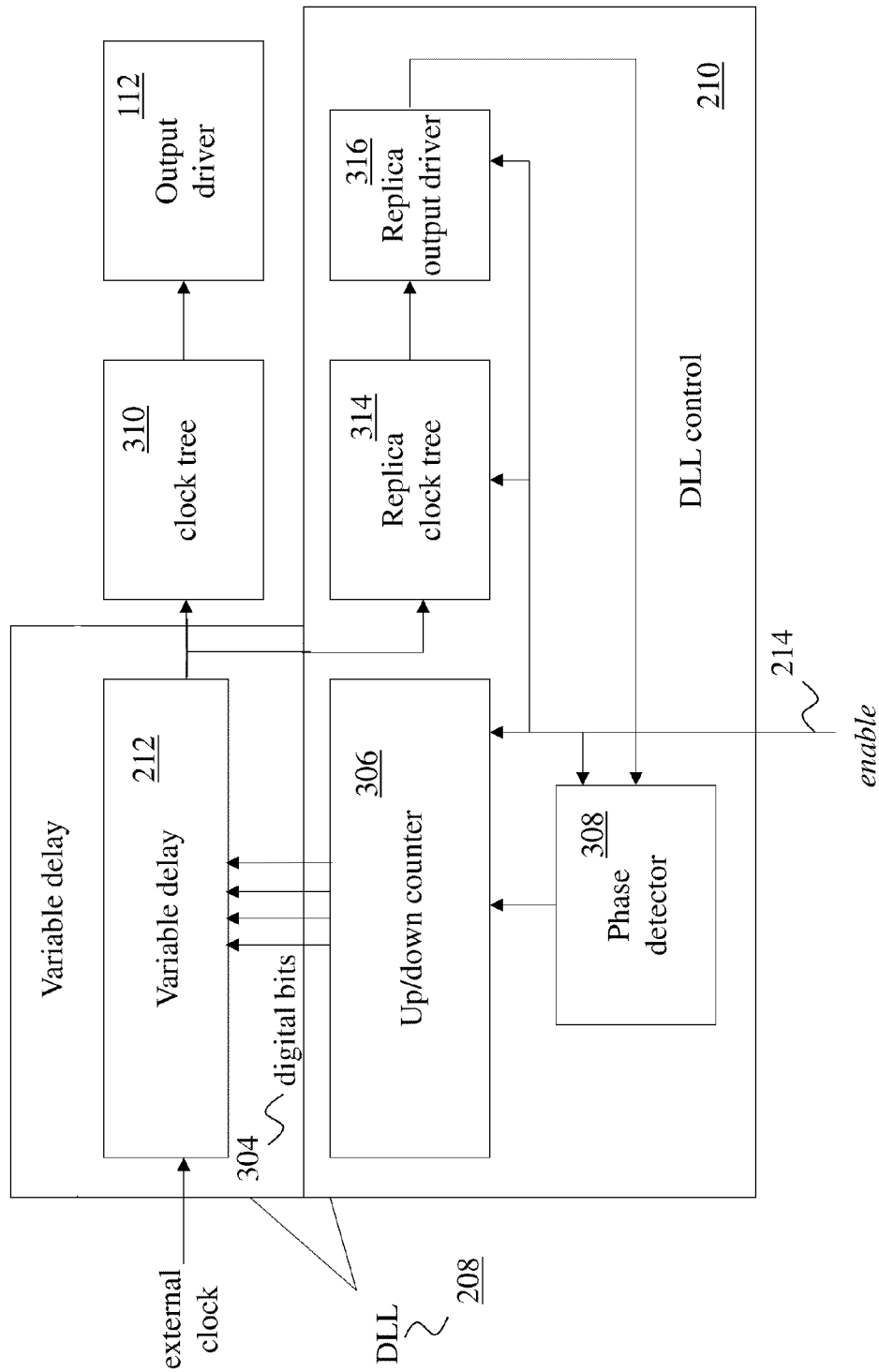
FIG. 3 depicts a more detailed view of the delay locked loop (DLL) depicted in FIG. 2.

FIG. 3 depicts a more detailed view of the DLL 208 depicted in FIG. 2. The DLL 208 includes the variable delay block 212 that receives an external clock and adjusts the clock based on digital bits 304 received from an up/down counter 306 (or other variable delay controller) in the DLL control block 210. The clock output by the variable delay block 212 is sent through a clock tree 310 and then to the output driver 112 for use in such purposes as in latching and enabling the output data. The clock output by the variable delay block 212 is also sent through a replica clock tree 314 and a replica output driver 316. Output from the replica output driver 316 is sent to a phase detector 308 to be used as input to the up/down counter 306, which then forwards the required digital bits to establish the current delay in the variable delay block 212 based on drift detected by the phase detector 308. As is known in the art, drift may be due to a variety of factors such as, but not limited to temperature and voltage variations.

The internal monitoring and control block 210 portion of the DLL 208 generally runs at the speed of the clock and consumes an appreciable amount of power (especially when the memory device is in an otherwise "idle" state). Exemplary embodiments control whether the DLL control block 210 is operating based on the enable signal 214 that is generated in response to the new MEMcal command. As shown in FIG. 2, the enable signal 214 is utilized to control the state (on/off) of the circuitry comprising control block 210 including the phase detector 308, the up/down counter 306, the replica clock tree 314, and the replica output driver 316. Terms used herein to describe the processing performed by the control block 210 include synchronizing, re-locking, locking, calibrating, re-synchronizing, and updating. When the control block 210 is disabled, the variable delay block 212 is not changed from its current state and when the control block 210 is enabled, the variable delay block 212 is adjusted (e.g., is calibrated in response to current conditions).

Figure 4:
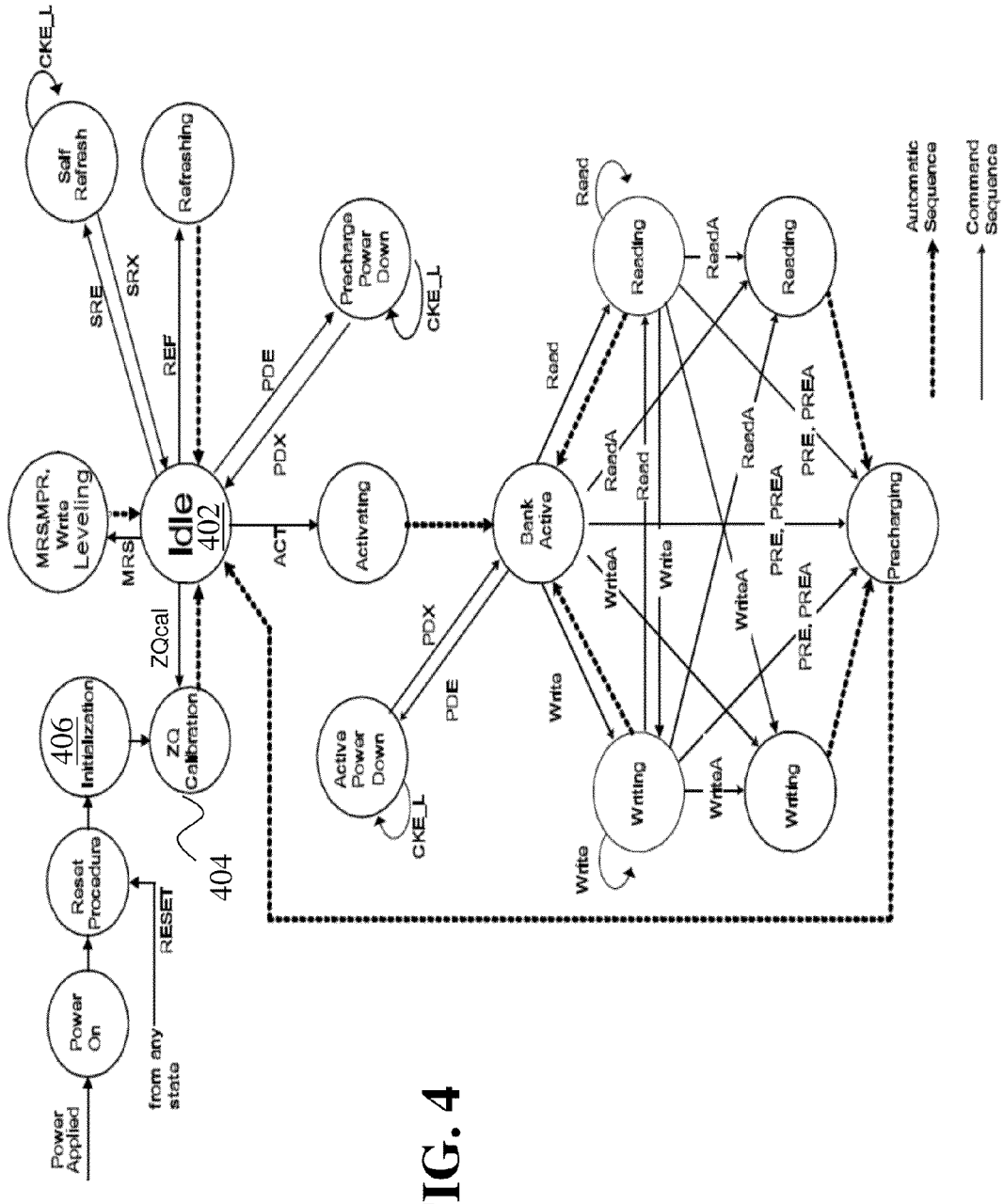
FIG. 4 depicts a contemporary state diagram for a memory device.

FIG. 4 depicts an exemplary state diagram for a memory device (e.g., a DDR3 SDRAM). As shown in FIG. 4, a ZQ calibration state 404 may be entered via an initialization state 406 or via an idle state 402 (e.g., when a ZQcal command is received). Once the ZQ calibration is complete, the memory device returns to the idle state 402 and is available for various operations as shown in FIG. 4.

Figure 5:
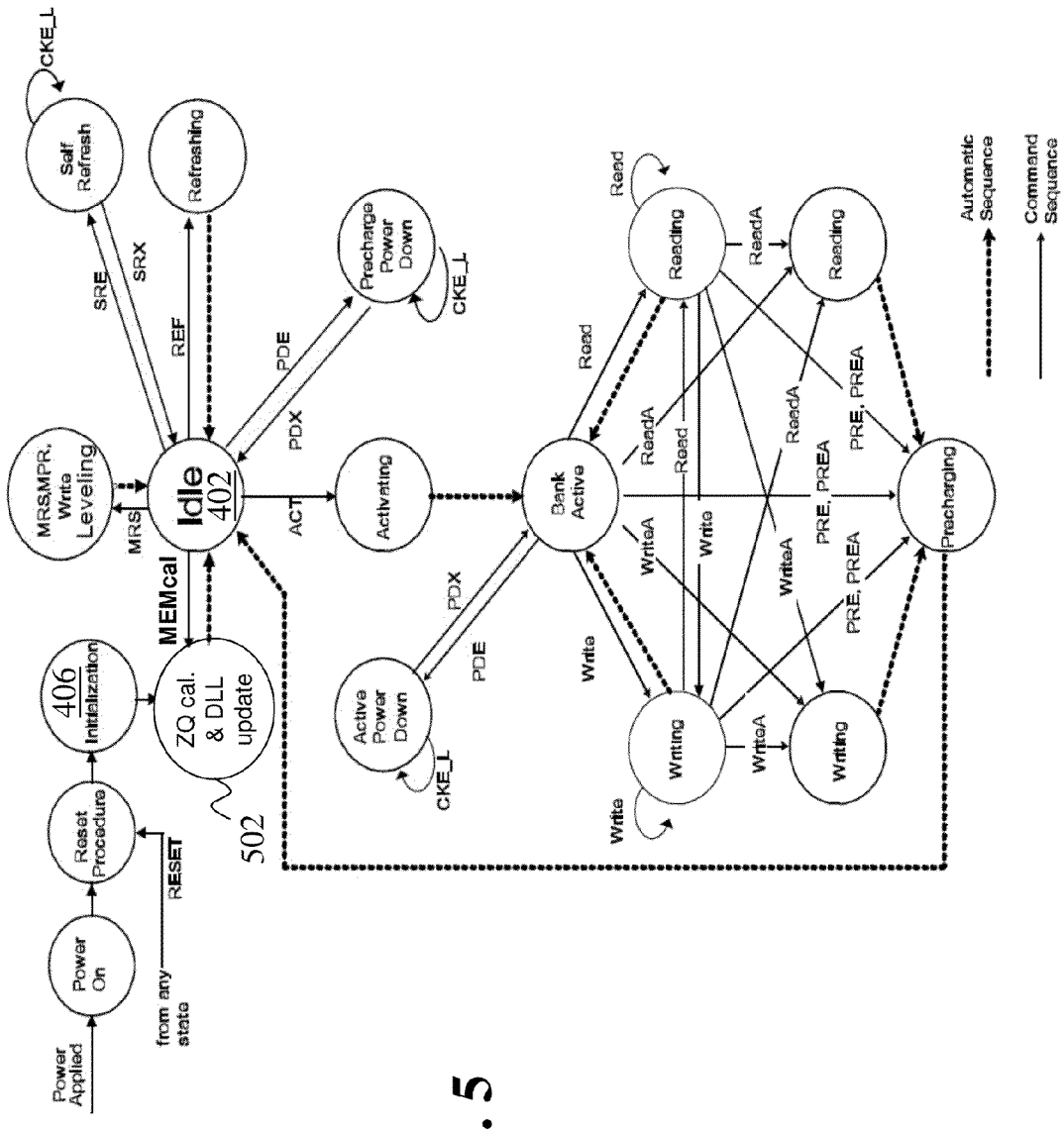
FIG. 5 depicts an exemplary state diagram for a memory device that supports a MEMcal command that may be implemented by an exemplary embodiment.

FIG. 5 depicts an exemplary state diagram for a memory device, such as memory device 202, that supports the exemplary MEMcal (or alternately named) command. As shown in FIG. 5, a combined ZQ calibration and DLL update state 502 may be entered via an initialization state 406 or via an idle state 402 (e.g., when a MEMcal command is received). Once the ZQ calibration and DLL update are completed, the memory device returns to the idle state 402. In an exemplary embodiment, in response to receiving the MEMcal command, the driver timing relationships are updated and the DLL 208 is activated to permit the internal clock to be re-synchronized consistent with the current conditions. In an exemplary embodiment, the DLL 208 synchronizes by turning on the DLL control block 210 depicted in FIG. 3 for a number of clock cycles to recalibrate the DLL (e.g. update variable delay 212, etc). Depending on whether the environment has changed, this may result in an adjustment of the up/down counter 306 and the variable delay block 212. Once the DLL 208 has been resynchronized, the DLL control block 210 is turned off, thus reducing power consumption in the memory device.

The number of clock cycles for the control block 210 to resynchronize the internal clock, in response to a MEMcal command in a worst-case situation may be included as part of a memory device specification. Alternatively, the control block 210 may continue to operate after receipt of a MEMcal command until a condition is satisfied (e.g., the digital bits 304 are stable for a number of clock cycles). In an exemplary embodiment, the ZQ calibration and the DLL updating are performed in parallel and once they are complete, the memory device returns to the idle state 402. Various other exemplary methods for the periodic updating of the memory device DLL may be implemented without departing from the scope of embodiments of the invention.

The DLL update can be combined with any number of memory device functions, and is not limited to being combined with the ZQ calibration. In addition, the DLL update may be performed on its own in response to receiving a command, such as the MEMcal command.

Figure 6:
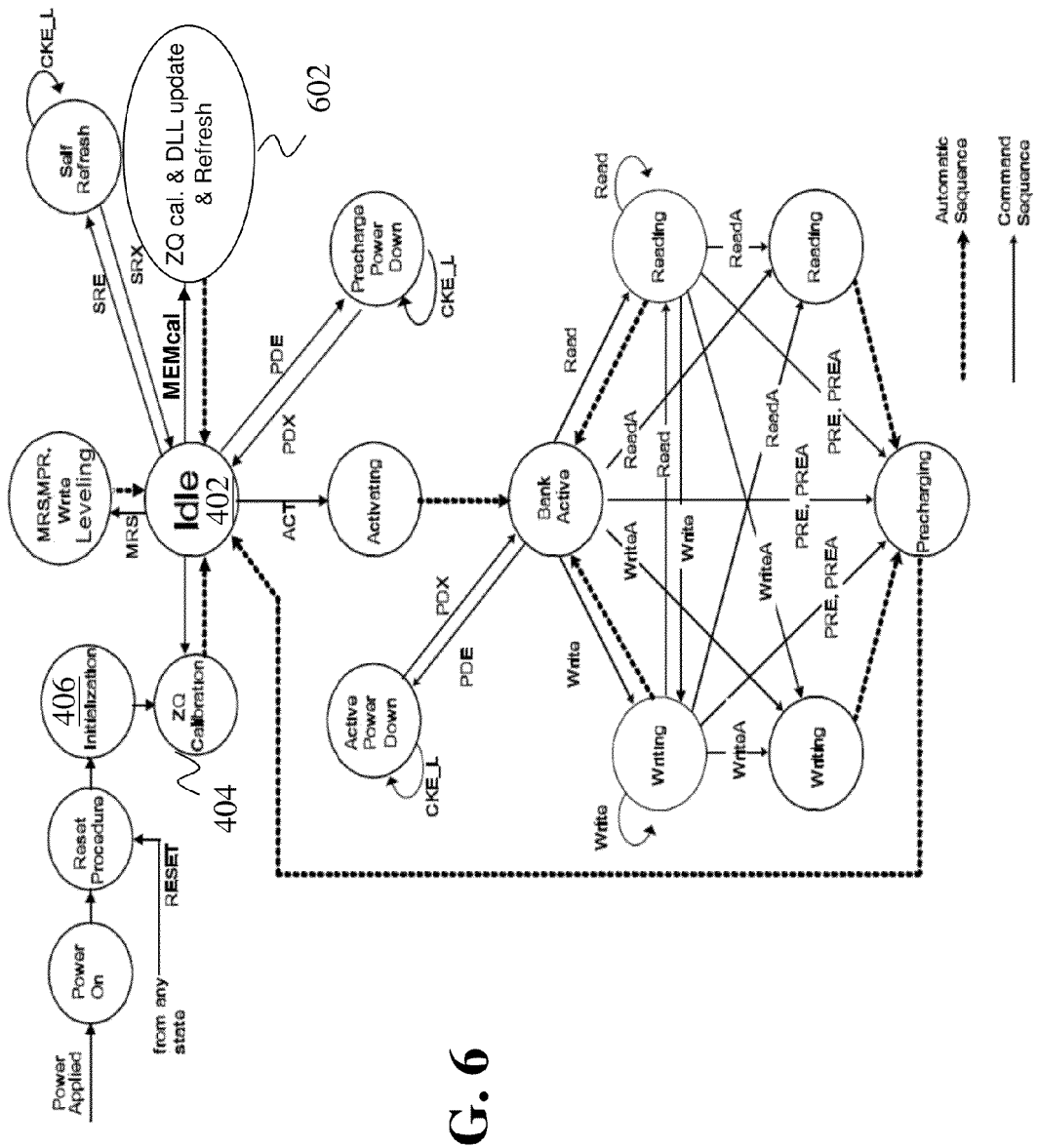
FIG. 6 depicts an exemplary state diagram for a memory device that supports a memory calibration (MEMcal) command that includes driver calibration, DLL update, and refresh.

FIG. 6 depicts an exemplary state diagram for a memory device that supports a MEMcal command that includes the operations of ZQ calibration, DLL update, and refresh. As shown in FIG. 6, a combined ZQ calibration, DLL update state, and refresh state 602 may be entered from an idle state 402 (e.g., in response to receipt of a MEMcal command). Once the ZQ calibration, DLL update, and/or refresh operations are completed, the memory device returns to the idle state 402. In an alternate exemplary embodiment, the MEMcal command causes all or a subset of ZQ calibration, DLL update, and refresh to occur.

Figure 7:
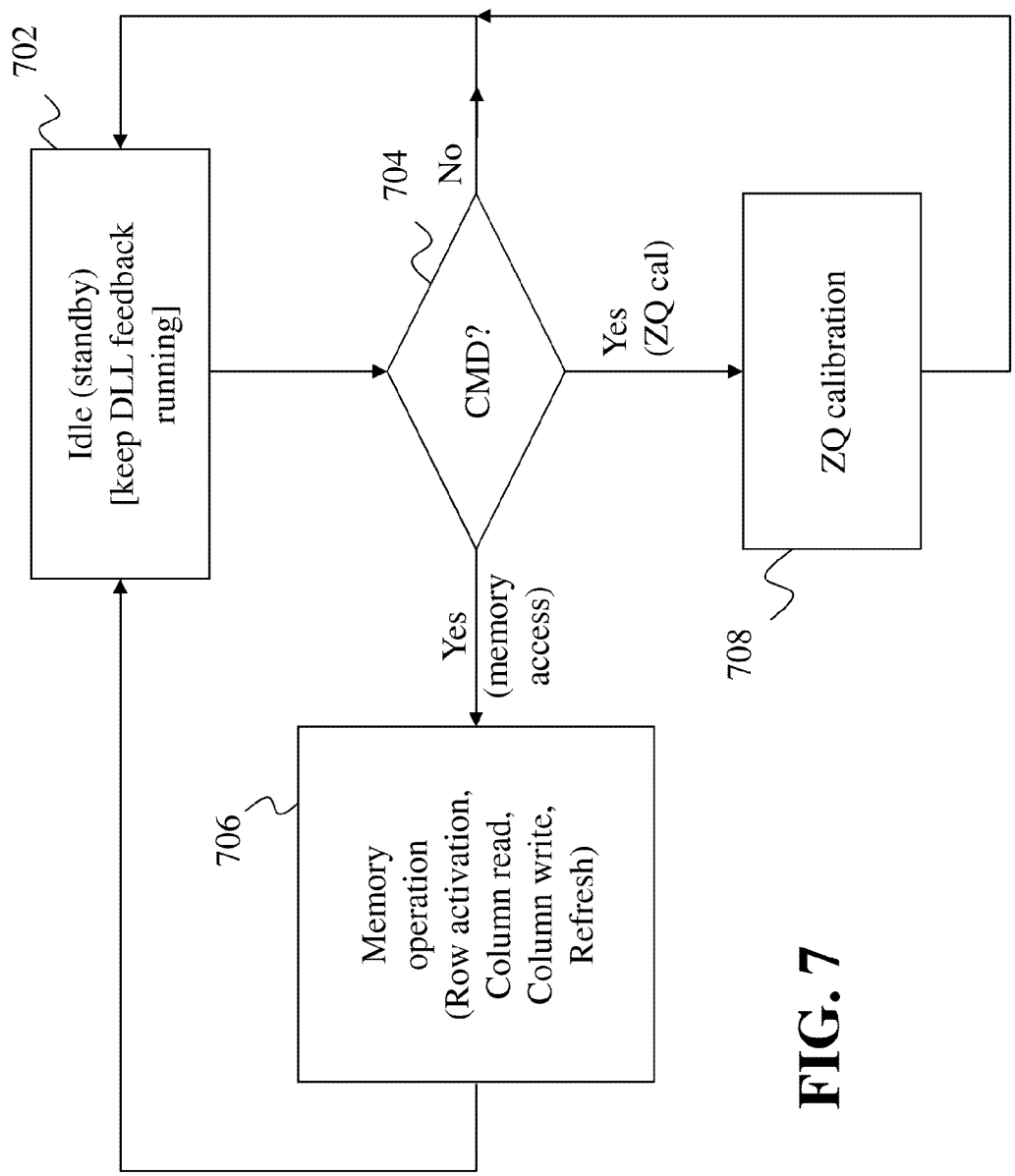
FIG. 7 depicts a flow diagram that may be implemented by a memory device.

FIG. 7 depicts a flow diagram that may be implemented by a contemporary memory device. At block 702, the memory device is in an idle state and, while the memory device is in an idle state, the DLL control block continues to update the variable delay block. At block 704, it is determined if a command has been received. If a command has not been received, then the memory device returns to idle in block 702. If it is determined, at block 704, that a command has been received and the command is a memory access command, then the specified memory operation is performed at block 706. Processing then continues at block 702 (e.g. "Idle"). If it is determined, at block 704, that a command has been received and the command is a ZQcal command, then ZQ calibration is performed at block 708. In an exemplary embodiment, ZQ calibration includes one or more of adjusting drive strength, termination at the driver, driver impedance, or other driver characteristics (e.g. based on current environmental conditions). When block 708 is completed, processing returns to block 702.

Figure 8:
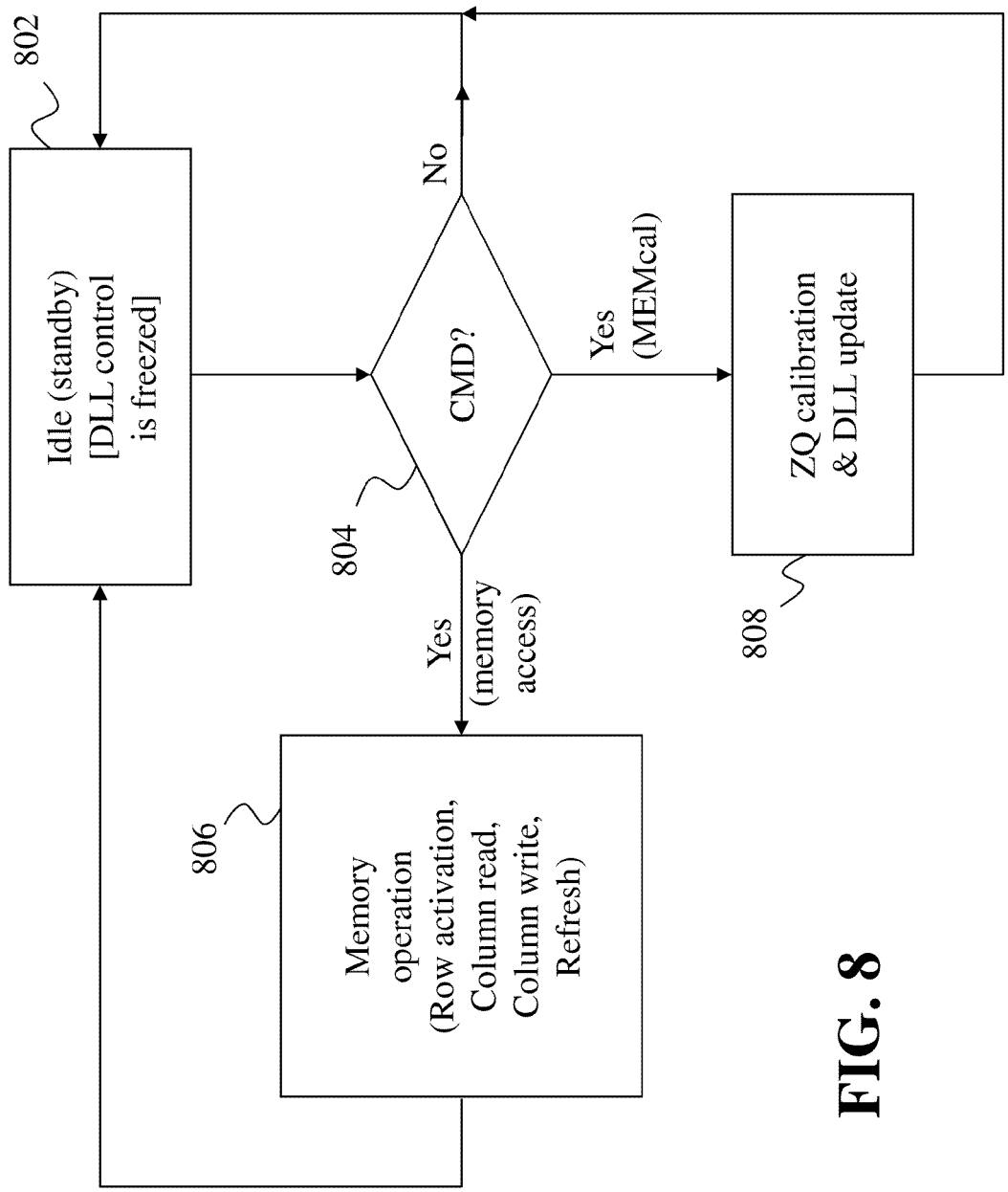
FIG. 8 depicts a flow diagram that may be implemented by a memory device according to an exemplary embodiment.

FIG. 8 depicts a flow diagram that may be implemented by a memory device according to an exemplary embodiment. At block 802, the memory device is in an idle state and, while the memory device is in an idle state, the DLL control block is turned off (or frozen). In this state, when the control block 210 is turned off, the variable delay block 212 in the DLL is not being updated. At block 804, it is determined if a command has been received. If a command has not been received, then the memory device returns to idle in block 802. If it is determined, at block 804, that a command has been received and the command is a memory access command, then the requested memory operation is performed at block 806. Processing then continues at block 802 ("Idle" state). If it is determined, at block 804, that a command has been received and the command is a MEMcal command, then ZQ calibration and a DLL update (i.e., the control block circuitry 210 in the DLL is turned on to synchronize the DLL) are performed at block 808. Processing then continues at block 802 (idle state).

Figure 9:
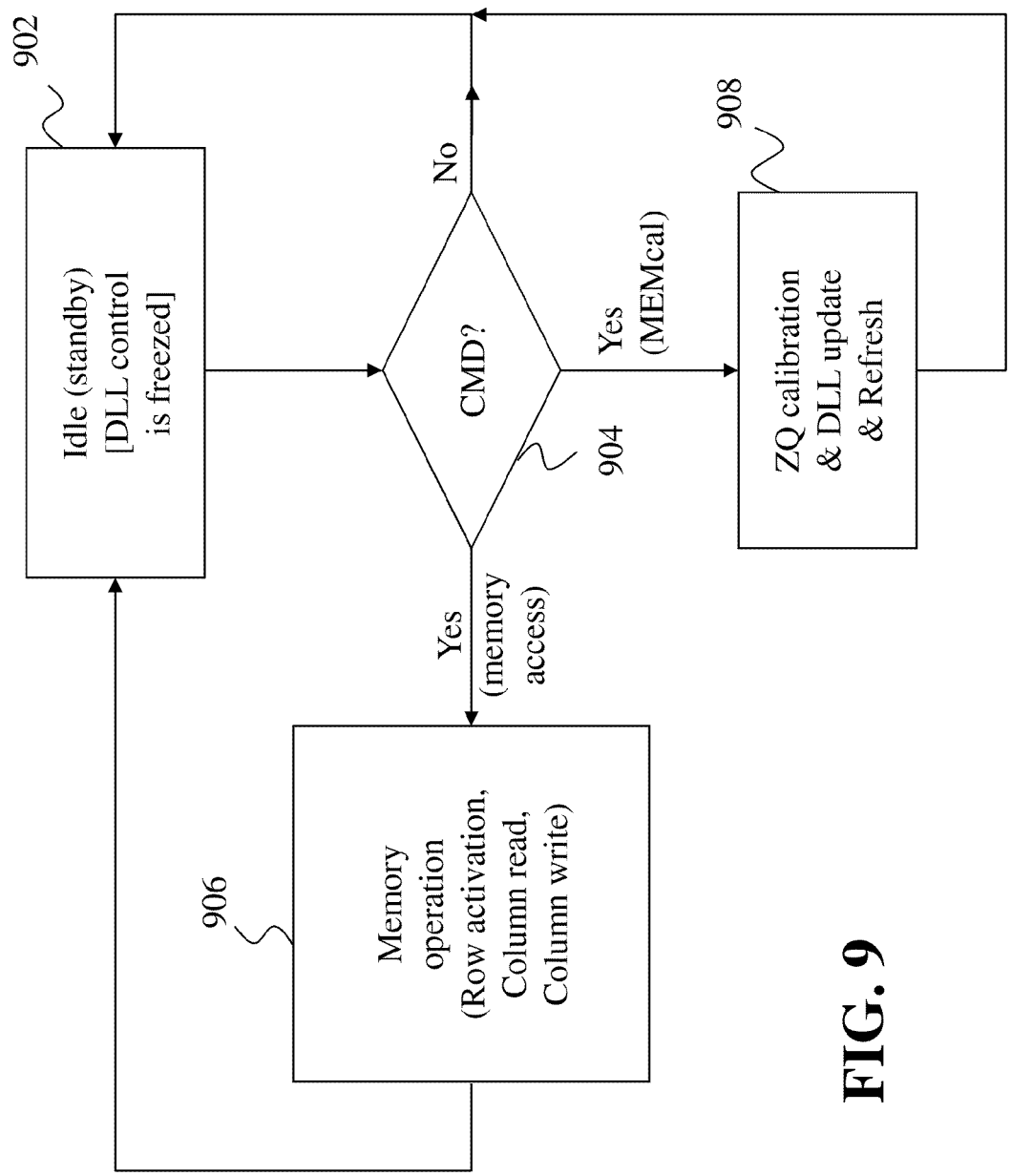
FIG. 9 depicts a flow diagram that may be implemented by a memory device according to an alternate exemplary embodiment.

FIG. 9 depicts a flow diagram that may be implemented by a memory device according to an alternate exemplary embodiment where the MEMcal command results in ZQ calibration, DLL updating, and refresh to be completed. At block 902, the memory device is in an idle state and, while the memory device is in an idle state, the DLL control block is turned off (or frozen). In this state, when the control block is turned off, the variable delay block 212 in the DLL is not being updated. At block 904, it is determined if a command has been received. If a command has not been received, then the memory device returns to idle in block 902. If it is determined, at block 904, that a command has been received and the command is a memory access command, then the requested memory operation is performed at block 906. Processing then continues at block 902. If it is determined, at block 904, that a command has been received and the command is a MEMcal command, then ZQ calibration, DLL update, and refresh are performed at block 908. Processing then continues at block 902.

Figure 10:
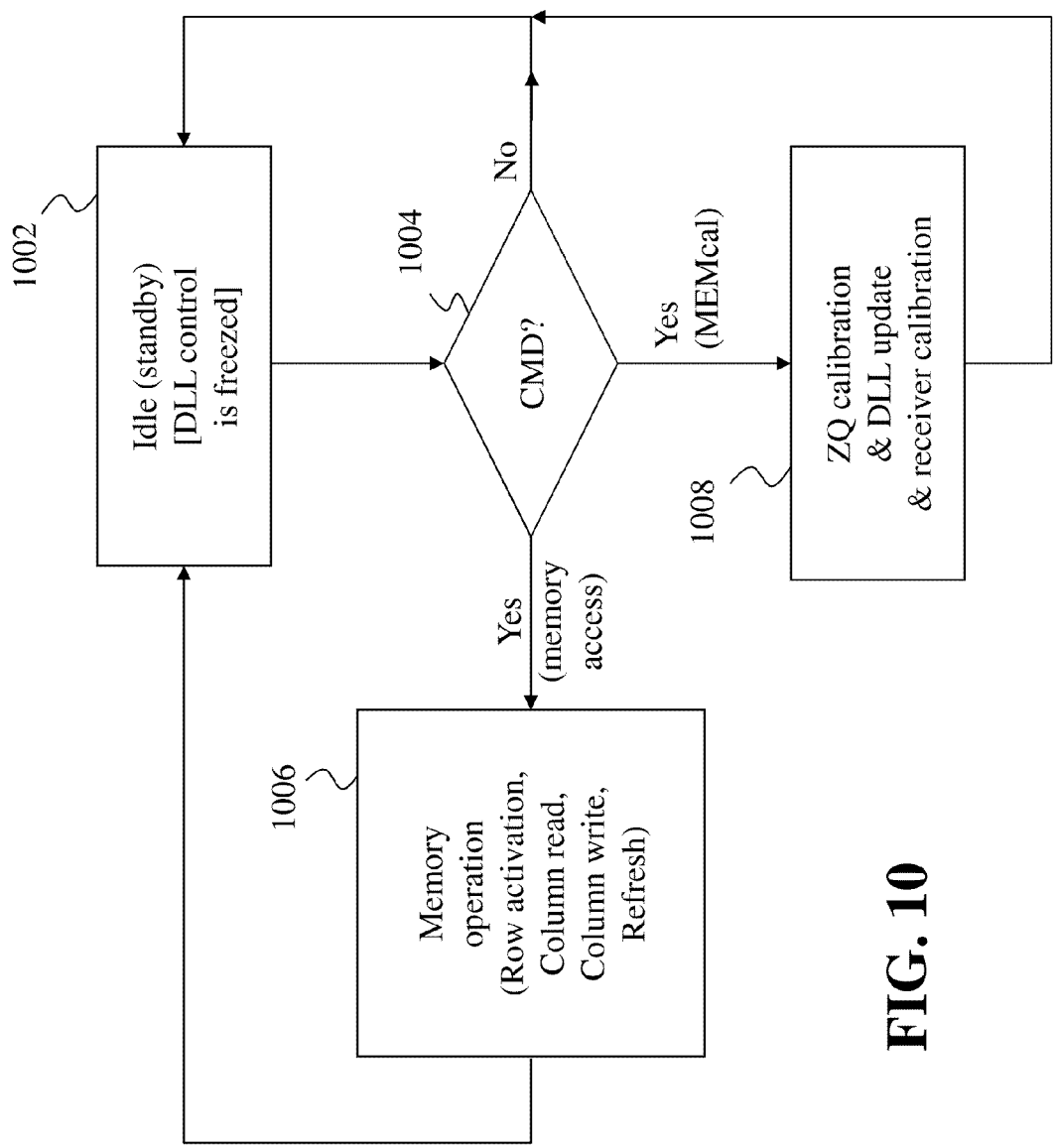
FIG. 10 depicts a flow diagram that may be implemented by a memory device according to an alternate exemplary embodiment.

FIG. 10 depicts a flow diagram that may be implemented by a memory device according to an alternate exemplary embodiment where the MEMcal command causes ZQ calibration, DLL updating, and receiver calibration to be performed. At block 1002, the memory device is in an idle state and, while the memory device is in an idle state, the DLL control block is turned off (or frozen). In this state, when the control block is turned off, the variable delay block 212 in the DLL is not being updated. At block 1004, it is determined if a command has been received. If a command has not been received, then the memory device returns to idle in block 1002. If it is determined, at block 1004, that a command has been received and the command is a memory access command, then the requested memory operation is performed at block 1006. Processing then continues at block 1002. If it is determined, at block 1004, that a command has been received and the command is a MEMcal command, then ZQ calibration, DLL update, and receiver calibration are performed at block 1008. Processing then continues at block 1002.

Figure 11:
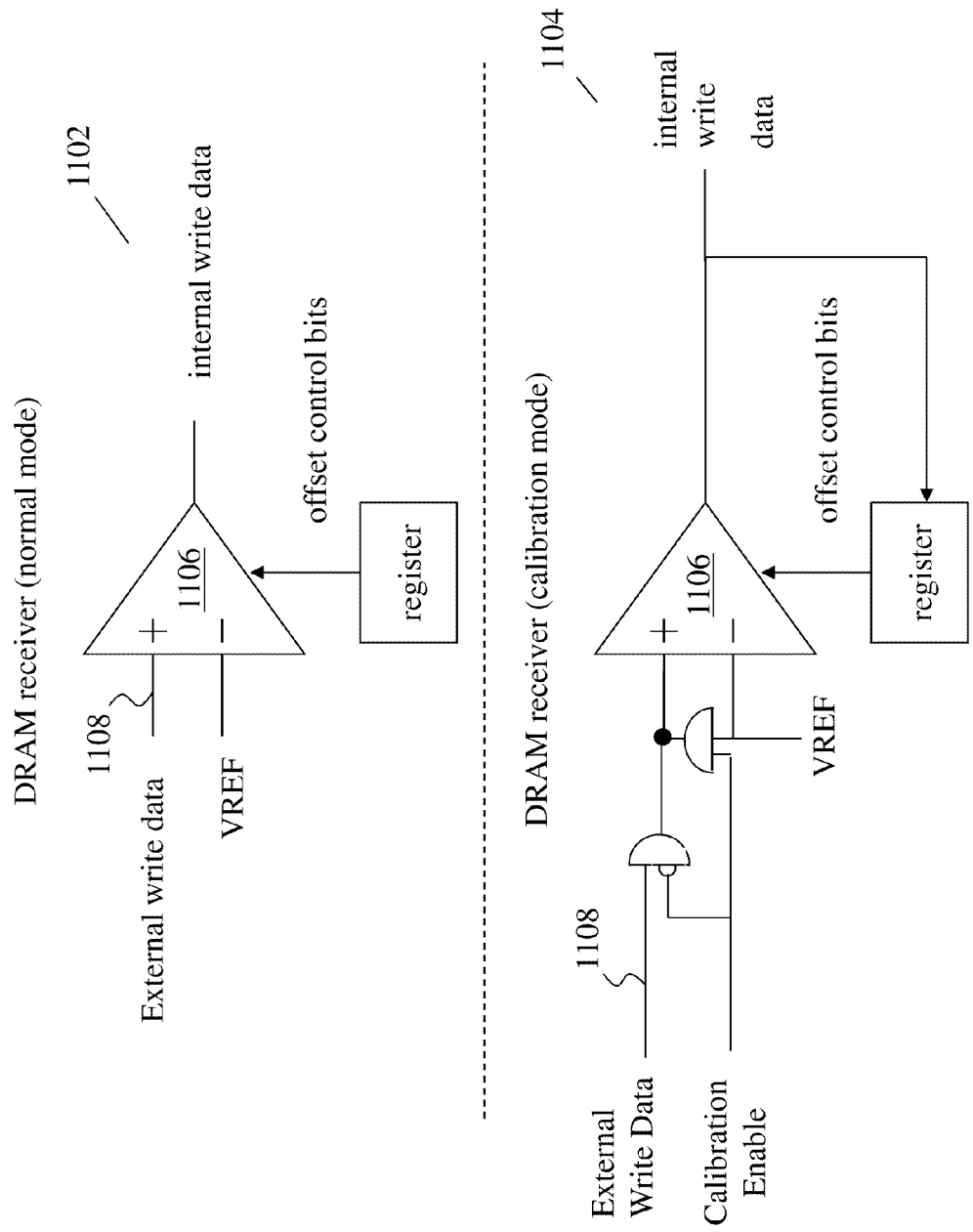
FIG. 11 depicts a block diagram of receiver operating to capture external write data during normal mode and calibration mode.

FIG. 11 depicts a receiver 1106 operating in normal mode 1102 to capture external write data. A register contains offset control bits that bias the receiver 1106 input thereby determining when to capture the external write data 1108. FIG. 11 also depicts the register 1106 operating in a calibration mode 1104 to generate the offset control bits contained in the register. In the exemplary calibration mode 1104, the reference voltage (VREF) is temporarily tied to both the external write data 1108 and the VREF inputs, and the internal data write signal is looped back around as input to the register. In this manner, the offset control bits can be adjusted (e.g. to the point at which the receiver detects a high and low level with a single offset step), allowing determination of the base point from which the receiver 1106 can be calibrated. In the embodiment depicted in FIG. 11, this is implemented by a couple of AND gates. An AND gate is located between the external write data input and the connection point to the VFREF signal, and is used in conjunction with a "negative active" calibration enable signal to the AND gate. As such, when calibration enable is active, the external write data is blocked by the AND gate (or some other logical means that provides such functionality). In addition, the connection between VREF and external write data is enabled and disabled (using the second AND gate) depending on whether the device is in calibration mode or not. The configuration depicted in FIG. 11 is just one of many methods that may be implemented to switch between normal operation and calibration mode. In an alternate exemplary embodiment, any voltage drop from VREF to the "+" side of the DRAM receiver is compensated by one or more means such as use of the register offset control bit circuitry to compensate for any voltage drop across the pass device, as is known in the art.

Figure 12:
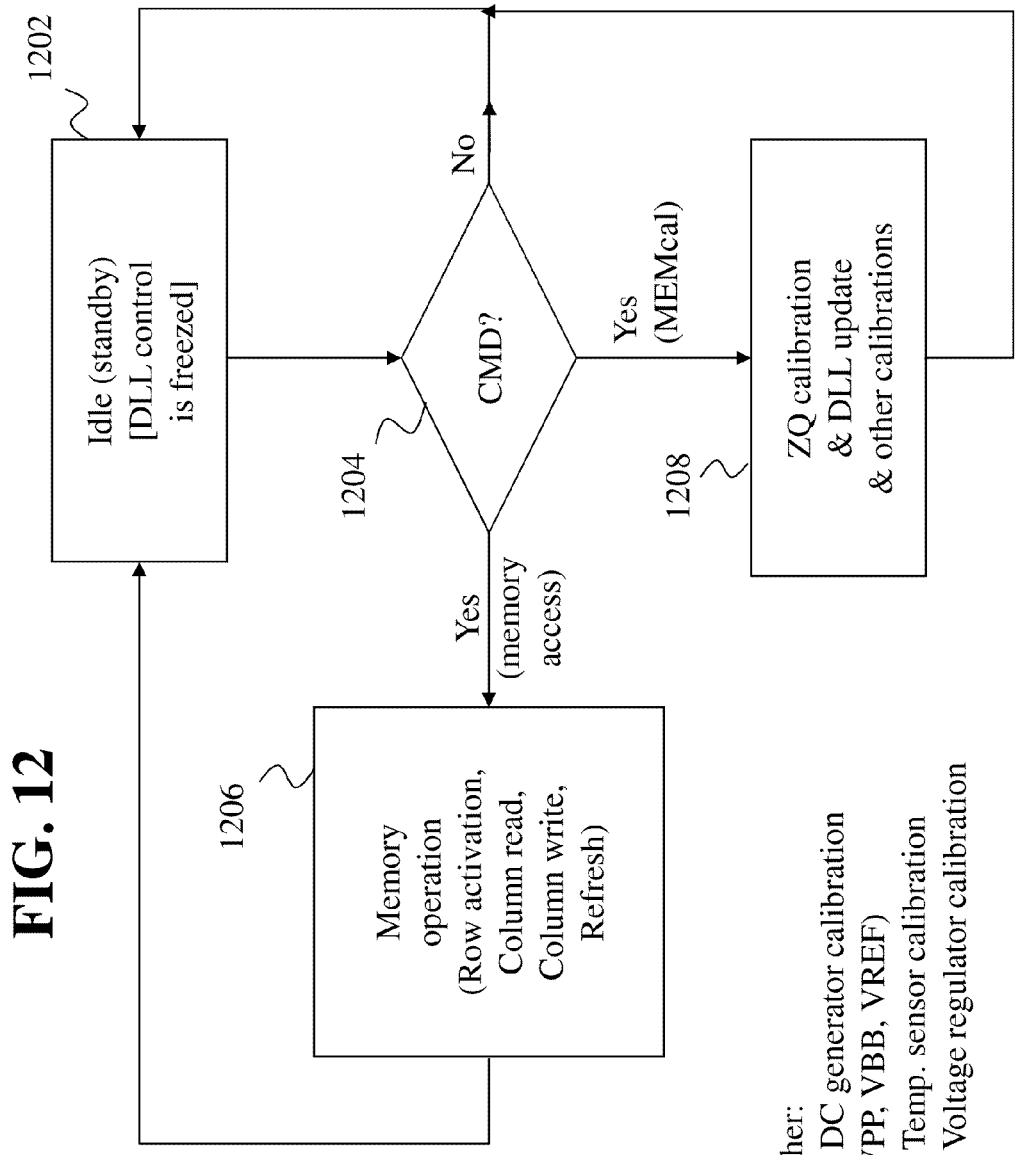
FIG. 12 depicts a flow diagram that may be implemented by a memory device according to an alternate exemplary embodiment.

FIG. 12 depicts a flow diagram that may be implemented by a memory device according to an alternate exemplary embodiment where the MEMcal command causes ZQ calibration, DLL updating, and other calibrations to be performed. At block 1202, the memory device is in an idle state and, while the memory device is in an idle state, the DLL control block is turned off (or frozen). In this state, when the control block is turned off, the variable delay block 212 in the DLL is not being updated. At block 1204, it is determined if a command has been received. If a command has not been received, then the memory device returns to idle in block 1202. If it is determined, at block 1204, that a command has been received and the command is a memory access command, then the requested memory operation is performed at block 1206. Processing then continues at block 1202. If it is determined, at block 1204, that a command has been received and the command is a MEMcal command, then ZQ calibration, DLL update, and/or other calibrations are performed at block 1208. Other calibrations may refer to one or more calibrations performed by the memory device including, but not limited to, direct current (DC) generator calibration (VPP, VBB, VREF), internal temperature sensor calibration, and voltage regulator calibration. After block 1208 has completed, processing continues at block 1202.

Other exemplary embodiments are directed to memory devices having command and/or address parity. As memory data rates increase, the failure rate of command/address (CMD/ADDR) transfers also increases. In proposed memory systems, a memory device implements CMD/ADDR parity (or any other error control coding such as cyclical redundancy check ("CRC") error detection and correction (EDC) and/or other means) to validate the integrity of received address and commands. In the example shown, command, address and one or more parity bits are received to permit the correlation of the parity information with the received command and address information and report the results back to a memory controller. The memory controller can then resend the command if the memory device reports that there has been an error. However, if the error occurs for a write command (either an address bit error for a write command or a command bit error so that a non-write command is processed as a write command), some amount of memory space will be wrongly overwritten and may result in an unrecoverable failure at a later time. Delaying command execution until after the parity (or CRC) has been confirmed as being correct may have an unacceptable impact on memory performance in terms of memory access time or latency—especially given the expected rarity of such failures (e.g. one in $10^{-12}$ transfers) when implementing a high quality design. Exemplary embodiments described herein, allow the memory to proceed with the memory operation without delay, and if an error in the CMD/ADDR parity is found, the data path of the data write is blocked fully utilizing data masking circuitry (e.g. if the command is determined to be a "write" operation). Exemplary embodiments protect against memory errors due to CMD/ADDR transfer errors without adding additional latency to memory write operations.

Figure 13:
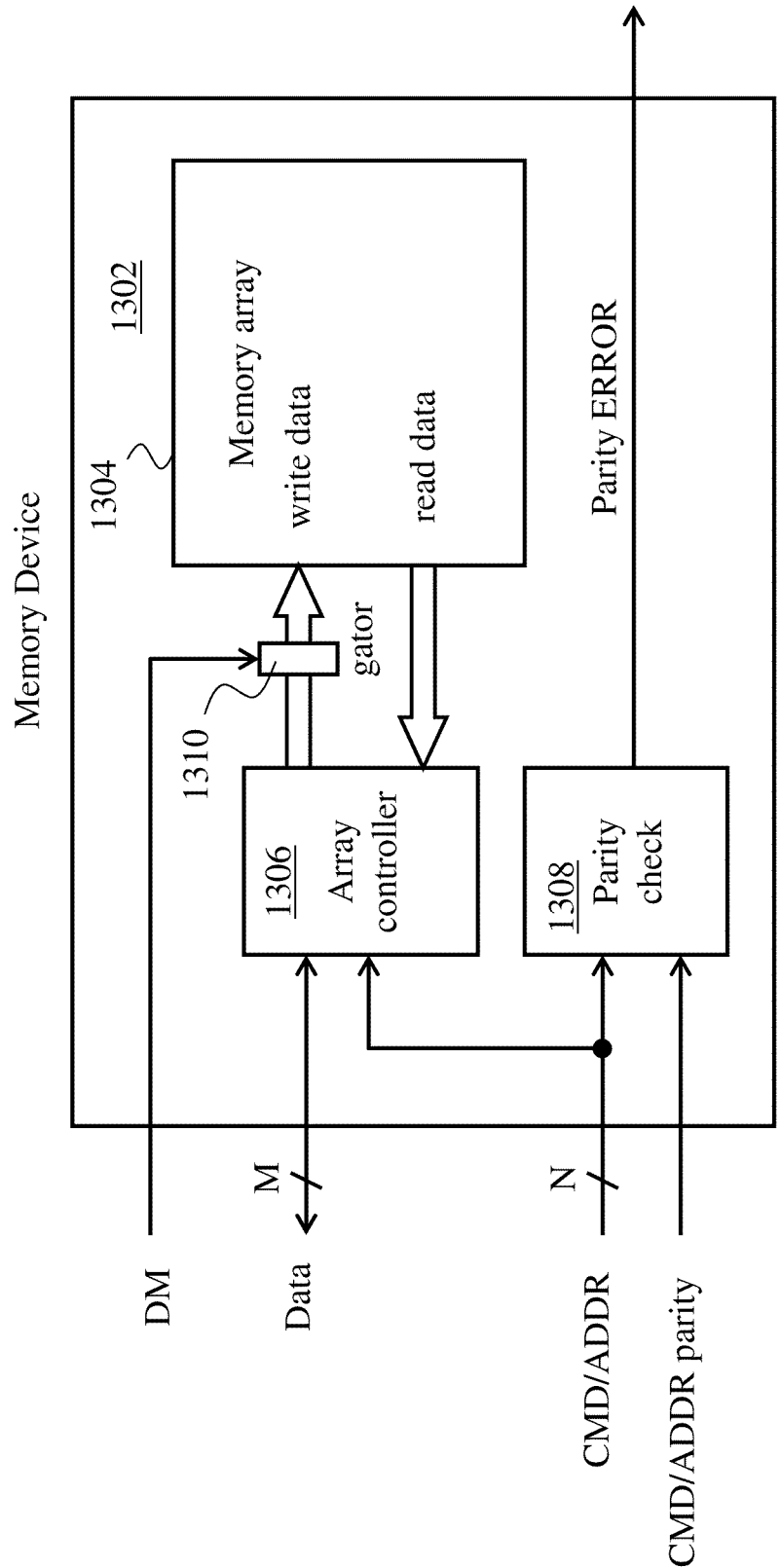
FIG. 13 depicts a memory device having command/address parity checking and data masking functions.

FIG. 13 depicts a memory device 1302 having CMD/ADDR parity checking and data masking functions. The memory device 1302 depicted in FIG. 13 includes a memory array 1304, an array controller 1306, a parity check block 1308, and a data mask gate 1310. As shown in FIG. 13, a data mask (DM) signal is input to the data mask gate 1310 to cause portions of the data input to the array controller 1306 to not be written to the memory array 1304 (e.g. as often utilized in graphics operations or partial data write operations). As is known in the art, this approach may be used where data is written in bursts and only a subset of data in the burst is to be updated. In the case of a graphics application, only a portion of a screen may need to be updated and applying a DM via the data masking gate 1310 avoids having an unintended portion or even the whole screen being rewritten. As shown in the memory device 1302 depicted in FIG. 13, a parity check is performed on the received CMD/ADDR inputs in relation to the CMD/ADDR parity input (e.g. using conventional parity checking means) by the parity check block 1308, with the result reported via a parity error signal.

As used herein the term "command" refers to commands bits and address bits associated with the command. Typically, the command bits and address bits are received at the memory device via one or more CMD/ADDR inputs.

Figure 14:
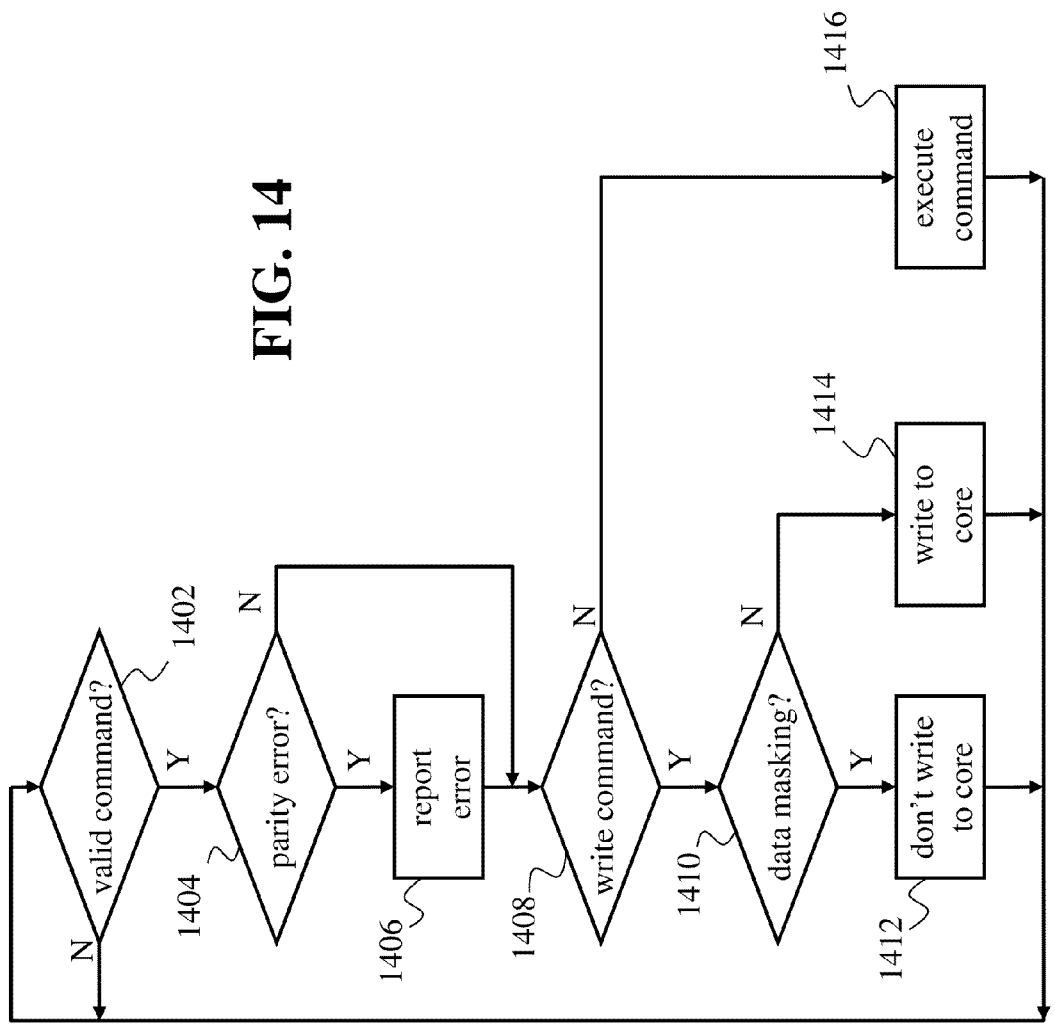
FIG. 14 depicts a process flow that may be implemented by the memory device depicted in FIG. 13.

FIG. 14 depicts a process flow that may be implemented by the memory device depicted in FIG. 13. At block 1402, it is determined if a valid command has been received (e.g., at the array controller 1306). If a valid command has been received, then processing continues at block 1404 where the parity check block 1308 determines if there is a parity error on the CMD/ADDR input(s). If there is a parity error, then block 1406 is performed and the error is reported (e.g., to a memory controller or memory hub device) via the parity error signal. Processing then continues at block 1408 where the array controller 1306 determines if the command is a write command. If the command is not a write command, then processing continues at block 1416 where the command is executed. If the command is a write command, as determined at block 1408, then block 1410 is performed to determine if the current data includes data mask information. If data mask information is included in addition to the write command and/or data to be written, then block 1412 is completed wherein masked data bits are not written to the memory core and unmasked bits are written to the memory core. If no data masking information is included with the write command and/or data to be written, then the data is written to the core as received. Upon completion of the write operation (e.g. at blocks 1412, 1414 and 1416), execution returns to block 1402 (awaiting a valid command).

As is known in the art, a data mask for a given device applies to one or more bits consistent with the device configuration (e.g. 4 bits, 8 bits or 16 bits in data width). For example, if the system includes memory devices having a width of eight bits, the mask information associated with each memory device will typically apply to eight bits (e.g. "byte masking"). Other masking techniques may be used including masking of one or more bits (e.g. "bit masking") or even masking of the entire data transfer width (e.g. 64, 128, 256 or more bits in a wide data transfer operation to multiple memory devices). As previously described, the processing performed in block 1410 may be performed by the DM (data mask) function combined with the data masking gate 1310. If all or a portion of the current data is not to be written because it has been masked, block 1412 is performed and the masked data is not written to the memory array 1304. If the current data has not been masked, as determined at block 1410, then block 1414 is performed and the data is written to the memory array 1304. After blocks 1412, 1414, and 1416 are performed, processing continues at block 1402.

Figure 15:
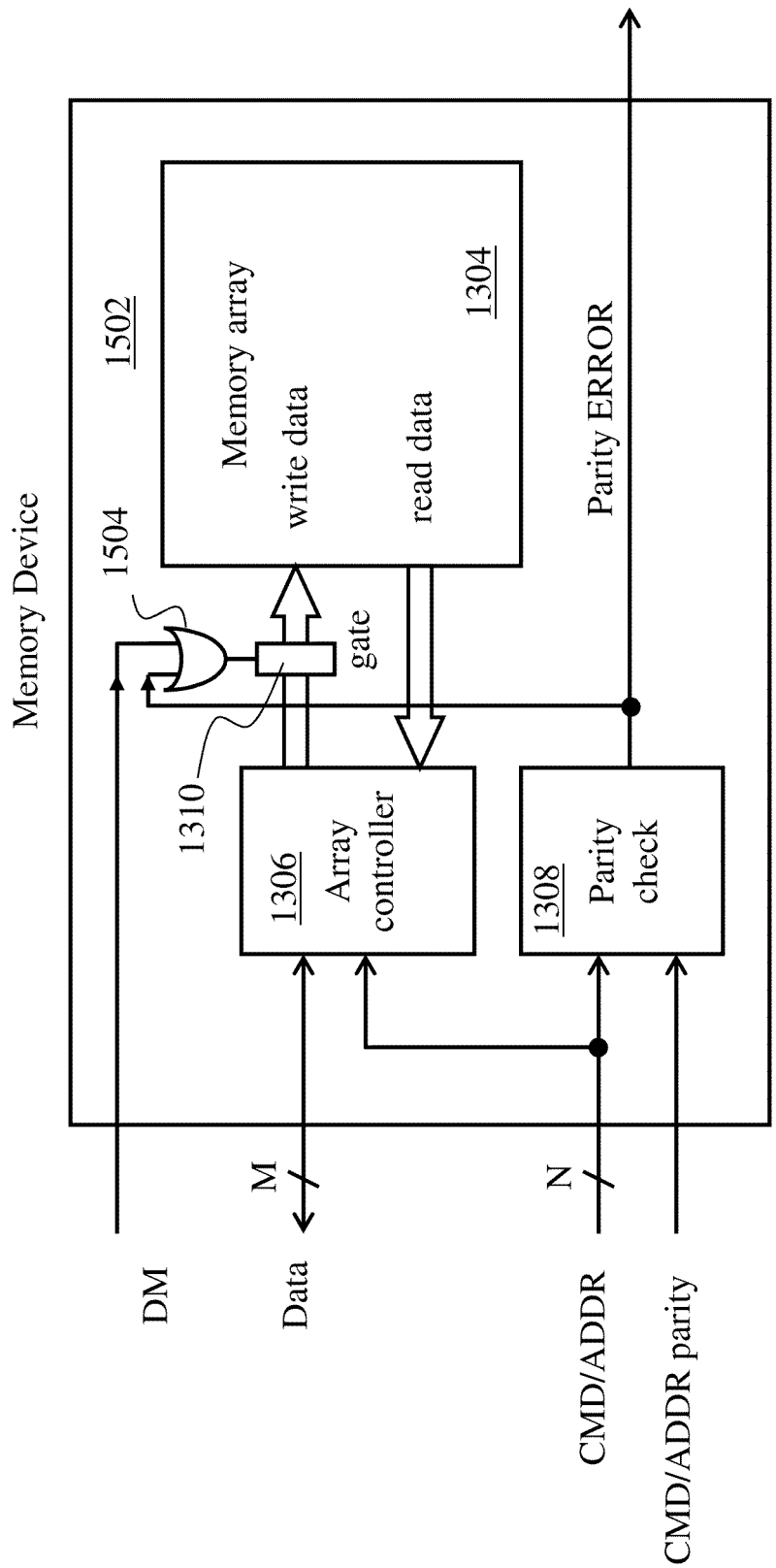
FIG. 15 depicts a memory device that may be implemented by an exemplary embodiment.

FIG. 15 depicts a memory device 1502 that may be implemented by an exemplary embodiment. The memory device 1502 depicted in FIG. 15 enables data masking upon detecting a CMD/ADDR parity error. This prevents faulty data from being written to the memory array 1304. The memory device 1502 depicted in FIG. 15 is similar to the memory device depicted in FIG. 13, however memory device 1502 includes an additional OR gate 1504 having as input the parity error signal line and the conventional DM signal. Thus, if the parity check block 1308 detects a parity error on the CMD/ADDR input, then the current data is masked, or prevented from being written to the memory array 1304. This is accomplished as the data to be written is received at the exemplary memory device sufficiently later than the CMD/ADDR inputs that a parity check can be completed on the CMD/ADDR inputs and questionable write operations (e.g. write data) is fully masked (e.g. for an entire write operation, which may further be a burst write operation, in the exemplary embodiment)— permitting the buffer device, processor, controller or other sourcing device to re-try the operation and/or complete diagnostics (such as bit lane sparing) to permit the intended operation to be successfully repeated and normal operation to continue. The data masking upon detecting parity check error is performed in addition to the standard data masking already being performed in the memory device 1502 via gate 1310. As in FIG. 13, an exemplary means of notifying the sourcing device that a CMD/ADDR parity has occurred is by use of a parity error signal (directly provided (e.g. by a parity fault wire) or via fault register), although other means may be used to report the error in a timely manner such that normal operation can quickly commence. In alternate exemplary embodiments, upon failure of one or more re-try operation(s) the array controller may stop sending received commands to the memory array (other than perhaps periodic "refresh" operations) until normal communication (e.g. parity error-free operation) is achieved to minimize the risk of unintended damage to the array contents, especially given the limited fault detection capability provided by parity checking. This apparatus and method provides a viable and low cost means to significantly increase the probability of long-term fault-free system operation with no performance impact to the system and minimal impact (if any) to the memory array and sourcing devices.

Figure 16:
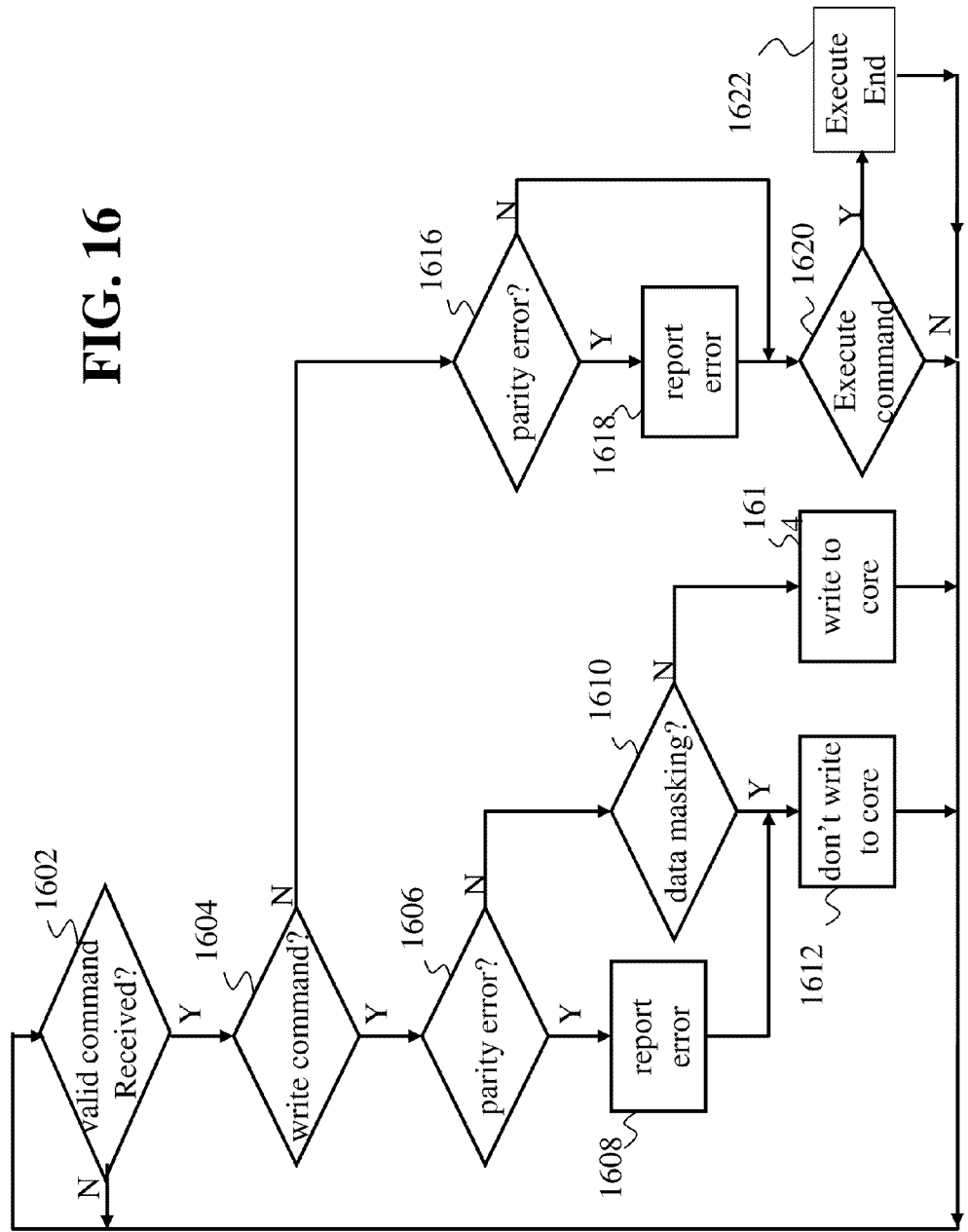
FIG. 16 depicts a process flow that may be implemented by the memory device depicted in FIG. 15 to allow data masking upon detecting a command/address parity check error.

FIG. 16 depicts a process flow that may be implemented by the memory device depicted in FIG. 16 to allow data masking upon detecting a CMD/ADDR parity check error. At block 1602, it is determined if a valid command has been received (e.g., at the array controller 1306). If a valid command has been received, then processing continues at block 1604 where the array controller block 1306 determines if the command is a write command. If the command is not a write command, then block 1616 is performed to determine if there is a parity error in the CMD/ADDR input. In an exemplary embodiment, the determining is performed by the parity check block 1308. If there is a parity error, then the error is reported at block 1618 via the parity error signal. Processing continues at decision block 1620 where a determination is made, generally via a preconditioned state (e.g. during initialization), as to whether the command will or will not be executed. If the decision block 1620 has been preconditioned to block operations (e.g. other than refresh) where a parity error is found on the CMD/ADDR inputs, no memory operation is completed and processing continues at 1602 (which may include subsequent diagnostic operations). If the decision block 1620 has been preconditioned to allow the execution of non-write commands in the presence of a parity error on the CMD/ADDR inputs, then the received command is executed at block 1622 and processing continues as block 1602.

If the command is a write command, as determined at block 1604, block 1606 is performed to determine if there is a parity error in the CMD/ADDR input. If there is an error it is reported at block 1608 and processing continues at block 1612 where the data is not written to the memory array 1304. In an exemplary embodiment, this processing occurs by inputting the parity error signal output from the parity check block 1308 into the OR gate 1504 to indicate that the current data is in error and all data to be written to the array resulting from the defective command (e.g. as the command may be a "burst" command affecting multiple addresses) should be masked. If there is not a parity error, as determined at block 1606, then block 1610 is performed to determine if the current data has been masked by the data mask. The processing performed in block 1610 may be performed by the DM combined with the data masking gate 1310. If the current data is not to be written because it has been masked, block 1612 is performed and the data is not written to the memory array 1304. If the current data has not been masked, as determined at block 1610, then block 1614 is performed and the data is written to the memory array 1304. Processing then continues at block 1602. Alternate exemplary embodiments of logic 1504 and gate 1310 may be utilized to allow one or more of write data bits to be masked in a given cycle, wherein all write data bits would, in the exemplary embodiment, be masked in the presence of a parity error as previously described. In addition, diagnostic means may be present in one or more of blocks 1308, 1306, 1504, and 1310 to enable testing of said circuitry to enable determination if these functions are working properly.

Further exemplary embodiments include a method for writing data masking bits without requiring a dedicated pin on the memory device or an additional clock cycle to transfer the masking bits. A memory data write masking is required, for example, when a granularity of minimum data size is smaller than the total data size per access. Conventional data masking requires either an additional pin or an additional beat (i.e., a bandwidth penalty) to transfer the mask information. An exemplary embodiment sends some information through a masked byte(s) and the memory device generates a syndrome by calculating a logic operation over the write packet. The syndrome describes which byte(s) is to be masked. Using exemplary embodiments, pin count can be minimized and bandwidth can be preserved while still providing data write masking.

Figure 17:
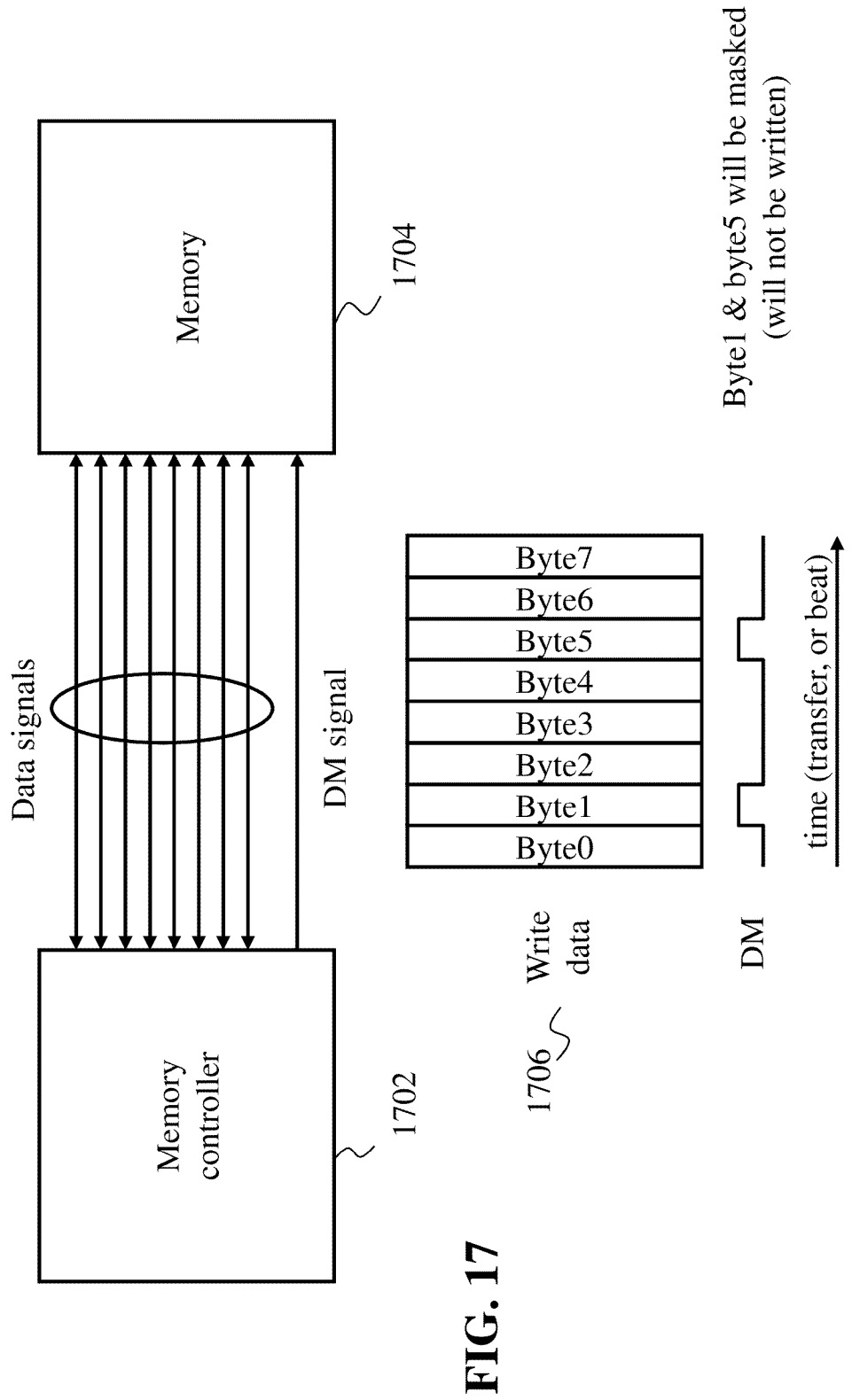
FIG. 17 depicts a memory system that supports data masking through the use of a dedicated data masking pin on the memory device.

FIG. 17 depicts an exemplary memory system that supports data masking including a memory controller 1702 (or memory hub device) transferring data back and forth with a memory device 1704 in a multi-transfer (burst) manner—although other transfer methods may also be used as is known in the art. In this case, 8 bytes of data are transferred over 8 cycles, with a cycle generally referring to a clock period or a portion of a clock period (not shown for clarity. Although shown as bi-directional, the signal wires between the memory controller 1702 and the memory device 1704 may instead be unidirectional—as is well known in the art. In addition, FIG. 17 depicts a DM signal (e.g. a data masking signal wire) connected between the memory controller 1702 and the memory device 1704. Typical memory devices include at least one dedicated DM pin to enable the masking of data (e.g. "write" data). FIG. 17 also depicts write data 1706 with the signal level of the DM signal shown below the write data 1706. In the example shown in FIG. 17, byte 1 and byte 5 will be masked (not written) because the value of the DM signal level transferred at the same time as byte 1 and byte 5 is a "high" level (e.g. a "one". Alternate signaling levels and conventions can be used to accomplish the same function—the selected method is shown for clarity.

Figure 18:
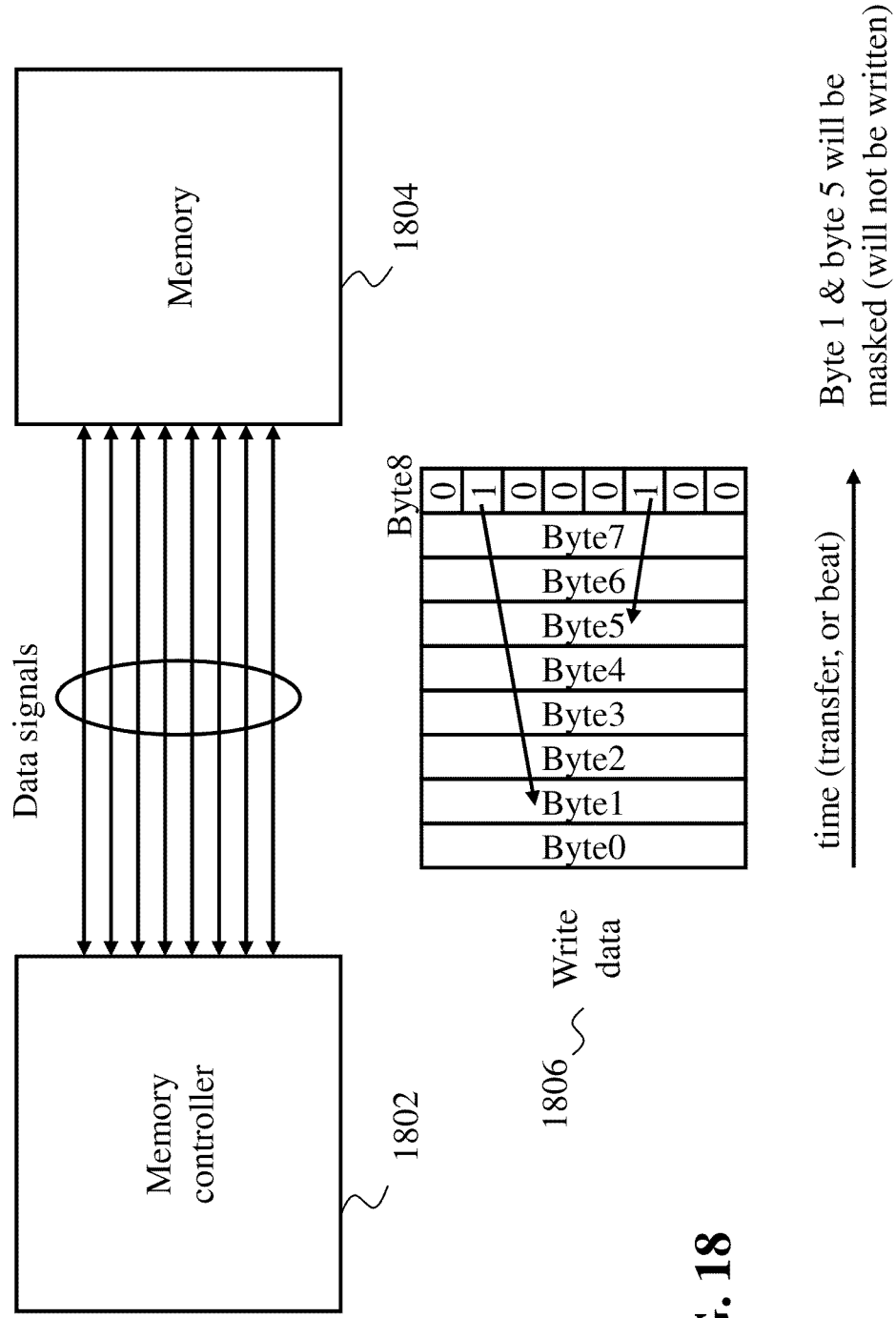
FIG. 18 depicts a memory system that supports data masking through the use of an additional byte transfer.

FIG. 18 depicts another exemplary memory system that supports data masking including a memory controller 1802 (or memory hub device) transferring data back and forth with a memory device 1804. The system depicted in FIG. 18 does not have a dedicated DM pin, but instead the memory controller 1802 sends an additional ($9^{th}$) byte transfer (e.g. byte 8) with the write data 1806 to indicate which bytes should be masked. This embodiment does not require an extra pin, but does require an extra transfer with each data packet and reduces bandwidth in the system. Masking of the data, in this embodiment, can be completed once all transfers are received—including the $9^{th}$ byte containing the masking data. In addition to utilizing additional bandwidth, this implementation prohibits early initiation of write operations given that the mask data is received at the end of the data transfers. In alternate embodiments, the mask data information may be sent in byte 0, byte 1 or any other byte position, although the location of the byte mask information must be known by both the data source and receiver(s) to ensure proper operation.

Figure 19:
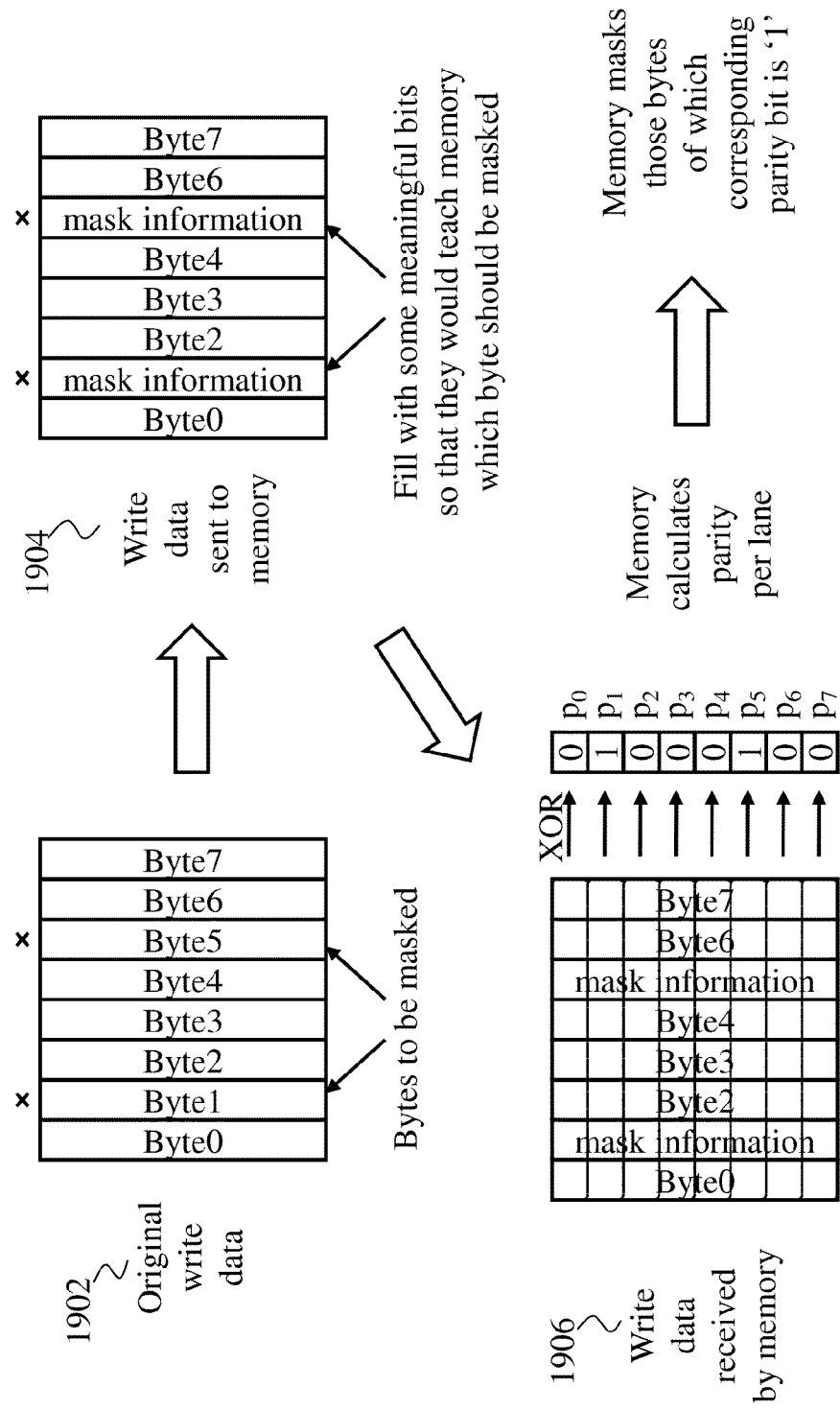
FIG. 19 depicts a method of transmitting data masking information in a memory system that may be implemented by an exemplary embodiment.

FIG. 19 depicts a method of sending masking information in a memory system that may be implemented by an exemplary embodiment in which no unique DM pin(s) and/or extra data bandwidth is required. As shown in the example in FIG. 19, the original write data 1902 is made up of eight bytes with two bytes to be masked (bytes 1 and 5). As is known in the art, other combinations of the number of transfers and the number of bits in each transfer could also be implemented (e.g., each transfer may be made up of four bits, each packet may be made up of twelve transfers, etc.) while continuing to practice the exemplary solution described herein. In the example depicted in FIG. 19, the memory controller has two bytes, bytes 1 and 5, which are not to be written and as such, may be used for other purposes such as for transmitting the mask information associated with the original write data. The original write data 1902 is shown in 1902, with bytes 1 and 5 identified as bytes to be masked by some method. The exemplary resulting write data 1904 is referred to in FIG. 19 as the write data sent to memory. In an exemplary embodiment, the write data sent to memory 1904 in an exemplary manner to be described later, and is received by a memory device and labeled in FIG. 19 as write data received by memory 1906. In an exemplary embodiment, the write data sent to memory 1904 is generated such that the memory device receives the write data 1906 and performs an exclusive-or (XOR) across the bit lanes (e.g., wires) on the write data received by memory 1906. If the result is on any bitlane (e.g. a horizontal sequence of transfers separated from one another by dashed lines in 1906) is a "1" (or any other pre-defined signal polarity and/or level), then the corresponding byte location should be masked. In this manner, the sourcing device completes an XOR function (separately) of all bitlanes prior to sending the data and encodes the bitlanes to be masked such that a "one" will be detected at the receiving end for any or all bitlanes to be masked for that transfer. At the receiving end, each memory device calculates the parity per bitlane and the memory device then masks the ith byte if the parity of the ith bitlane is a "1". As previously discussed, alternate levels and/or signaling techniques may be used without straying from the exemplary embodiment, wherein no unique DM signal(s) and/or additional transfer(s) are needed to transfer DM information.

Figure 20:
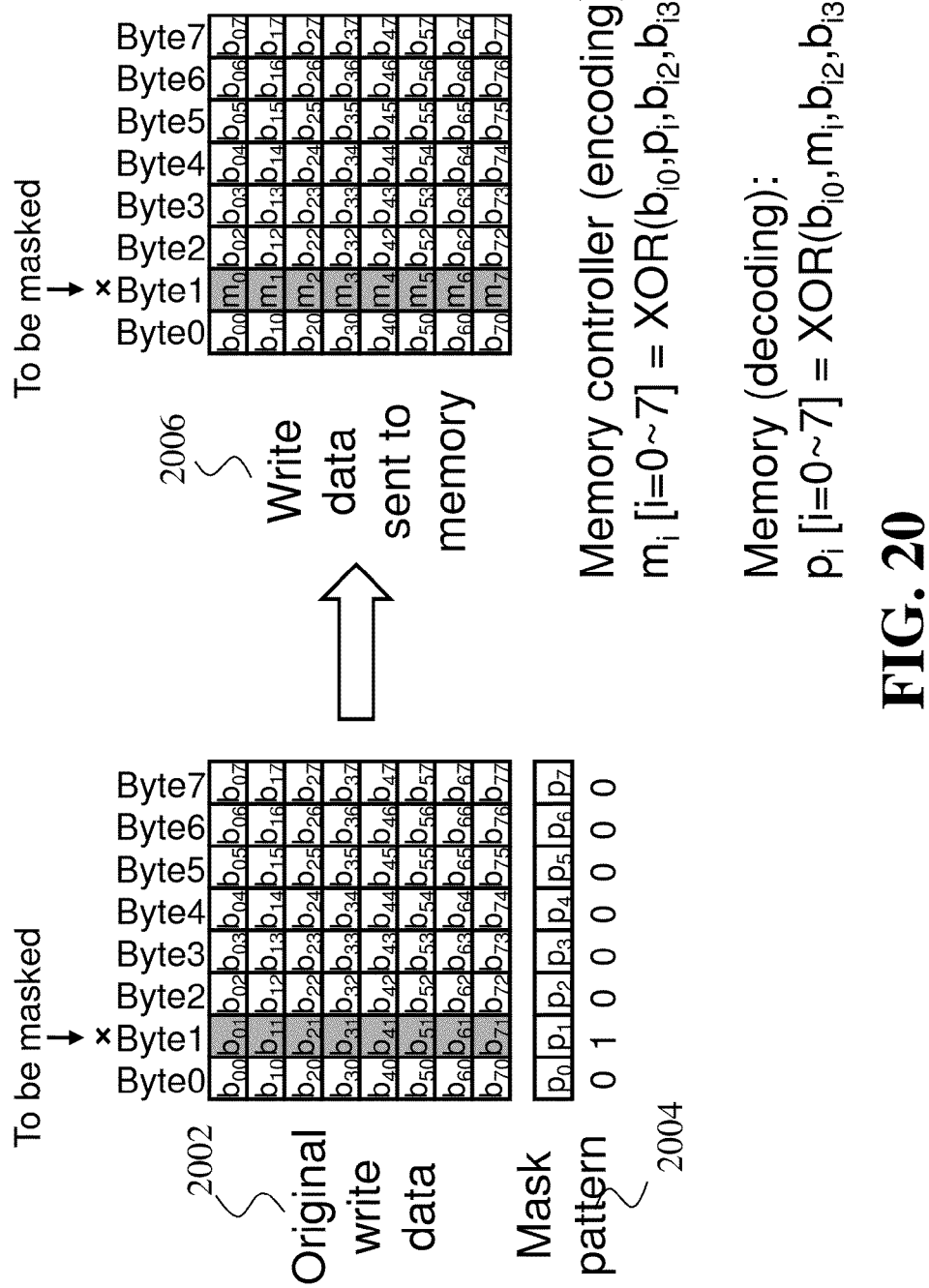
FIG. 20 depicts a mask information encoding and decoding method that may be implemented by an exemplary embodiment when one byte is being masked.

FIG. 20 depicts a mask information encoding and decoding method that may be implemented by an exemplary embodiment when one byte (byte 1) is being masked. FIG. 20 depicts the original write data 2002 and a mask pattern 2004 (e.g. calculated by an XOR of each bitlane as previously described). In the exemplary embodiment, the mask pattern is selected so that the parity of any byte that should be masked corresponds to a parity of one (e.g. at the receiving device). In the example depicted in FIG. 20, the mask data is encoded into byte 1 such that a "one" will be received for byte 1 at the receiving device. The first mask bit in byte 1 (m0) of the write data sent to memory 2006 is encoded by performing an XOR of the first mask pattern bit (p0) and all of the bits across the first wire except for the bit in byte 1 which is being masked (b00, b02, b03, b04, b05, b06, and b07). At the receiving end, the memory device decodes the mask data by performing an XOR of all of the bits across each wire. In the example depicted in FIG. 20, any XOR that results in a value of one corresponds to a byte that should be masked (e.g. byte 1).

Other methods known in the art may be used to delineate the byte(s) to be masked, consistent with the exemplary embodiment. The use of parity circuitry and the mask determination of a "one" is just one such embodiment. The exemplary embodiment demonstrates that the byte(s) to be masked can contain information that allows the recipient device(s) to determine that a write operation should not be completed to the byte(s) to be masked, without incurring the penalty of additional wires or lost bandwidth. This is a significant improvement to the current art, offering improved performance and/or increased bandwidth.

Figure 21:
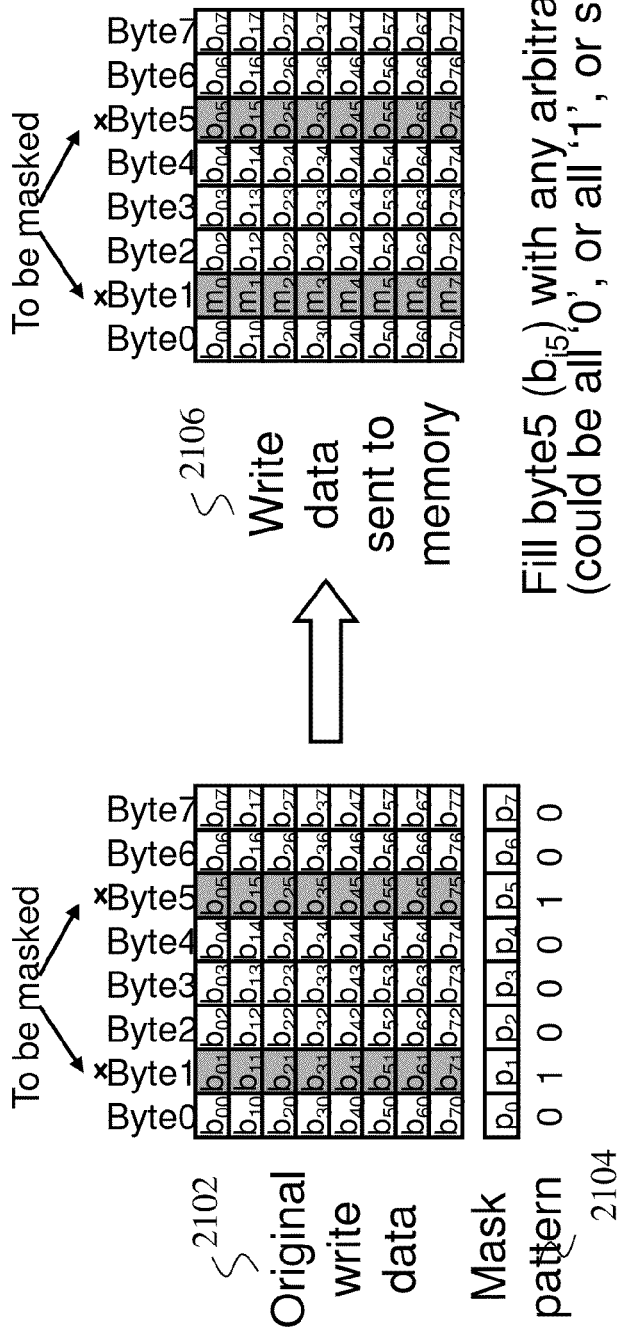
FIG. 21 depicts a mask information encoding and decoding method that may be implemented by an exemplary embodiment when two or more bytes are being masked.

FIG. 21 depicts a mask information encoding and decoding method that may be implemented by an exemplary embodiment when two or more bytes are being masked such as in FIG. 19. In the example depicted in FIG. 21, bytes 1 and 5 are being masked. As shown in FIG. 21, in the exemplary embodiment only one of the bytes is required to hold the mask information, so the unused byte(s) to be masked (byte 5 in this example) is filled with an arbitrary value that follow some known convention to facilitate detection and the XORing of data to be written. For example, it could be filled with all zeros, or all ones, or it could be filled with the same values as a previous or next byte. The encoding and decoding is performed as described in reference to FIG. 20. As described previously, a parity bit is generated such that the results of an XOR across a bitlane results in a value of one to indicate byte positions that should be masked. In the exemplary embodiment (although other methods could be used without straying from embodiments of the invention), the first byte (e.g. byte 1) to be masked contains the marking information resulting from the XOR operation, whereas subsequent bytes to be masked are loaded with known information as described above such that the bytes to be masked can be easily and correctly identified upon receipt and analysis of the received data.

In an exemplary embodiment, an unused column address (e.g., CA11 or another unused column address preceding a write transfer) is used to indicate to the memory device whether the write command is a normal write or a masked write. If the write command is a normal write then the processing described in reference to FIGS. 20 and 21 will not be performed. If the CA11 (or alternate identification means) indicates that the write is a masked write (e.g., one or more bytes in the write data transfer will not be written), then as described previously, the data sourcing device encodes one or more bytes such that when the memory device calculates the parity bit for each bit lane and masks the ith byte if the ith parity bit is a "1". The unmasked bytes are then written into the memory core. In an alternate exemplary embodiment, a parity bit value of "0" in the 'ith' bit indicates that the ith byte should be masked.

Figure 22:
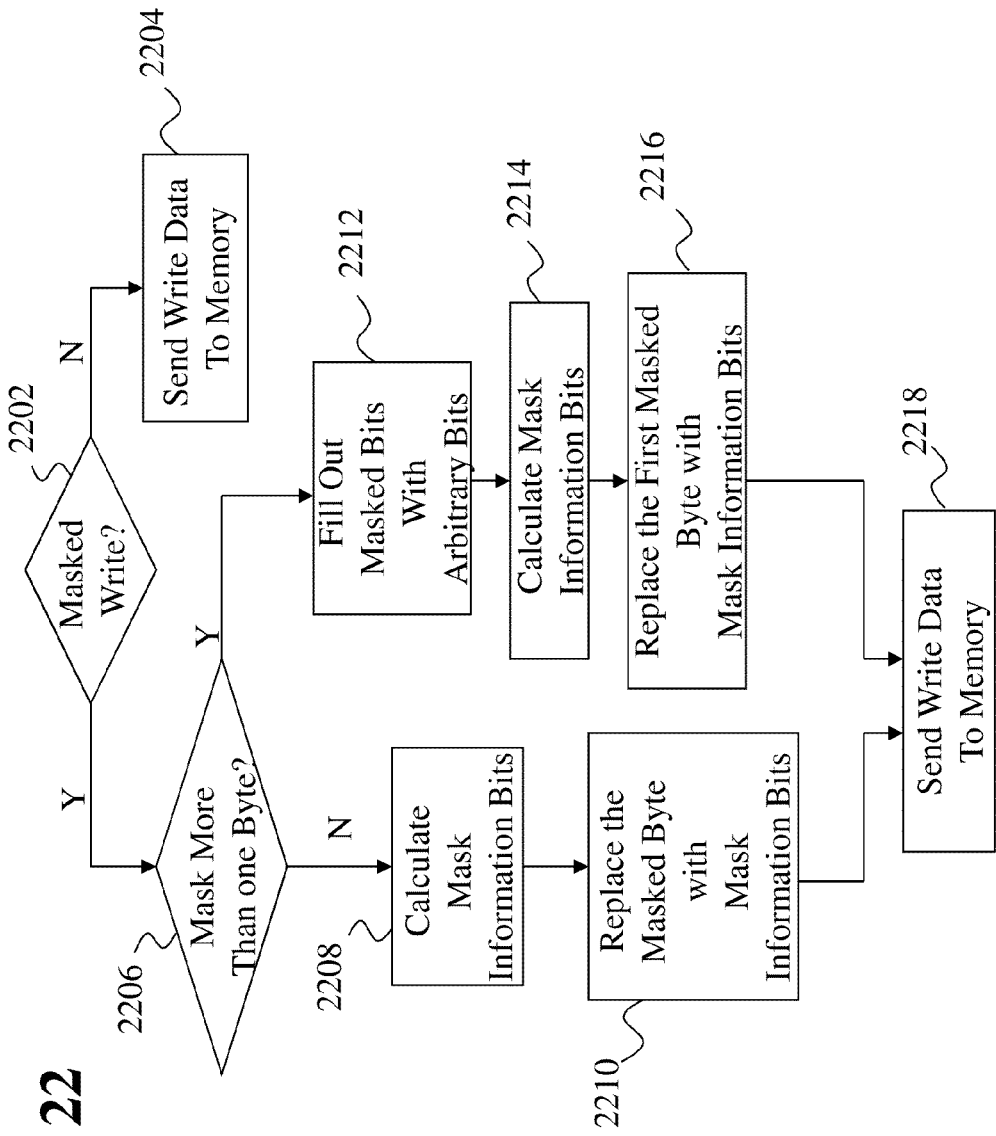
FIG. 22 depicts a process flow for performing encoding that may be implemented by an exemplary embodiment.

FIG. 22 depicts a process flow for performing encoding that may be implemented by an exemplary embodiment. At block 2202 it is determined if the write is a masked write. If the write is not a masked write, then block 2204 is performed and the write data is sent to the memory device. If the write data is a masked write, as determined at block 2202, then block 2206 is performed and it is determined if more than one byte of the current transfer needs to be masked. If more than one byte needs to be masked, then block 2212 is performed and the masked bits of the one or more additional bytes being masked but not directly involved in the masking identification are filled with "arbitrary" bits (e.g. all "ones", all "zeroes" or some other data pattern as previously described, following a pre-defined convention), followed by block 2214 where the mask information bits are calculated across all bytes (e.g. for that given bit position—excluding the masked byte(s)). Next block 2216 is performed and the first (or one of the other) masked byte(s) is replaced with the calculated mask information bits—generally following a pre-defined convention. Processing continues at block 2218 where the write data is sent to the memory device. If only one byte needs to be masked, as determined at block 2206, then block 2208 is performed to calculate the mask information bits as previously described, followed by block 2210 where the masked byte is replaced with the mask information bits. Processing then continues at block 2218 where the write data is sent to the memory device.

Exemplary embodiments apply to writing to memory, where the memory write data is composed of n bytes (e.g. in a "burst" operation), each transfer contains m bits (e.g. 4, 8, 16, etc bits), and some of the bytes require masking. In an exemplary embodiment, the memory controller generates a mask information byte having n bits and replaces any one or more of the bytes to be masked with the mask information byte. The mask information byte is created so that a logical operation (e.g., an XOR) receiving n×m bits and outputting m bits to generate an m-dimensional syndrome vector (e.g., a parity vector, a CRC code) that specifies which of the bytes should be masked.

FIG. 23 depicts an alternate exemplary embodiment that may be implemented to perform data masking. As depicted in FIG. 23, a memory controller sends four more bits through an unused portion of the address portion of the command coded as shown in the table. In the exemplary example cited, column address A14 is coded as a "0" to indicated that no masking applies to the current operation, whereas when column address A14 is a "1", a coding of "1" (e.g. on column addresses A0-A2) indicates that masking will occur as specified in the table in FIG. 23. In this example, the DRAM compares the "1"s in the parity information and the number of masked bytes (from the table). If these results match, masking is completed. The table depicted in FIG. 23 is one example of how the coding can be performed, other coding schemes may be implemented by exemplary embodiments as long as the memory controller and the memory device are both aware of the coding scheme.

Other exemplary embodiments reduce the amount of "dead time" on the bus that occurs when a data strobe signal(s) (which is used by the receiving device to capture data being received) begins to switch but data cannot reliably be transferred to a recipient because the data strobe signal(s) has not yet achieved a stable switching condition to permit data to be captured by the recipient. As data transfer speeds increase, the unusable dead time (referred to herein as the "preamble" time) increases as a percentage relative to the overall available bus bandwidth due to the reduction in the useable data valid time (e.g. data valid "window"). This is especially true in cases when write operations are following by read operations (and the converse), as well as when bus transfers take place from varying "ranks" of memory on the bus—many, if not all of which requiring that the strobe be sourced from different device(s) on the bus thereby increasing unusable and/or "dead time" on the bus. Further, increased data transfer speeds result in the need for increased data strobe placement accuracy relative to data, as well as stability, etc to ensure data is captured with a high degree of accuracy and consistency— required for high reliability and high performance systems. The increased data strobe preamble time reduces the amount of time available for data transfers, thereby increasing the amount of "dead time" on the data bus and reducing the benefit of the higher data transfer speed. Contemporary solutions are consistently reducing the percentage of time available for bus transfers, thereby reducing (or even negating) the benefit of future memory devices/systems. Exemplary embodiments take into account the variation in required preamble time based on factors such as data rate (e.g., the speed which data is transferred on the bus) and loading conditions (e.g., the number memory modules, number of memory devices, number of connectors, etc.). Exemplary embodiments allow the number of preamble cycles to be programmable so that the preamble time is selected based on the current conditions—e.g. less preamble time is utilized when the bus is operating at a lower speed or has a lighter load. This exemplary solution allows for systems to dynamically select the appropriate preamble time based on the current application conditions, thereby maximizing performance for each application.

Figure 24:
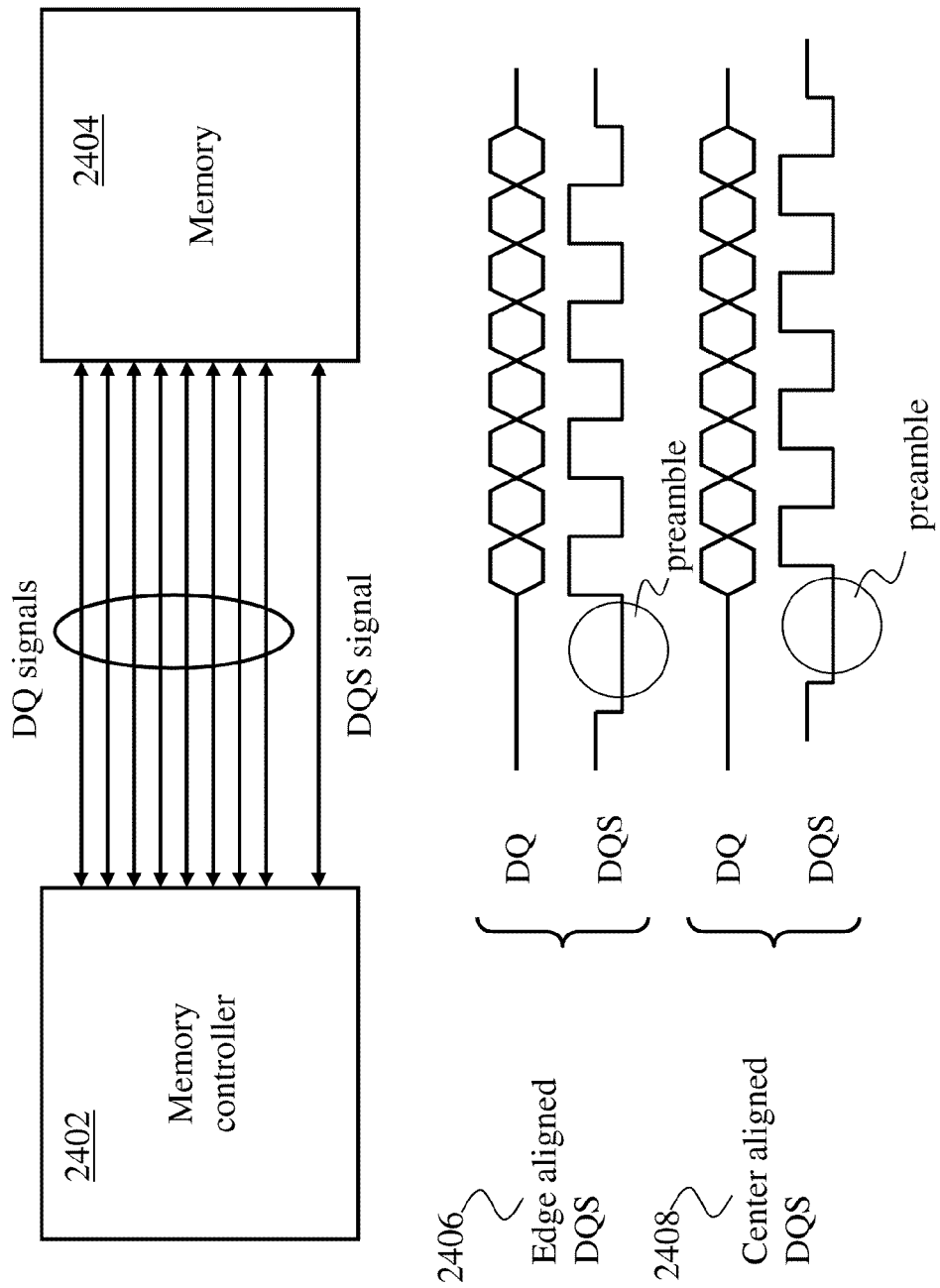
FIG. 24 depicts a memory system having a static preamble time.

FIG. 24 depicts a memory system having a static preamble time such as found in contemporary DDR and DDR2 devices. As shown in FIG. 24, a memory controller 2402 and a memory device 2404 exchange data bits on a data bus (labeled as "DQ signals") using a data strobe (labeled "DQS signal"). The system example in FIG. 24 arbitrarily includes eight DQ signals and a single DQS signal being transferred between the memory controller 2402 and the memory device 2404, however other implementations are possible where there are more or fewer DQS signals and more or fewer DQ signals. In addition, exemplary embodiments may further include one or more buffer devices between the memory controller 2402 and the memory device 2404 passing one or more of the DQS signals and DQ signals. For ease of understanding, a direct connection between the memory controller and memory device is shown. Both the edge aligned DQS 2406 (e.g., used for data reads in contemporary DDR memory devices) and the center aligned DQS 2408 (e.g., used for data writes from contemporary controller or buffer devices) depicted in FIG. 24 include examples of static preambles where the DQS symbol is driven to a static state prior to the start of data transfer (in this example, prior to the transfer of data, the DQS is driven to a low state, although it could be also be driven high state of some other known static state). Static preambles may be used, for example in DDR or DDR2 memory devices. In both examples, the memory device waits until the DQS is stable (consistent with a timing parameter included in the device specification) before transferring data; this wait time is labeled in FIG. 24 as the data transfer "preamble" time. In the edge aligned DQS 2406 the data is captured by the receiving device, generally at a delayed time (from DQS) relative to the rising and falling edges of the DQS signal. In the center aligned DQS 2408 the data is captured by the receiving device when the DQS signal is high and when the DQS signal is low. Although not shown, circuitry in the receiving devices (e.g. the memory controller 2402 or memory device 2404) may include period re-training to maximize the probability that data will reliably captured under the then current conditions—e.g. by applying a further delay to either the DQ, DQS, latching circuitry or other means to ensure that the DQS is in the center of the received data eye or at such a point relative to the data eye that the maximum probability of reliable data capture is achieved.

Figure 25:
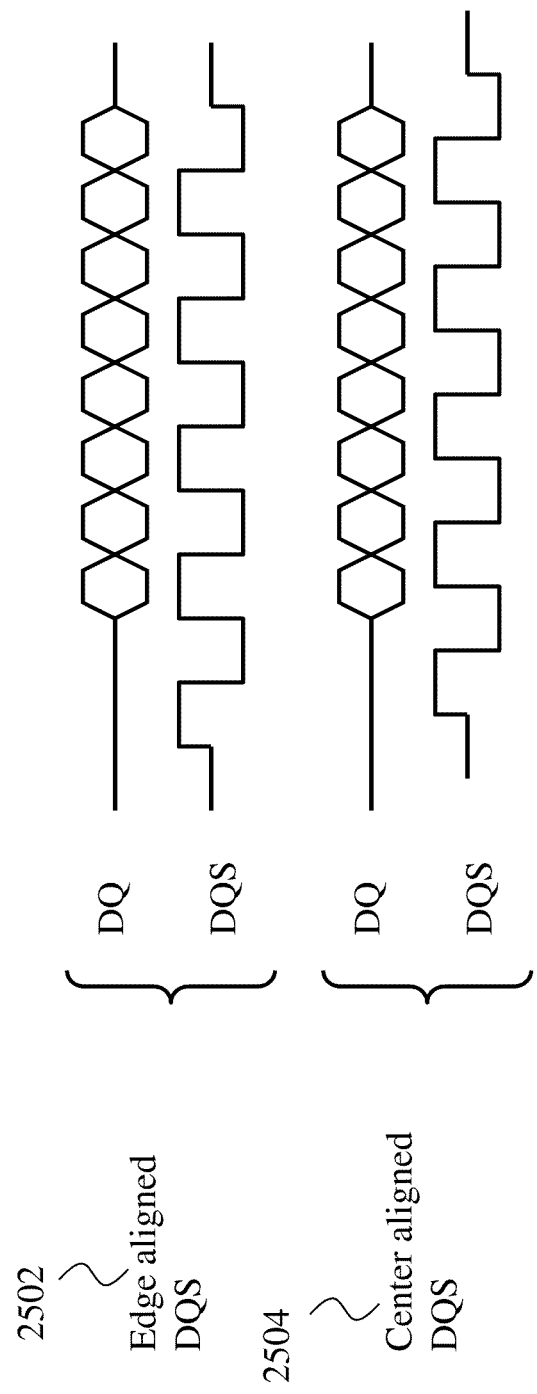
FIG. 25 depicts two examples of toggling preambles that may be implemented by a memory device.

FIG. 25 depicts two examples of toggling preambles that may be implemented by a memory device (e.g., a DDR3 memory device). Instead of switching the DQS signal to a low (or other "static") state during the preamble time, as depicted in FIG. 24, prior to the transfer of data the DQS signal begins to switch between a high and low signal during the preamble time—with the intent to reduce the preamble time at the faster (DDR3) speeds. In FIG. 25, examples of a toggling preamble are depicted for both an edge aligned DQS 2502 (e.g. for a "read" operation") and a center aligned DQS 2504 (e.g. for a "write" operation"), although other alignments may be applied in other devices without straying from the teachings herein. The amount of time (e.g., number of clock cycles) required for the preamble is specified in the memory device specification, and generally is defined to cover a worst case scenario (light and heavy loads, worst case environmental conditions, device process variations, etc.).

Figure 26:
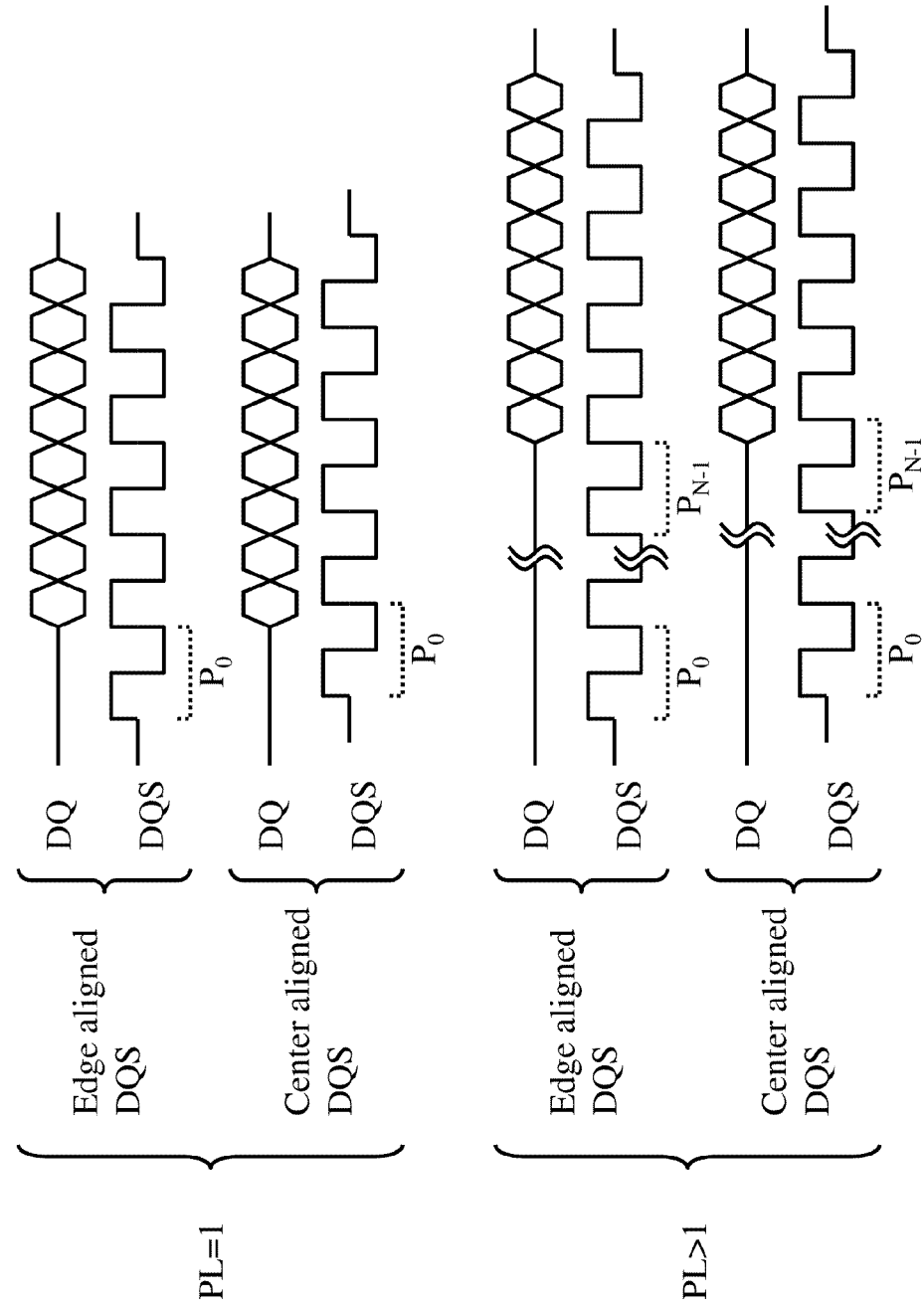
FIG. 26 depicts a memory device having a programmable preamble length (PL) that may be implemented by an exemplary embodiment.

FIG. 26 depicts a memory device having a programmable preamble length (PL) that may be implemented by an exemplary embodiment. The first example includes a PL of one (e.g. approximately one cycle), including both an edge aligned DQS example and a center aligned DQS example of a toggling preamble, with the preamble time being indicated as "$P_0$". The second example depicted in FIG. 26, where PL is greater than one, includes both an edge aligned DQS example and a center aligned DQS example of a toggling preamble, with the preamble time being indicated as "$P_{N-1}$". As shown in FIG. 26, the preamble time can be programmed to vary from one to "N" based on variations in applications as previously described. This innovation permits systems to determine for their then current memory environment, the optimal preamble length and therefore the permitting achievement of the optional bandwidth available—with reduced preamble times resulting in increased system bus bandwidth and overall performance.

Figure 27:
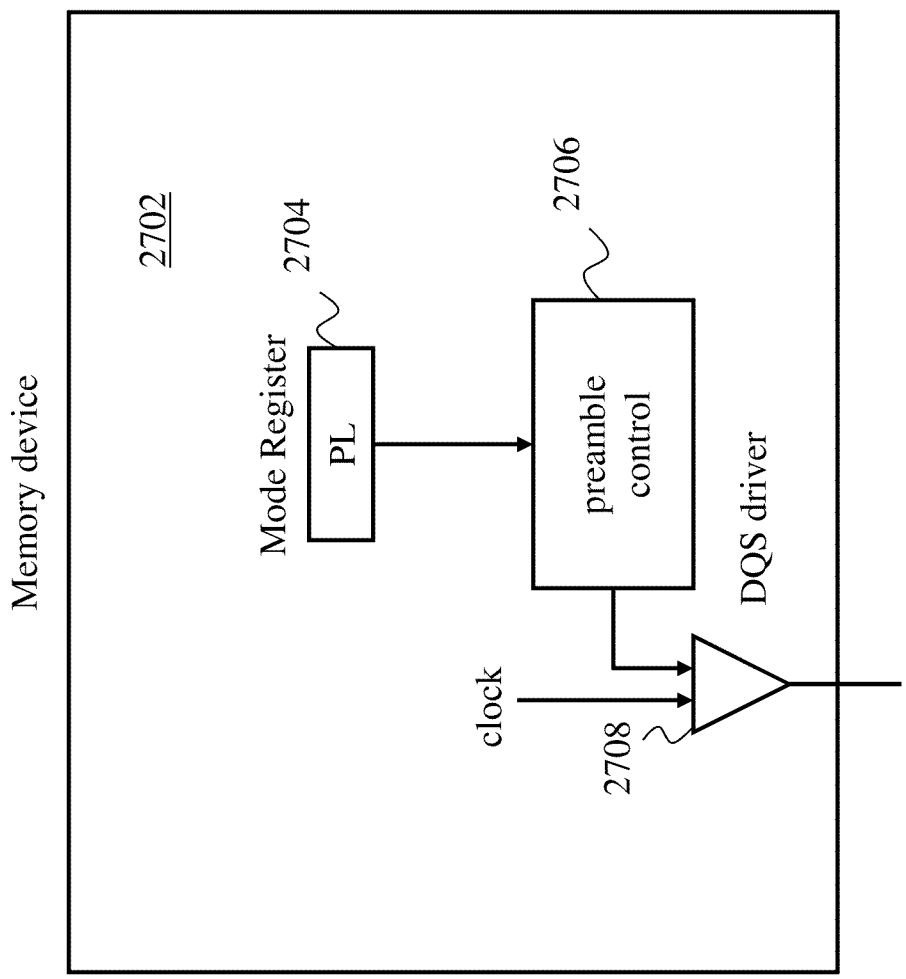
FIG. 27 depicts a memory device for providing a programmable preamble that may be implemented by an exemplary embodiment.

FIG. 27 depicts a memory device 2702 for providing a programmable preamble that may be implemented by an exemplary embodiment. The memory device depicted in FIG. 27 includes a mode register 2704, preamble control circuitry 2706, and a DQS driver 2708. In this embodiment, the PL is programmed into the mode register 2704 during system initialization—at which time the exemplary devices and systems determine the memory structure including bus loading, environmental conditions, etc. As such, in the exemplary embodiment the value of the PL programmed into the mode register 2704 will vary based on the environment during initialization and may be updated periodically based on memory loading changes and/or when the environmental conditions change. As such, system performance may vary (within and/or between systems), over time, in a manner not possible with contemporary technologies. As shown, in FIG. 27 the preamble control circuitry 2706 receives the PL from the mode register 2704 and sends a signal to the DQS driver 2708 to gate the DQS driver 2708 based on the PL. The signal received from the preamble control circuitry 2706 along with an internal clock with timing adjustments to DQS potentially implemented relative to the clock during initialization and/or periodic recalibration affecting the time at which the DQS signal is sent (e.g. relative to data).

Figure 28:
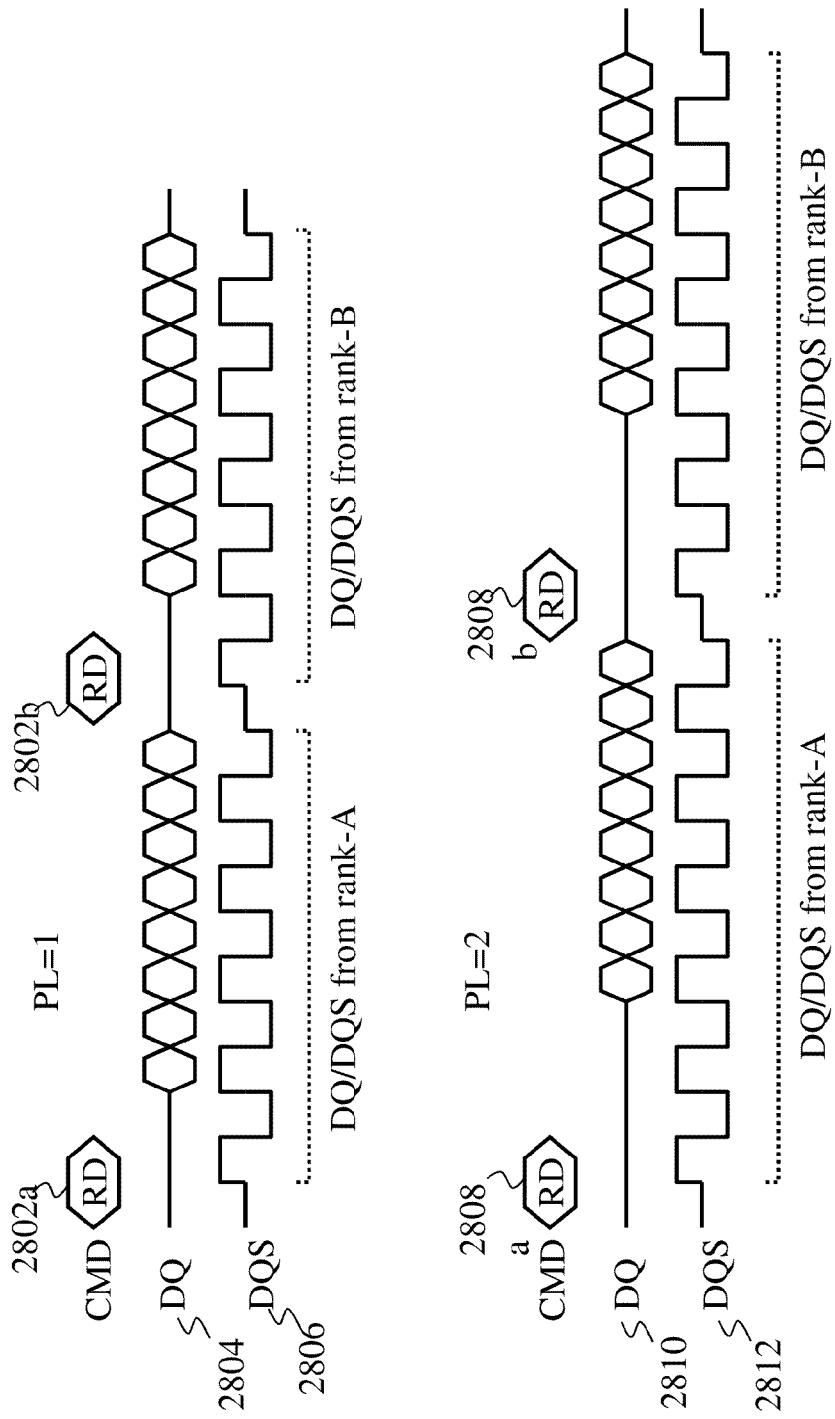
FIG. 28 depicts two examples of timing diagrams describing a read command being processed by a memory device having a programmable preamble.

FIG. 28 depicts two sets of timing diagrams for read commands being processed by a memory device having a programmable preamble. The top of FIG. 28 depicts a read command 2802a being processed at a memory device having a PL of one. The first read command 2802a is directed to a memory device in memory rank A and upon receiving the read command 2802a the DQS 2806 preamble is started and begins toggling. Because the programmable preamble is equal to one, one cycle after the DQS 2806 begins toggling, the data is sent by the DQ bus 2804 and captured by the receiving device in response to the data being transmitted to the receiving device (e.g. a memory controller, processor, buffer device, etc) approximately in the center of both the low and high levels of the DQS 2806 or in another placement relative to the data eye as previously described. FIG. 28 also depicts a subsequent (second) read command 2802b directed to a memory device in memory rank B and upon receiving the read command 2802b, the DQS 2806 preamble is started, and one cycle later the read data on the DQ bus 2804 begins to be transferred, and is captured using the DQS signal 2806.

The bottom half of FIG. 28 depicts two alternate read commands 2808a and 2808b being processed at a memory device having a PL of two. As previously discussed, the exemplary embodiment provides for a dynamic DQS preamble time—enabling (in the example shown) a single memory interface (e.g. a memory controller interface to a memory device, etc) to operate with one, two or more preamble switching cycles based on the present environment. In this embodiment, the first read command 2808a is directed to a memory device in a memory rank A and upon receiving the read command 2808a the DQS 2812 preamble begins (toggling). Because the programmable preamble is equal to two in this example (e.g. due to heavier bus loading, higher transfer rates, etc), two cycles after the DQS 2812 begins toggling, the data is sent by the sourcing device on the DQ bus 2810 and is captured by the receiving device in response to the data being transmitted to the receiving device utilizing the DQS signal 2812 (with the DQS generally shifted, by the receiving device and in response timing adjustments made during initialization and periodic recalibration) such that the DQS captures the received data with the DQS signal arriving at the receiver latch at the relative center of the data eye associated with the data transferred on DQ 2810. Alternate methods known in the art may be used to capture the read data sent when the DQS is sent at relatively the same time as the data—the example described is one common means to achieve this function in a reliable manner. FIG. 28 also depicts a second read command 2808b directed to a memory device in memory rank B and upon receiving the read command 2808b, the DQS 2812 preamble toggling is started, and two cycles later the read data on the DQ bus 2810 begins to be transferred and is captured utilizing the DQS 2812 such as with the manner previously described.

Figure 29:
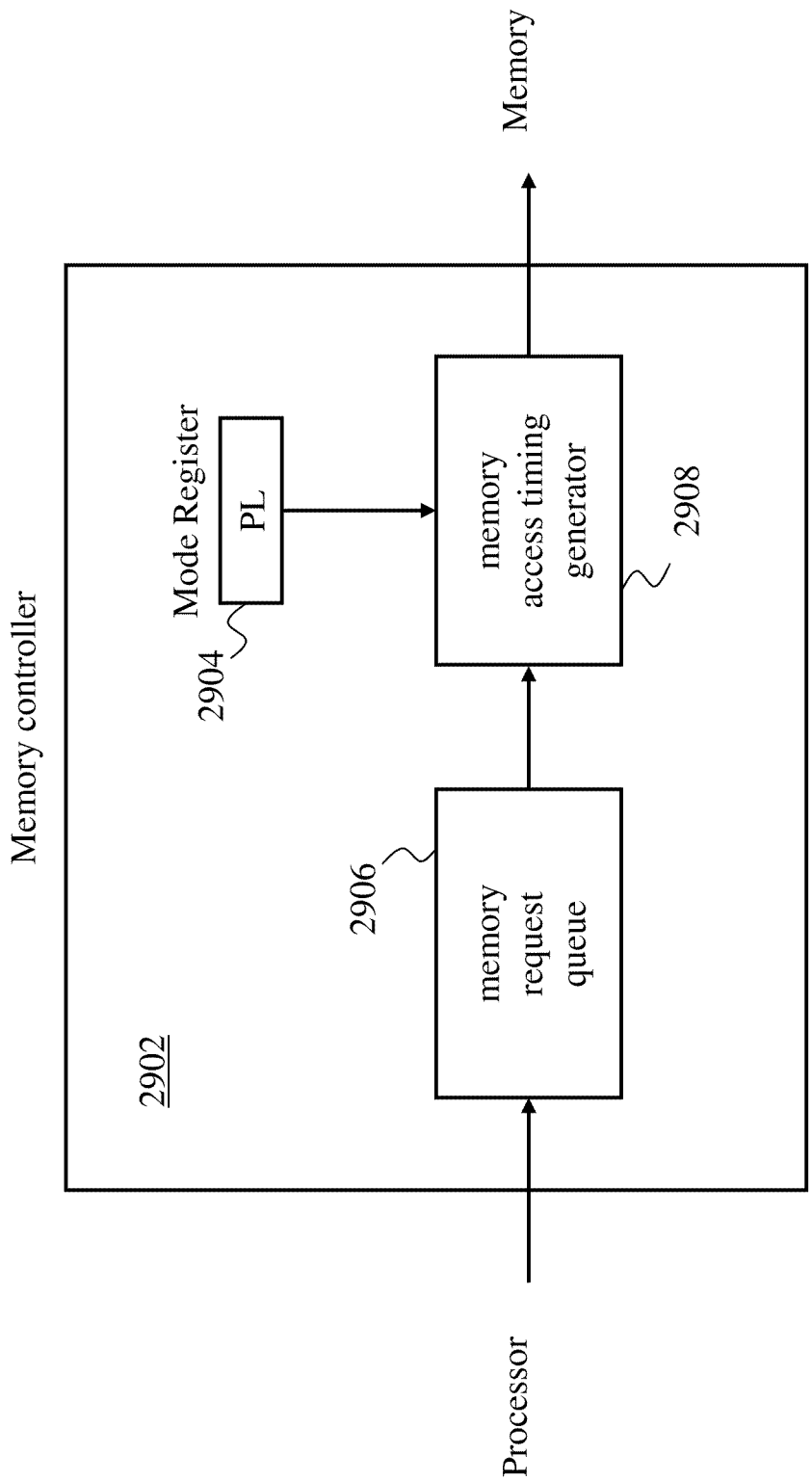
FIG. 29 depicts a memory controller for providing a programmable preamble that may be implemented by an exemplary embodiment.

FIG. 29 depicts a memory controller 2902 for providing a programmable preamble that may be implemented by an exemplary embodiment. The memory controller 2902 depicted in FIG. 29 includes mode register 2904 comprising one or more registers utilized to establish the operating characteristics of the memory controller, a memory access timing generator 2908, and a memory request queues 2906. In this embodiment, the PL is programmed into the mode register 2904 during system initialization and may be updated during periodic calibration cycles. The value of the PL programmed into the mode register 2904 will vary based on the current environment during initialization and may be updated periodically to optimize reliable memory operation and/or when the memory system environment changes. In an exemplary embodiment, the mode register 2904 includes two or more bits to specify the PL and when to apply different PLs. For example, the PL could vary based on which memory rank is being accessed by the command. In another example, the PL may vary based on which rank was accessed by the previous command and what rank is being accessed by the current command. In yet another example, the PL may be modified to reflect the addition of memory to the system (affecting loading and/or the thermal environment). Any number of factors that impact PL may be programmed into the mode register 2904 to vary the preamble in a manner which will allow the system and specifically the memory interface to operate at the optimal performance (e.g. minimum "dead cycles"/maximum bandwidth) at all times.

As shown in FIG. 29, the memory access timing generator 2908 receives a memory request from the memory request queue 2906 and a PL length from the mode register 2904. The memory access timing generator 2908 uses both of these inputs, in conjunction with other memory request information provided by the memory request queue to determine what information (e.g., command, address, data) to send to the target memory and in what sequence and timing.

Figure 30:
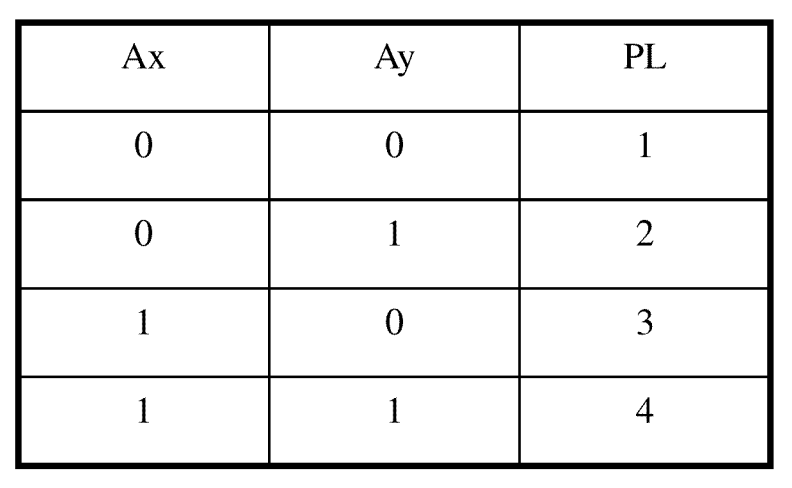

FIG. 30 depicts a mode register bit decoding table for PL that may be implemented by an exemplary embodiment. In an exemplary embodiment, the table in FIG. 30 is stored in a mode register and uses two bits to determine the PL. In a simple implementation, one or two bits are used and the PL is set during system start-up to include one, 2, 3 or 4 preamble cycles as shown in the "PL" column (or ½ preamble cycles in an alternate embodiment). More complicated scenarios may be implemented by exemplary embodiments where the PL is rank dependent and determined and/or modified during runtime, or the PL rank is dependent on a previous command that was issued. In addition, less or more than two bits may be used for the PL decode. The described options would affect the size and complexity of the registers, but not otherwise differ from the fundamental teachings of embodiments of the invention.

Figure 31:
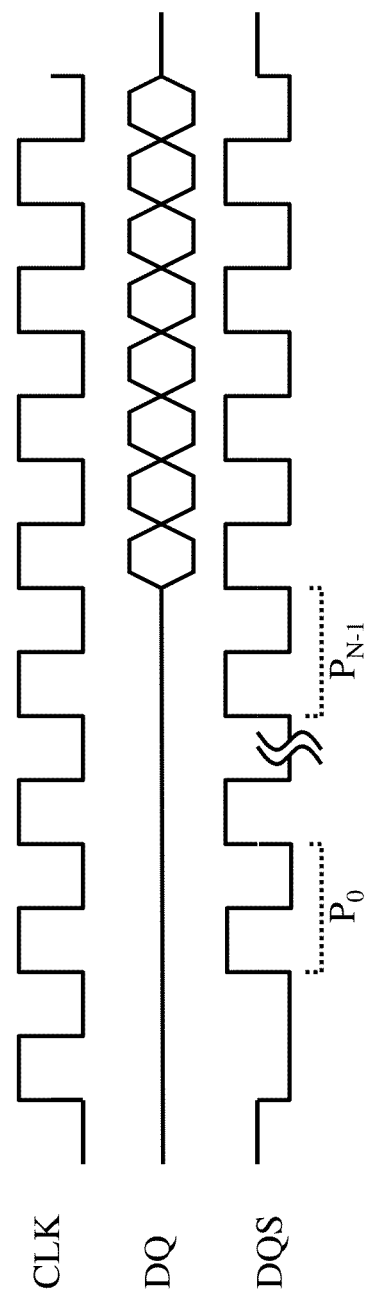
FIG. 31 depicts a preamble that includes both a fixed static preamble and programmable toggling preamble portion that may be implemented by an exemplary embodiment.

FIG. 31 depicts a PL that specifies both a (generally predefined) static and toggling preamble that may be implemented by an exemplary embodiment. In the example depicted in FIG. 31, the static preamble has a length of one and the toggling preamble has a length of N. This example is utilized to show that there is no limitation to the use of only a static preamble, a toggling preamble or some other single preamble sequence, but also a combination of preamble sequences (including those shown but not precluding others) that offer the optimal (e.g. minimum) "dead" time prior to the initial data transfers.

Figure 32:
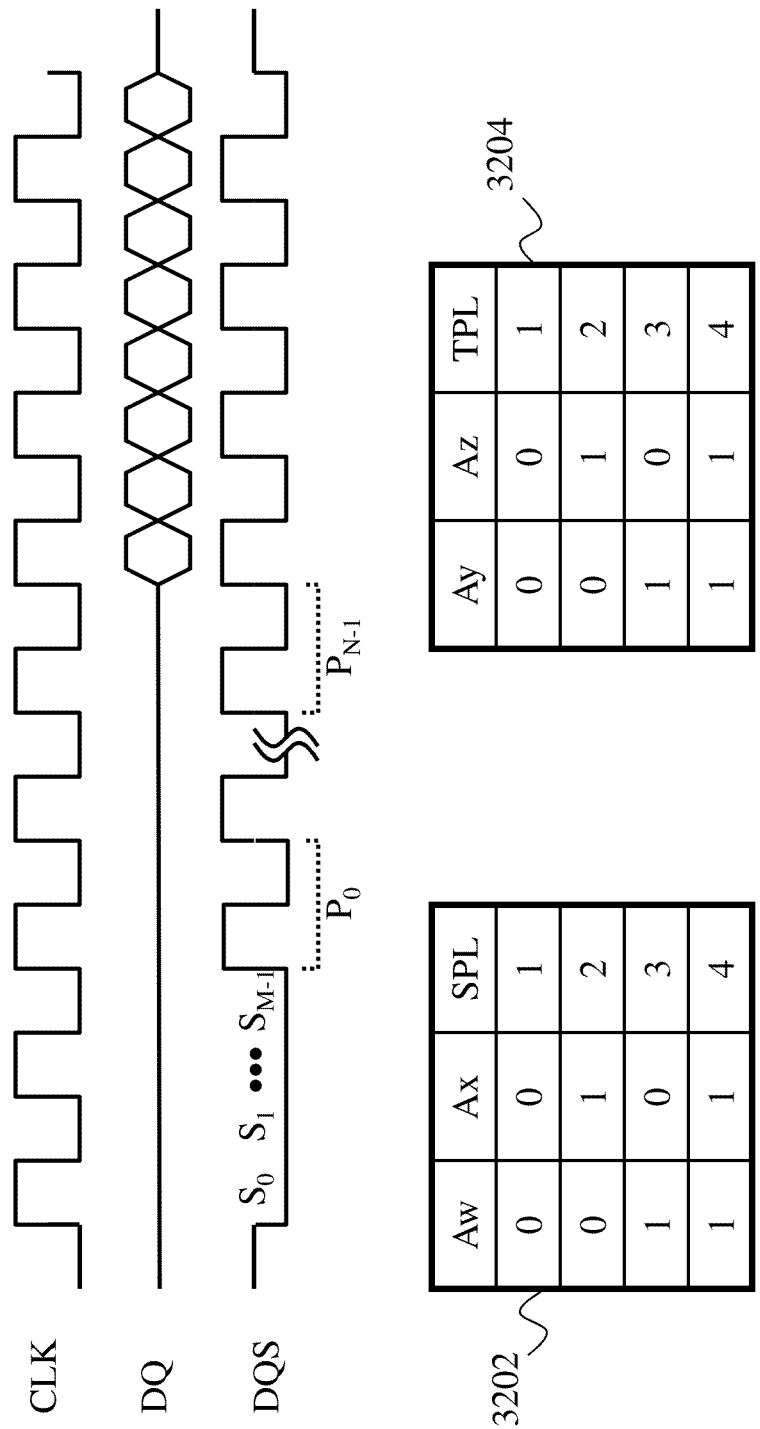
FIG. 32 depicts a timing diagram and decoding tables stored in a mode register that may be utilized by an exemplary embodiment to implement a programmable static and programmable toggling preamble.

FIG. 32 depicts a timing diagram including a clock, DQ and DQS signal as well as decoding tables stored in a mode register that may be utilized to implement a combination of preamble sequences such as the programmable static and toggling preambles that may be implemented by an exemplary embodiment. The mode register includes two decoding tables, a static preamble length (SPL) table 3202 and a toggling preamble length (TPL) table 3204. The example depicted in FIG. 32 uses two bits to indicate four different SPLs and two additional bits to indicate four TPLs. As described previously with respect to the PLs more complicated scenarios may be implemented by exemplary embodiments. As shown in FIG. 32, the SPL may vary from one to M and the TPL may vary from one to N—again, with the objective to effect such elements as limiting the "dead" time between data transfers and/or maximize usable bus data bandwidth in varying applications—although other objectives such as reduced power, reduced noise or other operational characteristics may apply in other exemplary embodiments.

Figure 33:
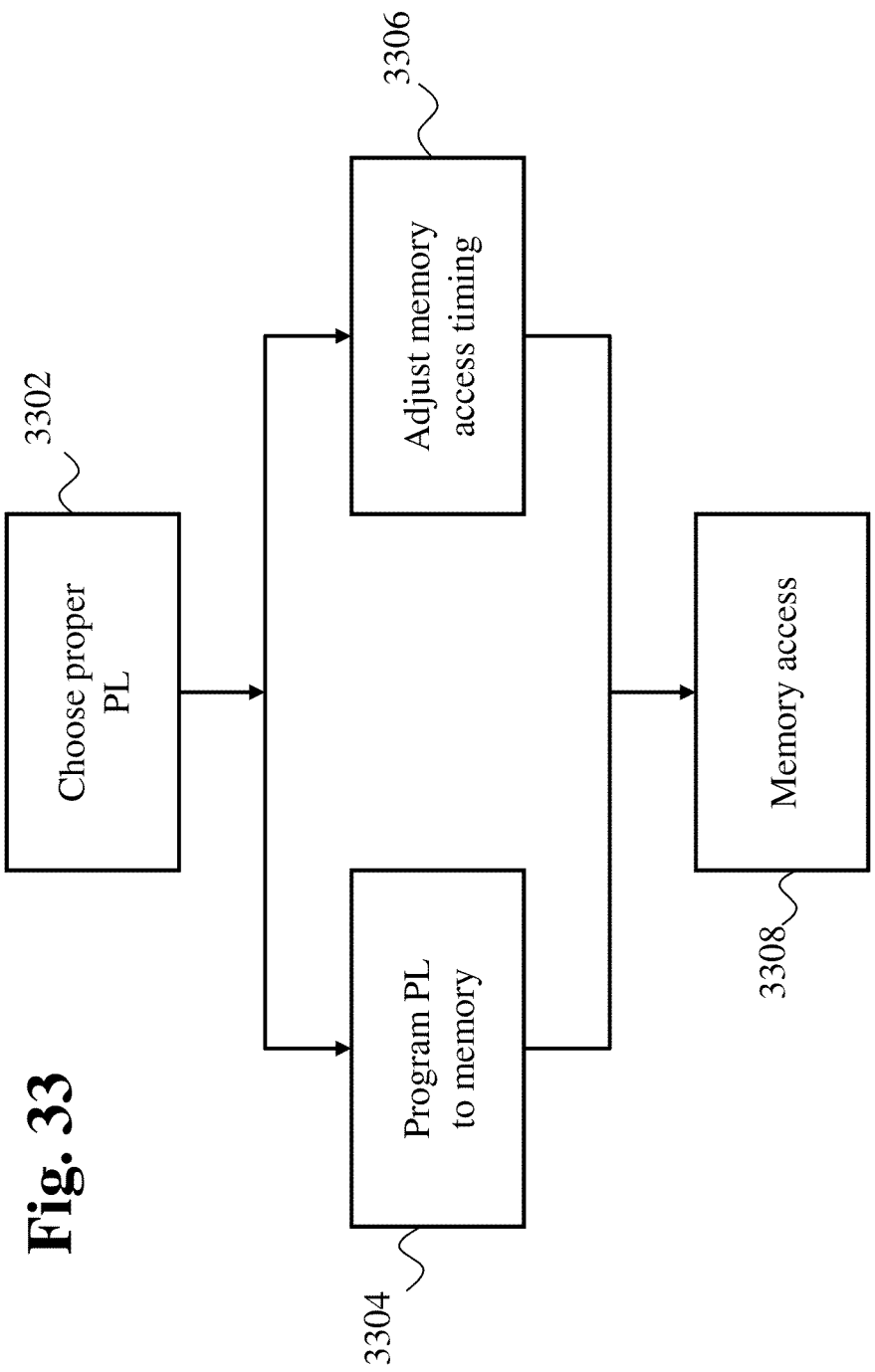
FIG. 33 depicts a process flow that may be implemented by a memory controller in an exemplary embodiment to provide a programmable PL.

FIG. 33 depicts a process flow that may be implemented by a memory controller in an exemplary to provide programmable PL. In an exemplary embodiment, blocks 3302 and 3304 are performed during initialization and may be implemented during periodic recalibration, and blocks 3306 and 3308 are performed during run-time. At block 3302, a PL for the command is selected by the memory controller—generally based on the current environment. Next, at block 3304, the PL is programmed to the memory device 2704 as well as the memory controller 2904. At block 3306, the memory access timing is adjusted based on a current environment and/or the memory devices and the command is directed to and/or the memory devices accessed by previous commands. Processing continues at block 3308 where the memory access command is issued to the memory device.

Further exemplary embodiments include a DRAM (also referred to herein as a "memory device") having a fast exit self-refresh mode. Self-refresh mode is the power state of the DRAM in which data is retained by the memory device with the memory device refreshing itself at a specified interval—resulting in reduced memory device power consumption while the memory device in not accessible for normal operations. In contemporary memory devices it takes a relatively long period of time to recover upon exit from the self-refresh mode due to the requirement to re-lock the DRAM DLL once the memory device is directed to exit the self refresh mode. One reason for this long period of time to recover is that that DLL is completely shut down during self-refresh mode to minimize power usage, and therefore the DLL is not updated during self-refresh mode. A DRAM can be in a self-refresh mode for a very lengthy period of time so it may take a long time for the DLL to re-adjust the delay loop for the now current environmental conditions. Typically, the DLL is reset upon self refresh entry or upon self-refresh exit because re-locking by resetting generally takes less time than adjusting the DLL signal path by executing the DLL control path/DLL timing update several times. However, a re-lock from an initial DLL state still requires a large number of clock cycles (e.g., five hundred to seven hundred clock cycles for a DDR3 SDRAM, as specified in the memory device specification). Therefore, the self-refresh function might not be widely used in systems to reduce power due to system performance reasons (e.g. due to the long "self refresh exit" time)—even with the dramatic reduction in system/memory power, necessary cooling, temperature-based improved reliability, etc that will generally result—especially in a system containing large amounts of memory (e.g. a memory server).

An exemplary embodiment described herein includes a self-refresh mode with no and/or minimal DLL re-lock time upon self-refresh exit, and hence a relatively short exit recovery time from the self-refresh mode. Such an innovation could dramatically reduce computer system power (memory is quickly becoming the largest user of power in large servers) as well as offer additional benefits as previously described, by allowing more widespread use of the innovative self-refresh function described herein. In an exemplary embodiment, during self-refresh the DLL control 210 is periodically woken up, the clock delay is updated to reflect the current environmental conditions, after which the DLL is shut down again. Because the DRAM does not respond to external commands during self-refresh, the DRAM manages the periodic on/update/off processing by itself. There is already an internal oscillator inside a DRAM to periodically activate pages (e.g. word lines) for such purposes as self refresh. An exemplary embodiment utilizes the existing internal oscillator to perform a periodic DLL update. Exemplary embodiments include several variations such as using the falling edge of the oscillator output (e.g., a clock) to prevent overlap between refresh and DLL update, using clock dividing to make the refresh period and the DLL update period different to reduce both the minor power increases, internal device noise, etc), as well as updating not only the DLL but also the drivers (e.g., ZQ calibration) during self-refresh—further reducing the time required after self refresh exit and prior to normal operation.

Figure 34:
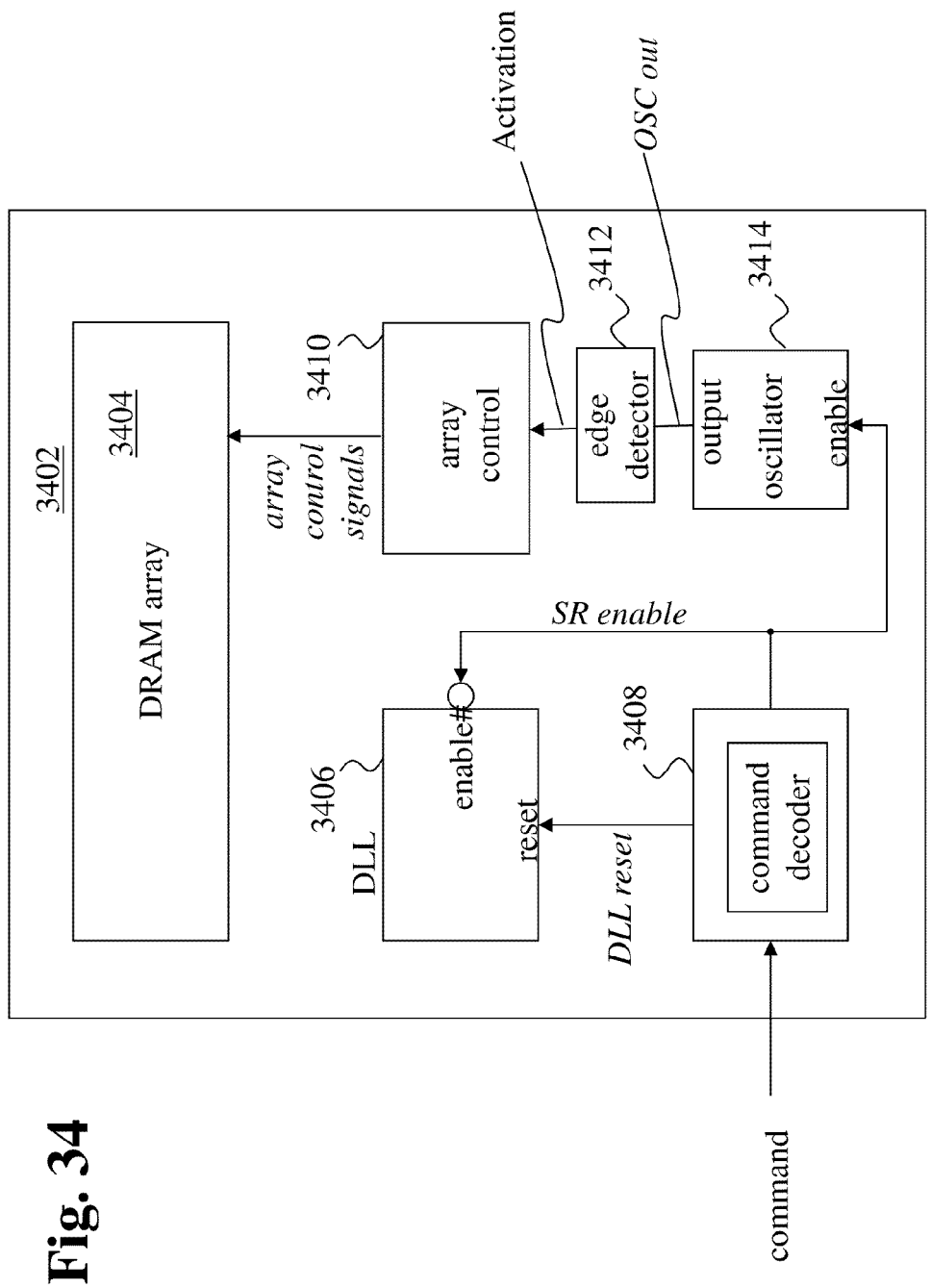
FIG. 34 depicts a block diagram of a dynamic random access memory (DRAM)

FIG. 34 depicts a block diagram of a DRAM. The DRAM 3402 depicted in FIG. 34 includes a DRAM array 3404, an array control 3410, an edge detector 3412, an oscillator 3414, a DLL 3406, and a command decoder 3408. If an enter self-refresh command is received by the command decoder 3408, then the command decoder 3408 transmits a self-refresh enable signal ("SR enable) to the DLL 3406 and to the oscillator 3414. In response to receiving the self-refresh enable signal, the DLL 3406 powers down. In response to receiving the self-refresh enable signal, the oscillator 3414 is powered on. The edge detector 3412 then looks for an edge from the oscillator output ("OSC out"). When an edge is detected by the edge detector 3412, array control signals are sent to the array control 3410 to refresh the contents of the DRAM array 3404 for the current selected wordline. When, a self-refresh exit command is received by the command decoder 3408, then the command decoder 3408 generates a DLL reset signal and sends it to the DLL 3406. The DLL 3406 further receives the SR enable# signal indicating that self refresh is no longer active), responding by powering up, resetting the DLL control circuitry 210 (if not done at self refresh entry and/or unless another means as known in the art is used) and re-locking the DLL to the now current external clock so that the DRAM operates normally.

FIG. 3, described previously, depicts a more detailed view of a DLL that may be implemented by elements included in the DLL 3406 in FIG. 34—some of which may be further optimized for the enhanced self refresh exit.

Figure 35:
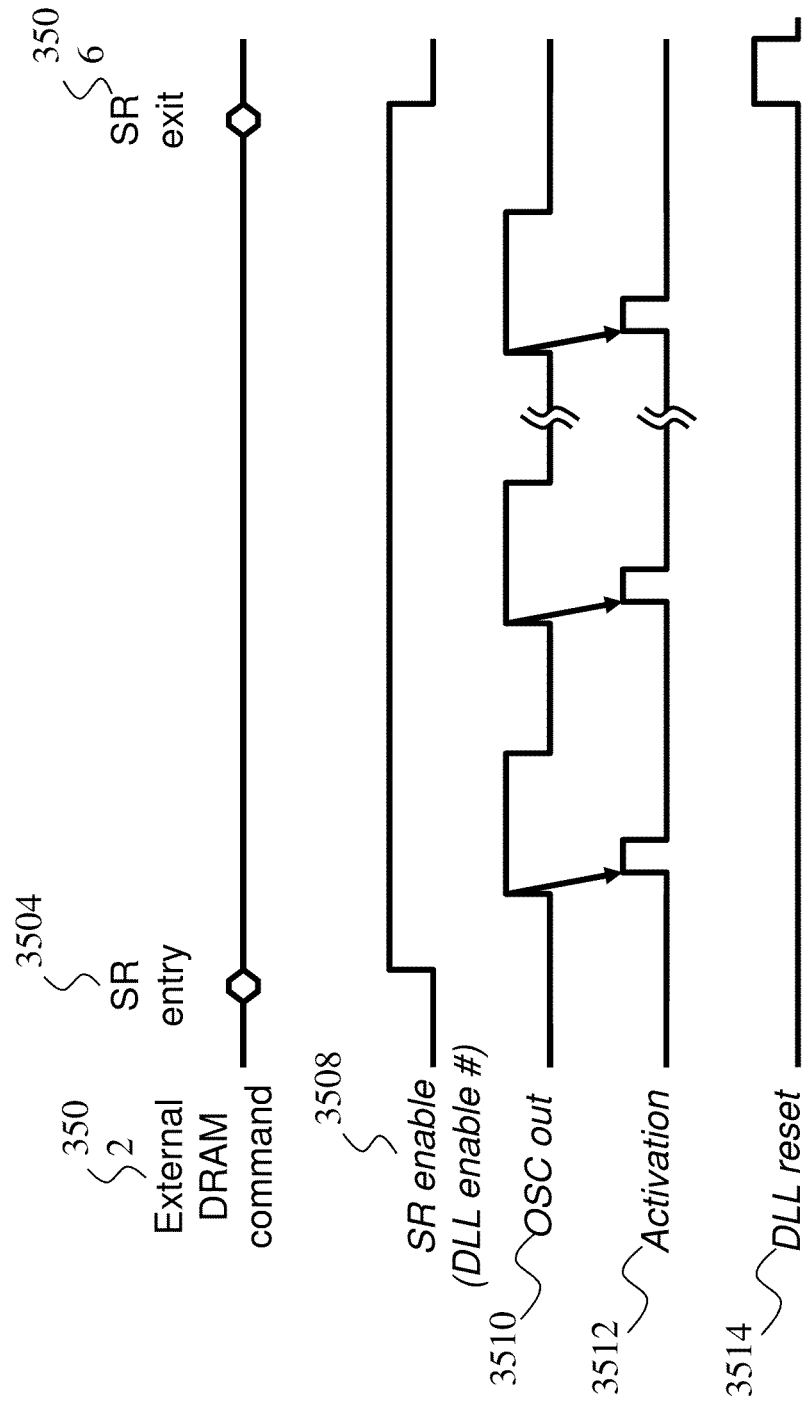
FIG. 35 depicts an internal timing diagram of the dynamic random access memory (DRAM) depicted in FIG. 34 during a self-refresh.

FIG. 35 depicts an internal timing diagram of the DRAM depicted in FIG. 34 during self-refresh operation. As shown in FIG. 35, a self-refresh entry command 3504 is received at the command decoder 3408 via an external DRAM command bus 3502. In response to the self refresh entry command, the command decoder 3408 sends a self-refresh enable signal 3508 to the DLL 3406 to disable (e.g., power off) the DLL 3406 and to the oscillator 3414 to enable (power on) the oscillator 3414. When the oscillator 3414 is enabled it generates a slow speed clock, OSC out 3510. When the edge detector 3412 detects an edge in the OSC out 3510 (in this example a rising edge, however a falling edge, or both a rising and falling edge may also be used or combinations thereof) it generates the activation signal 3512 to cause the array control 3410 to perform a refresh to a portion (e.g. to the one or more next scheduled wordline(s)) of the DRAM array 3404. This process of generating activation signals 3512 in response to OSC out 3510 continues until a self-refresh exit command 3506 is received by the external DRAM command bus 3502. In response to receiving the self-refresh exit command 3506, the DLL 3406 is reset and the oscillator 3414 is powered off. When the DLL 3406 is enabled and reset, at which point the DLL 3406 begins to execute a DLL re-locking process to the now current environmental conditions and clock, before memory access commands can be normally processed by the DRAM 3402.

Figure 36:
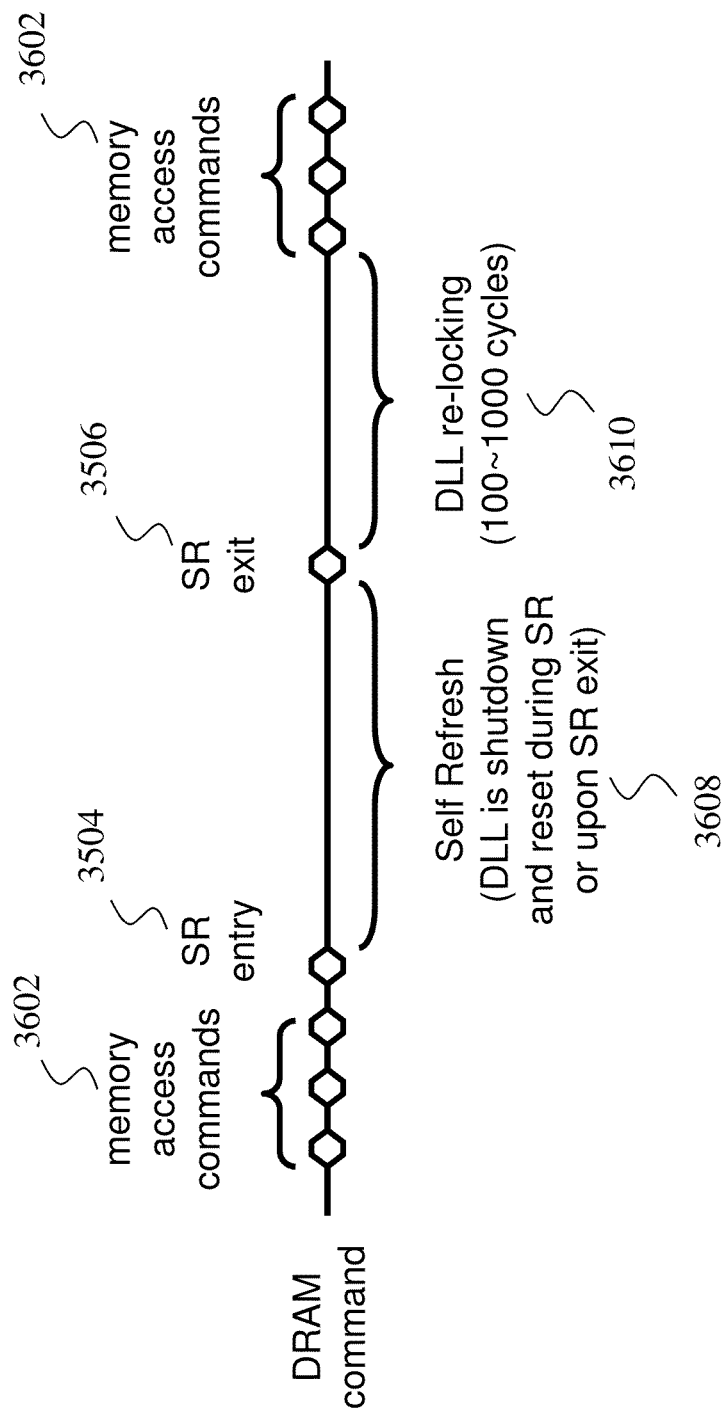
FIG. 36 depicts an external timing diagram of entering and exiting the self-refresh mode.

FIG. 36 depicts a higher-level external timing diagram of entering and exiting the self-refresh mode (e.g. FIG. 35) as perceived by the application. As depicted in FIG. 36, memory access commands 3602 (e.g., received on a DRAM command bus) are received followed by a self-refresh entry command

3504. In contemporary memory devices, the self-refresh entry command 3604 causes all of the receivers to be turned off except for one or more receiver(s) that monitor one or more signal line(s) or pin(s) that are used to send the self-refresh exit command 3506. While the DRAM is in self-refresh mode 3608, the DLL 3406 is shutdown. The DLL 3406 is then both enabled and reset (e.g. if not previously reset upon self refresh entry) in response to receiving a self-refresh exit command 3506 (e.g., via a reserved signal line or pin such as CKE, although other means may be utilized). Next, DLL re-locking 3610 must be performed to synchronize the DLL clock to the external clock, consistent with the current environmental conditions. As depicted in FIG. 36, DLL re-locking 3610 takes a large number of clock cycles (e.g., one hundred to one thousand) that vary depending on the type of DRAM. Unfortunately, unless DRAMs are procured from only a single supplier and/or be of a certain type, system producers will likely have to design to the worst case specification to ensure reliable operation with all memory devices consistent with industry standard specifications. Once the DLL re-locking 3610 is completed, memory access commands 3602 may again be processed.

Figure 37:
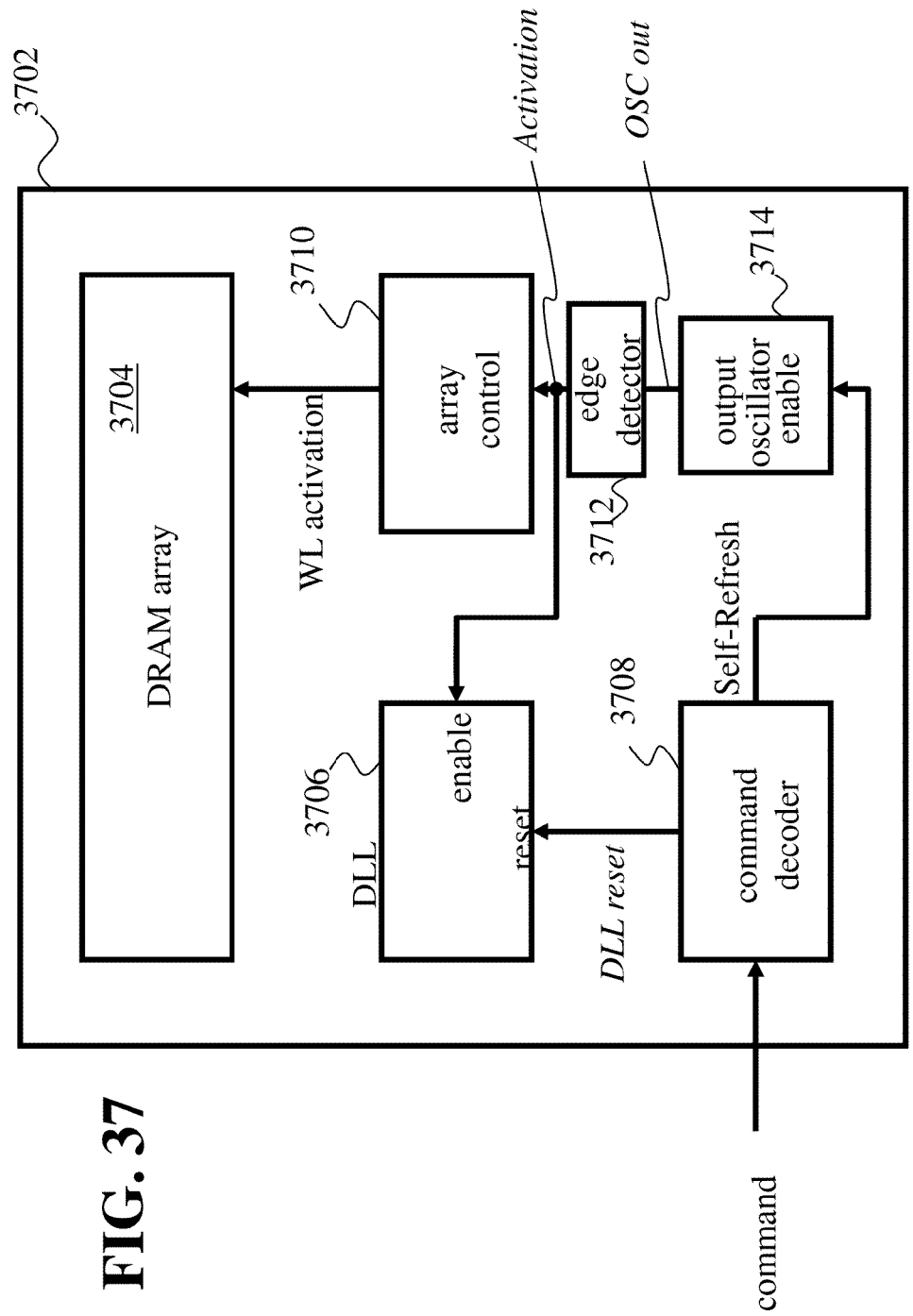
FIG. 37 depicts a block diagram of a DRAM that may be implemented by an exemplary embodiment.

FIG. 37 depicts a block diagram of a DRAM that may be implemented by an exemplary embodiment. The DRAM 3702 depicted in FIG. 37 includes a DRAM array 3704, an array control 3710, an edge detector 3712, an oscillator 3714, a DLL 3706, and a command decoder 3708. If an enter self-refresh command is received by the command decoder 3708, then the command decoder 3708 transmits a self-refresh signal to the oscillator 3714. In response to receiving the self-refresh enable signal, the oscillator 3714 is powered on. The edge detector 3712 then looks for an edge from the oscillator output ("OSC out"). When an edge is detected by the edge detector 3712, array control signals, or word line activation signals, are sent to the array control 3710 to refresh the one or more wordlines of the DRAM array 3704. In addition, an enable signal is sent to the DLL 3706 in response to detecting an edge on the output of the oscillator 3714. The enable signal from the edge detector 3712 causes the DLL 3706 to be powered on for a brief period of time (the period of time may be pre-determined and vary depending on the type of DRAM and/or input to the DRAM/DLL related to the extent of environmental change since the last update, etc) to update/resynchronize the DLL 3706 to reflect the current environmental conditions. Then the DLL 3706 is powered off. Though not shown in the diagram, one skilled in the art would recognize that the DLL is also enabled when the DRAM is active.

The periodic DLL update during self-refresh causes a slight increase in power during self-refresh. However, this increase is more than offset by the reduction in time for the DRAM 3702 to become operational after exiting from self-refresh and the potential savings for systems that make increased use of self refresh given the dramatically reduced performance impact for doing so.

In exemplary embodiments, there are two types of self-refresh. The first is the traditional self-refresh as depicted in FIGS. 34-36 that is used when it is expected that the DRAM will be in self-refresh mode for a long period of time. The second type of self-refresh as described herein periodically resynchronizes the DLL during self-refresh and can be used (or differentiated via a selective command) when it is expected that the DRAM will be in self-refresh mode for a short period of time. By offering two (or more) self refresh options, using methods such as described in the exemplary embodiments, dramatic power reductions can be achieved by aggressively managing memory in systems based on predicted and/or known operations over time.

When, a self-refresh exit command is received by the command decoder 3708, the DLL 3706 is ready to process memory access commands because it has been periodically updated while in self-refresh mode. It is possible, however, that memory system driver and receiver calibration may still be required (generally requiring a much shorter time)—as addressed in a subsequent exemplary embodiment to be described later.

Figure 38:
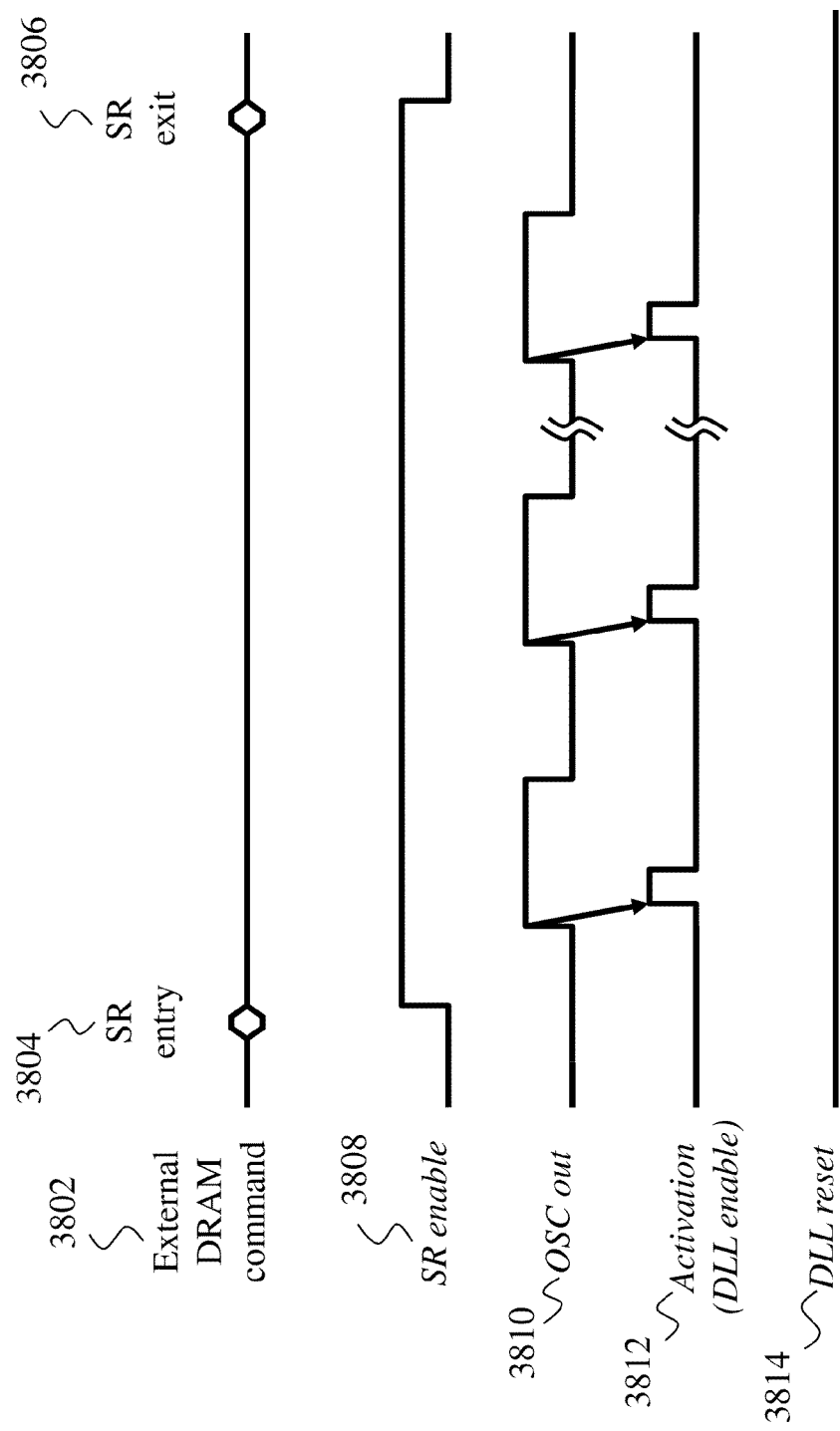
FIG. 38 depicts an internal timing diagram of the DRAM depicted in FIG. 37 during a self-refresh that may be implemented by an exemplary embodiment.

FIG. 38 depicts an internal timing diagram of the DRAM depicted in FIG. 37 during a self-refresh that may be implemented by an exemplary embodiment. As shown in FIG. 38, a self-refresh entry command 3804 is received at the command decoder 3708 via an external DRAM command bus 3802. In response, the command decoder 3708 sends a self-refresh enable signal 3808 to the oscillator 3714 to enable (power on) the oscillator 3714. When the oscillator 3714 is enabled it generates a slow speed clock, OSC out 3810. When the edge detector 3712 detects an edge in OSC out 3810 (as previously described, a rising edge is shown, although a falling edge, or both a rising and falling edge, etc may be used) it generates the activation signal 3812 to cause the array control 3710 to perform a refresh of the DRAM array 3704. In addition, the activation signal 3812 is sent to the DLL 3706 to power on the DLL 3702 for a short period of time. Once the period of time has elapsed the DLL 3702 is again powered down. In an exemplary embodiment, the length of time is fixed based on the type of DRAM or some other characteristic of the DRAM or the environment (as previously described). In another exemplary embodiment, the length of time that the DLL 3702 is powered on depends on a determination that the DLL has been resynchronized to current operating conditions (e.g. by digital bits 304 to variable delay 212 remaining constant for two or more cycles as previously described).

This process of generating activation signals 3812 in response to OSC out 3810 continues until a self-refresh exit command 3806 is received by the external DRAM command bus 3802. In response to receiving the self-refresh exit command 3806, the oscillator 3714 is powered off. Then, the DLL 3706 is adequately synchronized to permit the execution of memory access commands with no amount of time required for re-locking the DLL 3706. In an alternate exemplary embodiment, an additional re-locking of the DLL 3706 is performed when the self-refresh mode is exited. The number of cycles required for re-locking are minimal because of the periodic updates of the DLL 3706 during self-refresh.

Figure 39:
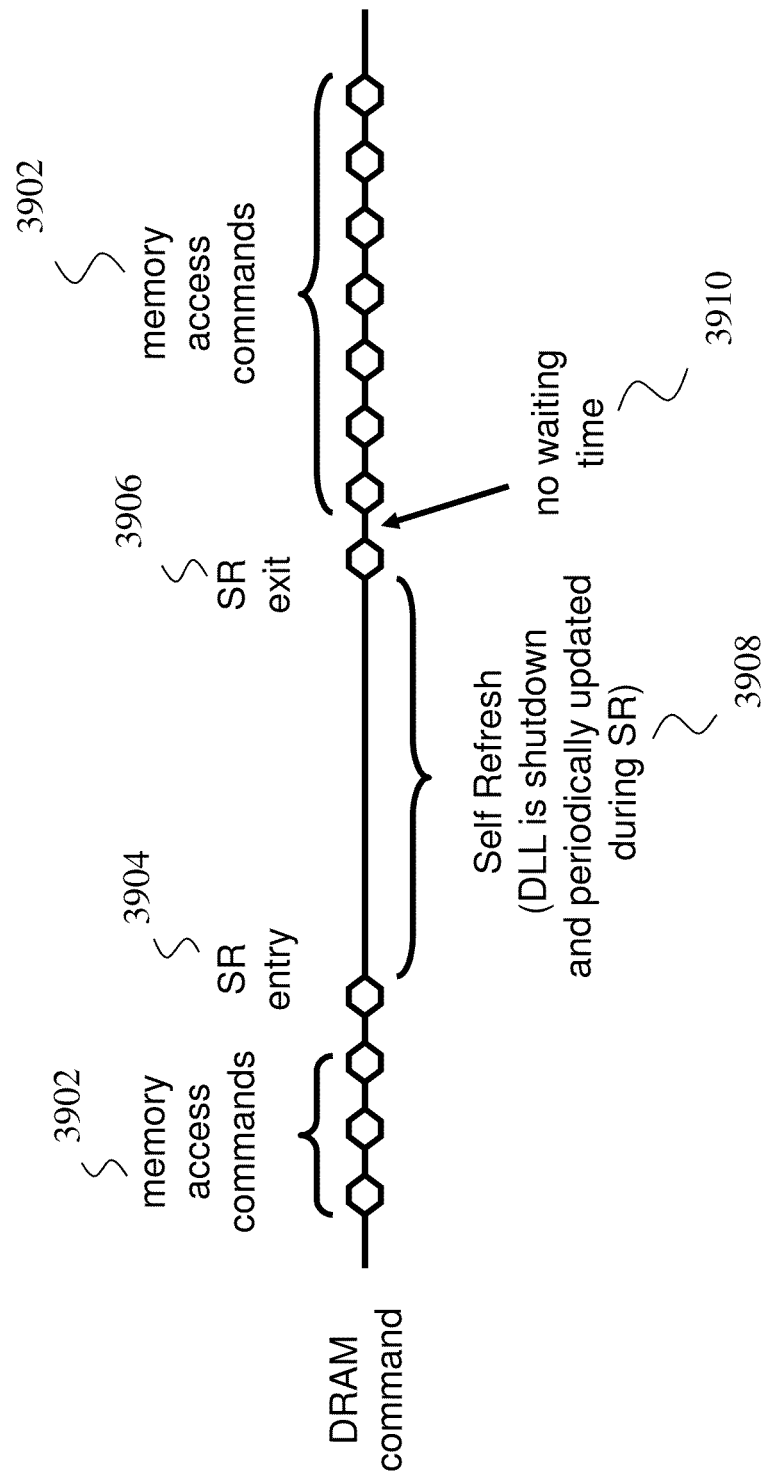
FIG. 39 depicts an external timing diagram of entering and exiting the self-refresh mode that may be implemented by an exemplary embodiment.

FIG. 39 depicts an external timing diagram of entering and exiting the self-refresh mode that may be implemented by an exemplary embodiment. As depicted in FIG. 39, memory access commands 3902 (e.g., received on a DRAM command bus) are received, followed by a self-refresh entry command 3904. The self-refresh entry command 3904 causes all of the receivers to be turned off except for one or more receiver(s) that monitor one or more signal line(s) or pin(s) that are used to send the self-refresh exit command 3906. While the DRAM is in self-refresh mode 3908, the DLL 3706 is shutdown and periodically updated. In response to receiving a self-refresh exit command 3906, the memory device again begins to process memory access commands 3902 as the DLL is sufficiently synchronized and locked to permit normal DRAM operation. As shown in the embodiment depicted in FIG. 36, no additional clock cycles are required for DLL re-locking upon exit from self-refresh, thereby permitting immediate operation of the memory device(s) previously in the exemplary self refresh state. In an alternate exemplary embodiment a few (two, four, six) clock cycles may be required upon exit of self-refresh for more accurate and timely re-locking of the DLL 3706 to the now current conditions. Thus, the throughput penalty of entering and exiting self-refresh mode is dramatically minimized relative to the current worse case conditions that systems must generally support.

Figure 40:
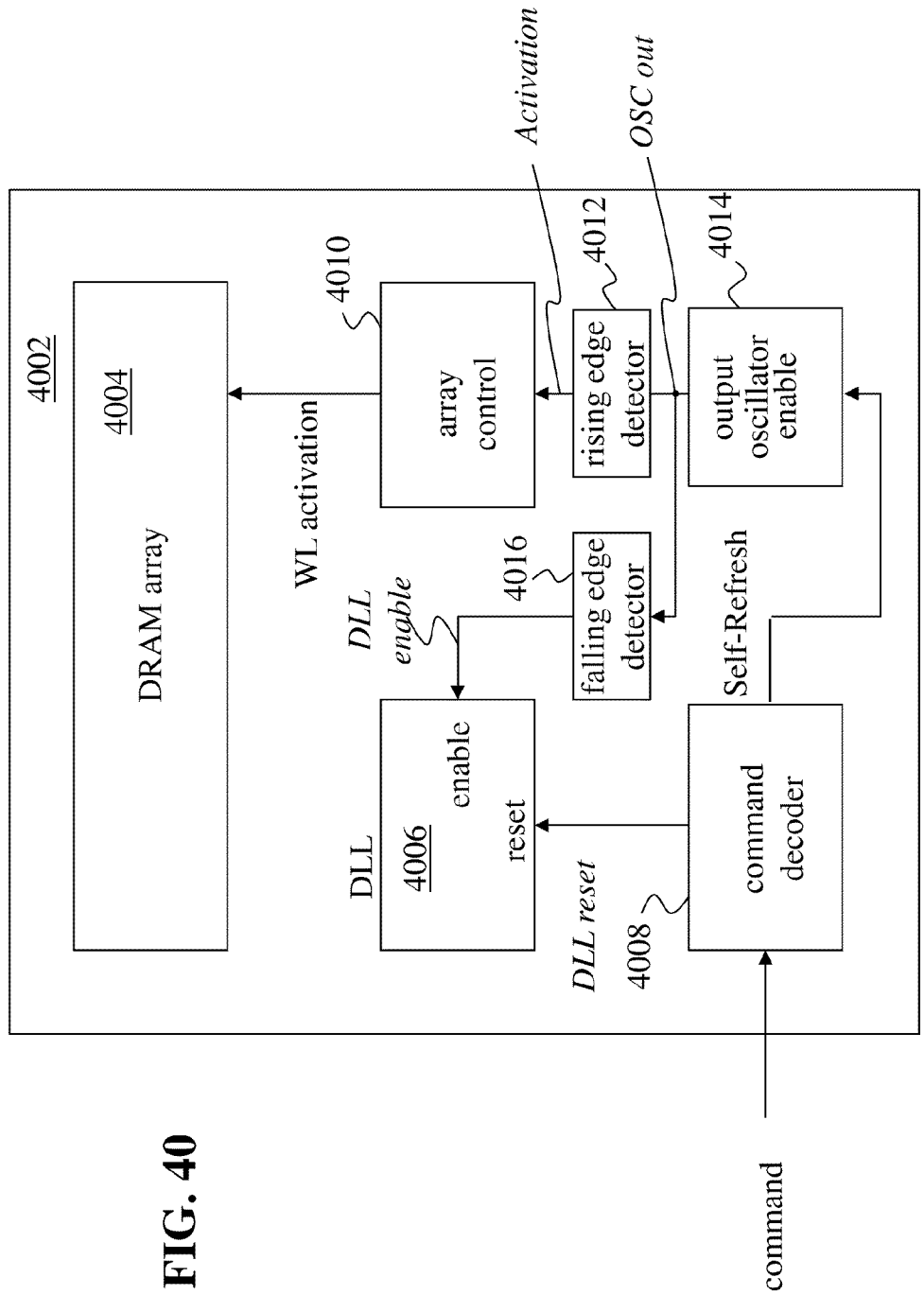
FIG. 40 depicts a block diagram of a DRAM that may be implemented by an alternate exemplary embodiment.

FIG. 40 depicts a block diagram of a DRAM that may be implemented by an alternate exemplary embodiment. The DRAM 4002 depicted in FIG. 40 includes a DRAM array 4004, an array control 4010, a rising edge detector 4012, a falling edge detector 4016, an oscillator 4014, a DLL 4006, and a command decoder 4008. Upon receipt of an enter self refresh command by the command decoder 4008, the command decoder 4008 then transmits a self-refresh signal to the oscillator 4014. In response to receiving the self-refresh enable signal, the oscillator 4014 is powered on. The rising edge detector 4012 then looks for a rising edge on the oscillator output ("OSC out"). When a rising edge is detected by the riding edge detector 4012 array control signals, or word line activation signals, are sent to the array control 4010 to refresh one or more word lines of the DRAM array 4004. In addition, the falling edge detector 4016 looks for a falling edge from OSC out, and when a falling edge is detected, a signal is set to the DLL 4006. The signal from the falling edge detector 4016 causes the DLL 4006 to be powered on for a brief period of time (the period of time may be pre-determined and different depending on the type of DRAM, and/or conditions previously described) to update/resynchronize the DLL 4006 to reflect the current environmental conditions. The DLL 4006 is then powered off. When a self-refresh exit command is received by the command decoder 4008, the memory device 4002 again begins to process memory access commands as the DLL 4006 is sufficiently synchronized and locked to permit normal DRAM operation Activating the DLL update and the DRAM array refresh at different times, as depicted in FIG. 40, allows the DLL update to occur when there is no power supply noise due to activation of the array control 4010 and the DRAM array 4004 during refresh of the memory cells, further reducing the time to re-lock the DLL. Though not shown in the diagram, one skilled in the art would recognize that the DLL is also enabled when the DRAM is active.

Figure 41:
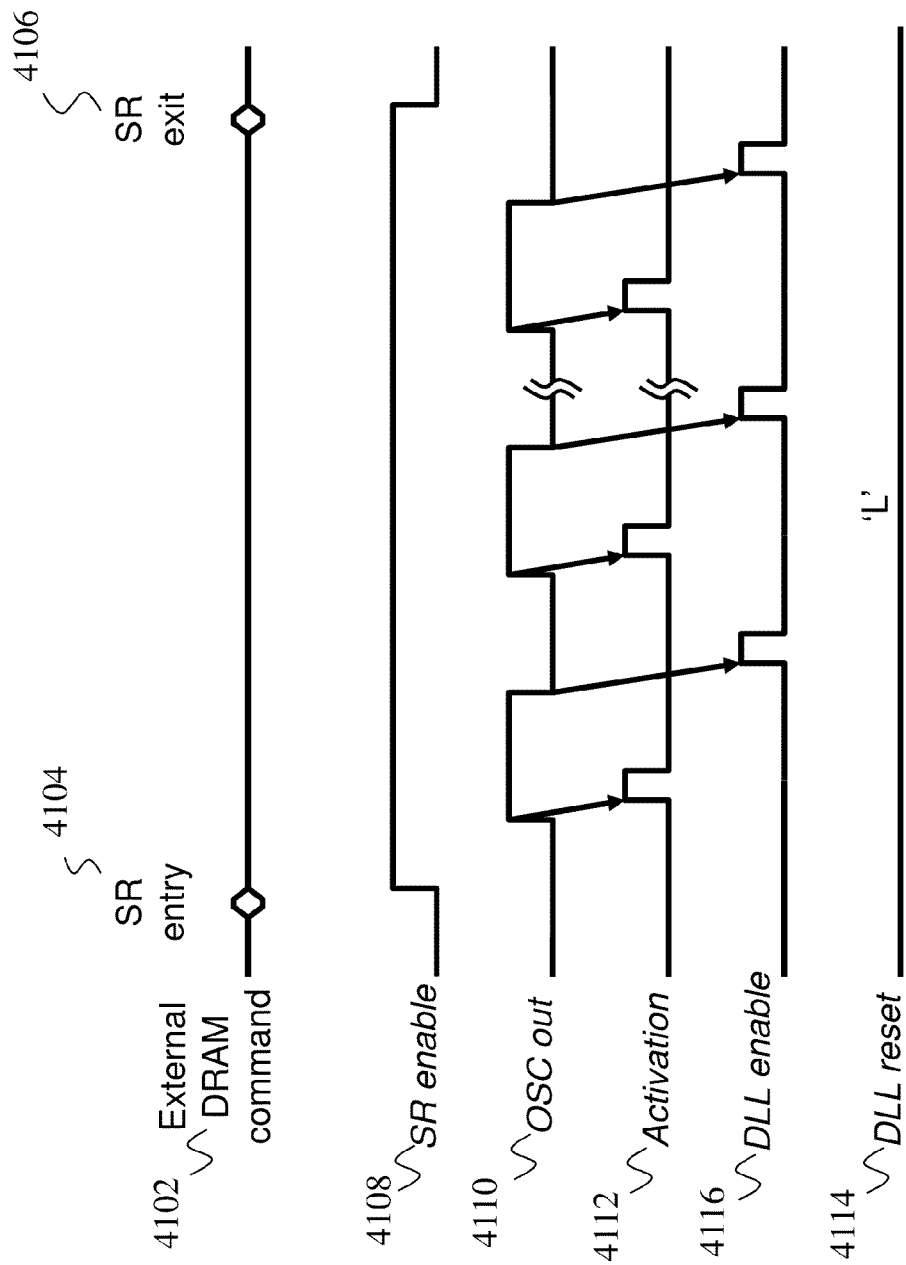
FIG. 41 depicts an internal timing diagram of the DRAM depicted in FIG. 40 during a self-refresh that may be implemented by an exemplary embodiment.

FIG. 41 depicts an internal timing diagram of the DRAM depicted in FIG. 40 during a self-refresh that may be implemented by an exemplary embodiment. As shown in FIG. 41 a self-refresh entry command 4104 is received at the command decoder 4008 via an external DRAM command bus 4102. In response, the command decoder 4008 sends a self-refresh enable signal 4108 to the oscillator 4014 to enable (power on) the oscillator 4014. When the oscillator 4014 is enabled, it generates a slow speed clock, OSC out 4110. When the rising edge detector 4012 detects a rising edge in OSC out 4110 it generates the activation signal 4112 to cause the array control 4010 to perform a refresh of one or more word lines of the DRAM array 4004. At a later time, when the falling edge detector 4016 detects a falling edge in OSC out 4110 it generates a DLL enable signal 4116 and sends it to the DLL 4006 to power on the DLL 4006 for a short period of time. Once the period of time has elapsed the DLL 4006 is powered down. This process of generating the activation signal 4112 and DLL enable signal 4116 continues until a self-refresh exit command 4106 is received by the external DRAM command bus 4102. In response to receiving the self-refresh exit command 4106, the oscillator 4014 is powered off. Then, the memory device again begins to process memory access commands as the DLL 4006 is sufficiently synchronized and locked to permit normal DRAM operation. As evidenced by the timing relationships between the array refresh operations (e.g. 4112) and that of the DLL update operation (e.g. 4116), sufficient time is allowed to ensure that both the DRAM refresh and DLL update operations are completed without power supply noise induced by the operation of the other, further benefiting the DLL update operation by potentially reducing the re-locking time.

Figure 42:
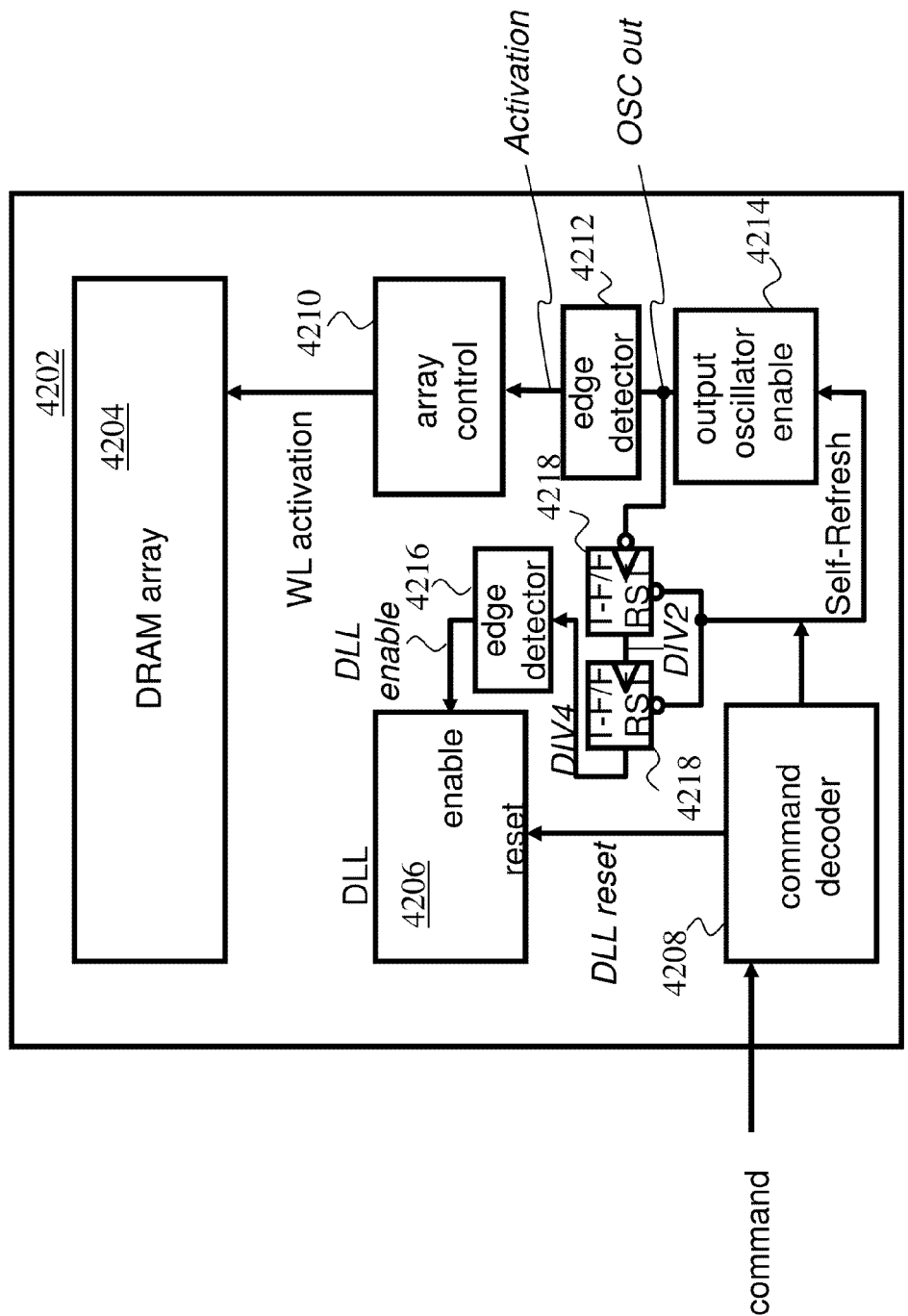
FIG. 42 depicts a block diagram of a DRAM that may be implemented by an alternate exemplary embodiment.

FIG. 42 depicts a block diagram of a DRAM that may be implemented by an alternate exemplary embodiment. The DRAM 4202 depicted in FIG. 42 includes a DRAM array 4204, an array control 4210, a first edge detector 4212, a second edge detector 4216, an oscillator 4214, a DLL 4206, a command decoder 4208, and two flip-flop circuits 4218. The DRAM 4202 depicted in FIG. 42 allows the refresh of the memory cells in the memory array 4204 to be performed at one rate, and the DLL updating to be performed at a second rate. In this example, the memory device refresh is being performed four times for every DLL update. Other ratios between the refresh and DLL update may be implemented by exemplary embodiments and based on memory device and/or environmental characteristics. Though not shown in the diagram, one skilled in the art would recognize that the DLL is also enabled when the DRAM is active.

Figure 43:
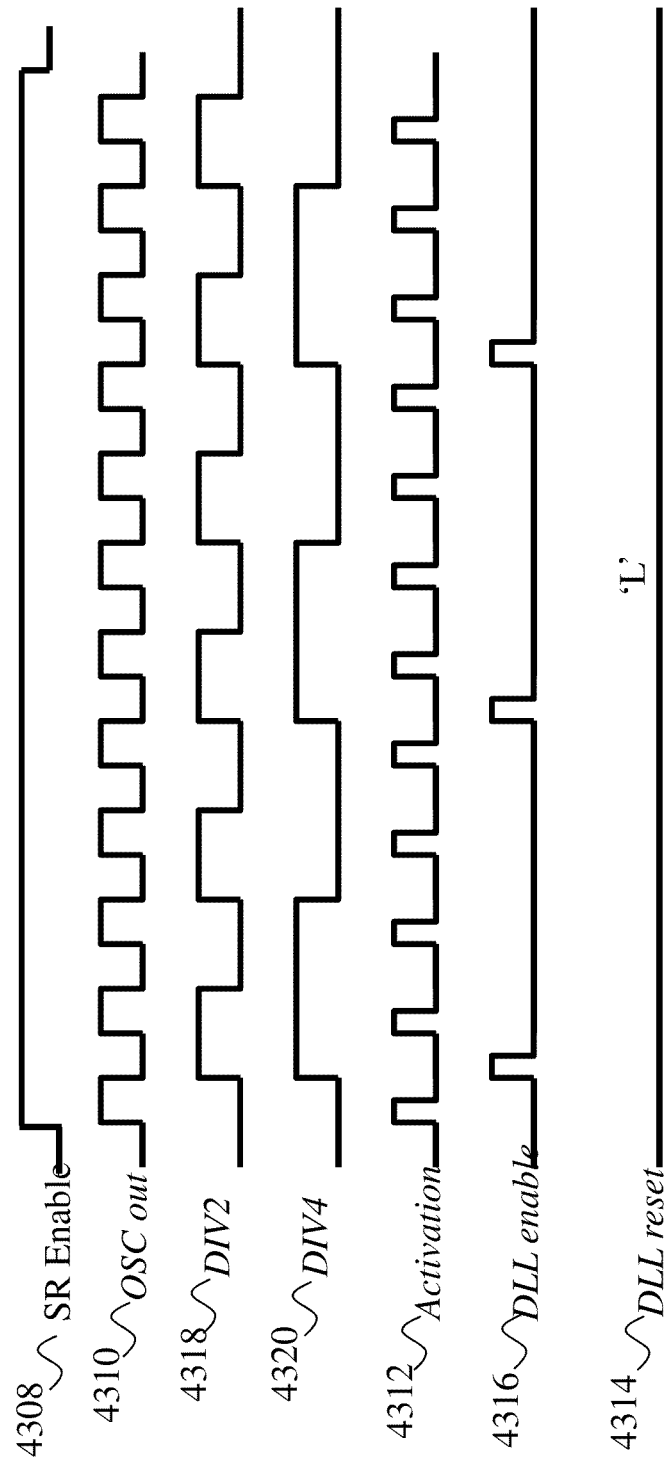
FIG. 43 depicts an internal timing diagram of the DRAM depicted in FIG. 42 during a self-refresh that may be implemented by an exemplary embodiment.

FIG. 43 depicts an internal timing diagram of the DRAM depicted in FIG. 42 during a self-refresh that may be implemented by an exemplary embodiment. As shown in FIG. 43, while the SR enable signal 4308 is high, the oscillator is outputting an OSC out signal 4310 to drive the refresh of the memory cells in the DRAM array 4204 using an activation signal 4312 that performs the refresh in response to detecting a rising edge (could also be falling edge or both falling and rising edge) of the OSC out signal 4310. The DIV2 signal 4318 is derived from the OSC out signal 4310, which is then used to generate the DIV4 signal 4320 (e.g. using T-flip flops 4218). As shown in FIG. 43, the DLL enable signal 4316 is driven in response to a rising edge and could also be driven in response to a falling edge as previously shown in FIG. 41, both falling and rising edge, etc) of the DIV4 signal 4320. Other circuitry arrangements and ratios may be implemented by exemplary embodiments. DLL reset 4314 is inactive during this period, as a DLL reset is not needed in this embodiment—since the DLL is retained in a "locked" (or closely locked") condition throughout the self refresh mode.

Figure 44:
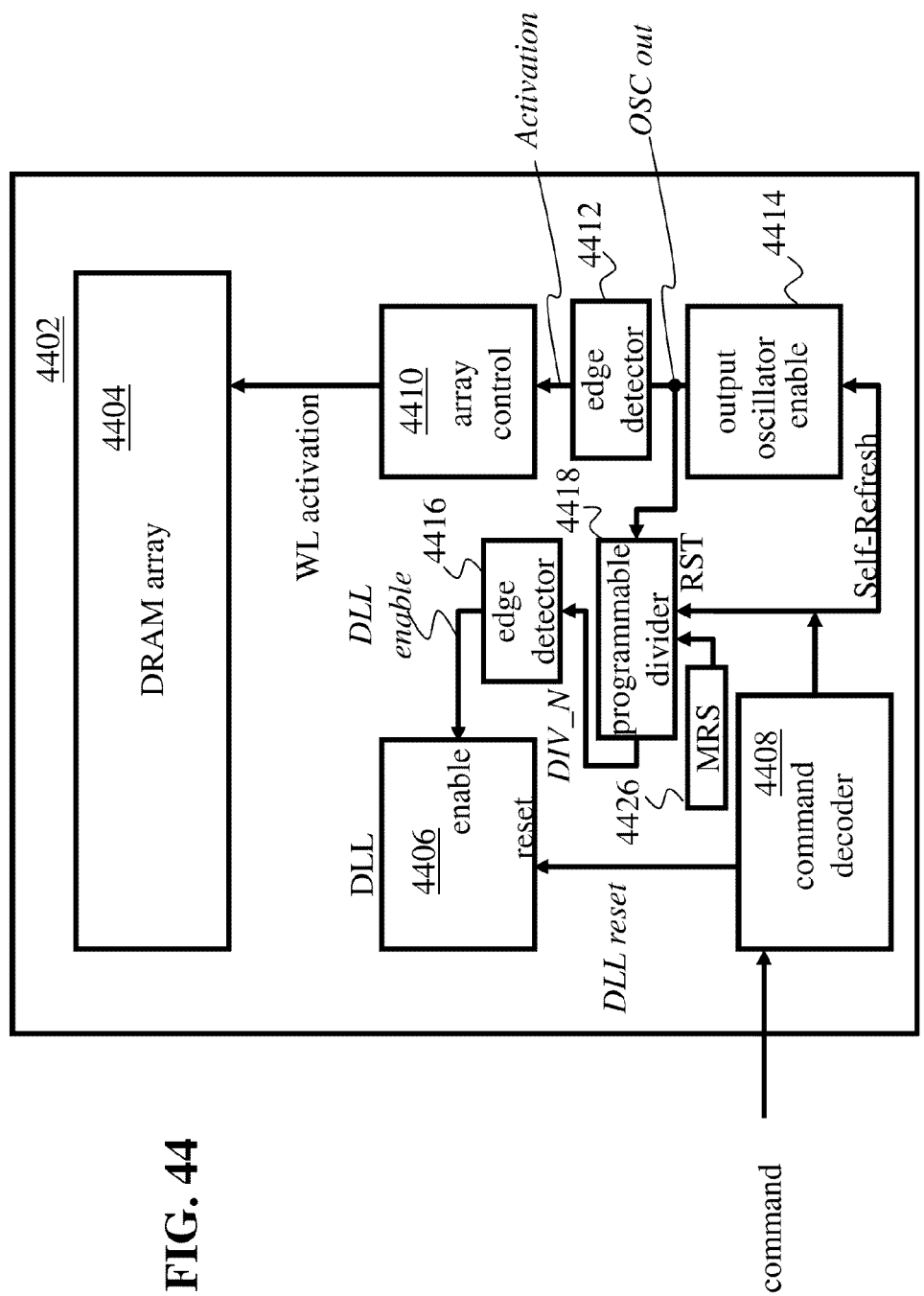
FIG. 44 depicts a block diagram of a DRAM that may be implemented by an alternate exemplary embodiment.

FIG. 44 depicts a block diagram of a DRAM that may be implemented by an alternate exemplary embodiment. The DRAM 4402 depicted in FIG. 44 includes a DRAM array 4404, an array control 4410, a first edge detector 4412, a second edge detector 4416, an oscillator 4414, a DLL 4406, a command decoder 4408, a programmable divider 4418, and a mode register set command 4420 stored in a mode register. The DRAM 4402 depicted in FIG. 44 allows the refresh of the memory cells in the memory array 4404 to be performed at one rate, and the DLL updating to be performed at a second rate. In this example, the ratio of the refreshing to the DLL updating is controlled by the programmable divider 4418. The programmable divider 4418 is set in response to the mode register set command 4420. Thus, different ratios can be implemented by the DRAM based on a variety of factors such as type and/or density of the memory device, variability of environmental conditions, etc. In addition, the ratio could be changed during system initialization or during run time. This embodiment offers dramatic flexibility with very low circuit count, further increasing the benefit of the active use of self refresh during normal operation, with fast exit and execution of normal memory commands. Though not shown in the diagram, one skilled in the art would recognize that the DLL is also enabled when the DRAM is active.

Figure 45:
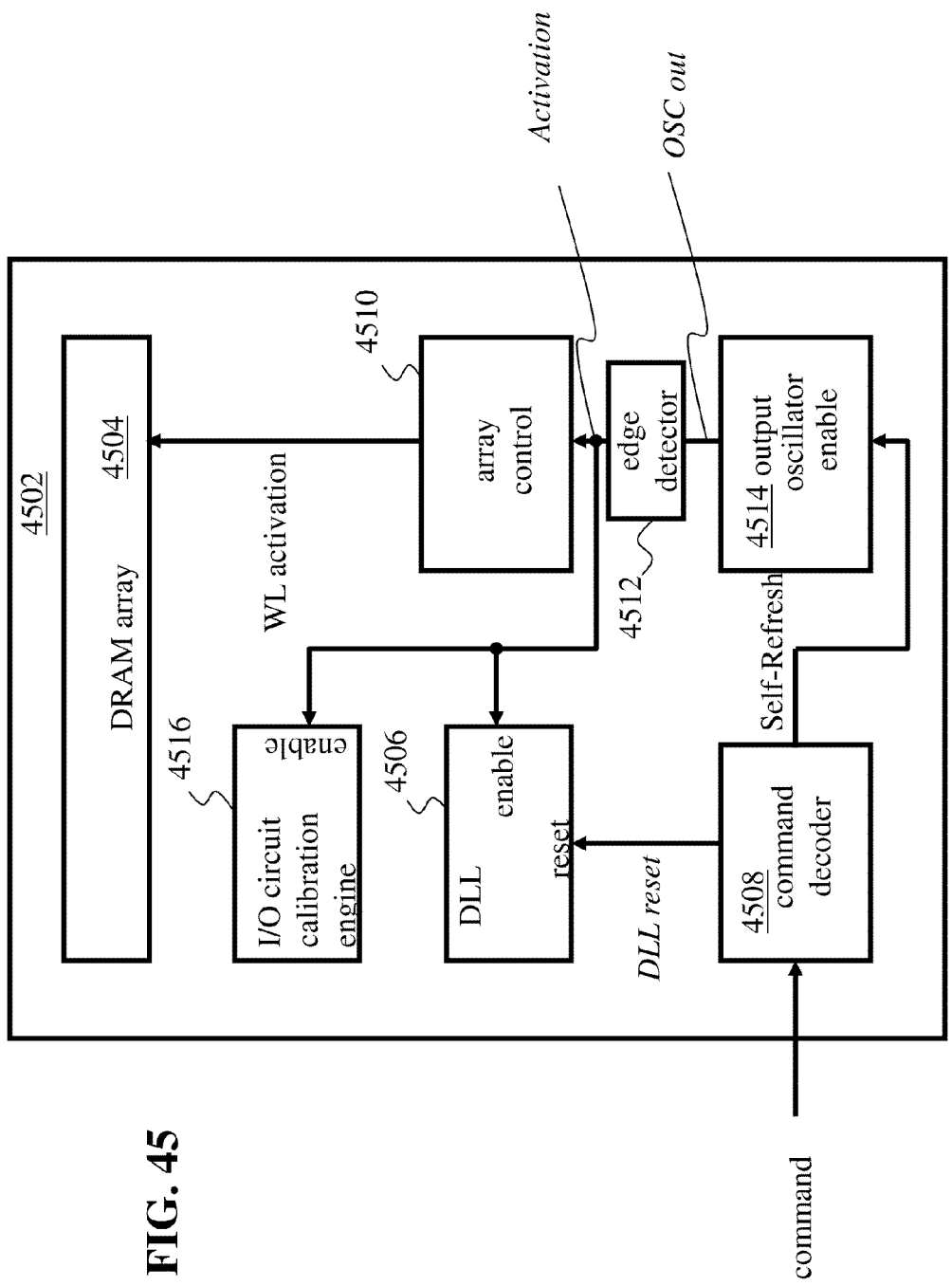
FIG. 45 depicts a block diagram of a DRAM that may be implemented by an alternate exemplary embodiment.

FIG. 45 depicts a block diagram of a DRAM that may be implemented by an alternate exemplary embodiment. The DRAM 4502 depicted in FIG. 45 includes a DRAM array 4504, an array control 4510, an edge detector 4512, an oscillator 4514, a DLL 4506, a command decoder 4508, and an I/O circuit calibration engine 4516. The DRAM 4502 depicted in FIG. 45 shows how, in addition to performing DLL synchronizing during self-refresh mode (using any combination of the embodiments previously discussed), that other functions can also be performed while the DRAM is in self-refresh mode. This embodiment is especially useful for applications wherein two or more self-refresh options exist in the memory device, with this option exceedingly useful for short self-refresh intervals. In the example depicted in FIG. 45, I/O circuit (e.g., data driver, on-die terminator, input receiver, etc.) calibration is periodically performed while the DRAM 4502 is in self-refresh mode, further reducing the time wherein normal operation can be initiated upon exiting from self-refresh. Though not shown in the diagram, one skilled in the art would recognize that the DLL is also enabled when the DRAM is active.

Alternate exemplary embodiments may perform any training required for normal communications/operation of the DRAM 4502 during the self refresh condition, such that entry and exit times from self refresh can be minimized to allow for greater system power reduction. The DLL synchronizing during self-refresh mode described herein is intended to be an example of a training process and is not intended to limit exemplary embodiments to only those DRAMs that perform DLL synchronizing during self-refresh mode. Exemplary embodiments are directed to DRAMs that can perform a training process during self-refresh mode that may or may not include DLL synchronizing, such that normal operation can be initiated immediately or nearly immediately upon exit. Exemplary embodiments allow for adjustments for environmental changes (e.g., noise, temperature change, voltage drift, etc.) to be made during self-refresh mode. This may result in expediting the time required between exiting the self-refresh mode and processing memory access commands.

Further exemplary embodiments include a memory device that controls how often to perform refreshes (auto-refresh and self-refresh) based on a current temperature of a memory device, even when instructed to complete a refresh operation. Memory devices, or DRAMS, perform two or more different types of refresh operations with the most common being self-refresh (during which time refresh is initiated by the DRAM) and auto-refresh (wherein a DRAM receives a refresh command and performs the refresh operation in response to the command from a memory controller, buffer, etc.). In general, a DRAM's refresh period should be shortest at hot temperatures because leakage current is higher at elevated temperatures. This implies that the DRAM refresh period could be longer when the DRAM is at a lower temperature. The temperature of a DRAM can be measured by a temperature sensor located inside the DRAM or near the DRAM (e.g. on the DRAM module/DIMM). The temperature reading will generally be more accurate when a temperature sensor is located on the DRAM.

In proposed memory device structures, a memory controller and/or buffer may read the temperature from a temperature sensor on a memory device or DIMM (e.g., via executing a command requesting the temperature and/or in response to information provided to the memory controller and/or buffer indicating that an temperature level has been achieved or exceeded) and, in response, adjust the auto-refresh rate of the circuitry controlling the refresh rate—to ensure that data is not corrupted due to lost data. In this scenario, the memory controller adjusts the auto-refresh rate of all of the DRAMs attached to the memory module (e.g. via a buffer device) based on the temperature reported by the temperature sensor (which may be inside the hottest device or placed on a DIMM in an area which is currently hot). Some DRAMs that don't require refresh are likely to be included in the group of DRAMs refreshed because not all DRAMs attached to a memory module will necessarily be at the same temperature. The temperature of a DRAM generally is affected by its location on the memory module (e.g., the DRAM nearest to the airflow is the coolest), the amount of activity in process on the DRAM, the location of the DRAM relative to other heat sources (such as buffer or hub devices), etc.

Exemplary embodiments provide a self-adjusting method of controlling a refresh rate inside a DRAM by skipping (or ignoring) external refresh commands when the memory device temperature is such that a refresh is not required. The rate of refresh is determined by the DRAM based on the temperature of the DRAM and only partially related to the receipt of refresh commands. In an exemplary embodiment, skipping of refresh operations by a given memory device is be skipping every other refresh (2× period, 0.5× rate) or some other ratio such as two out of seven (7/2× period, 0.286× rate), etc. This embodiment both ensures that each DRAM in a memory system is refreshed as needed (based on local device data) as well as reducing overall system power—especially in systems having large numbers of DRAMs (e.g. large servers).

Figure 46:
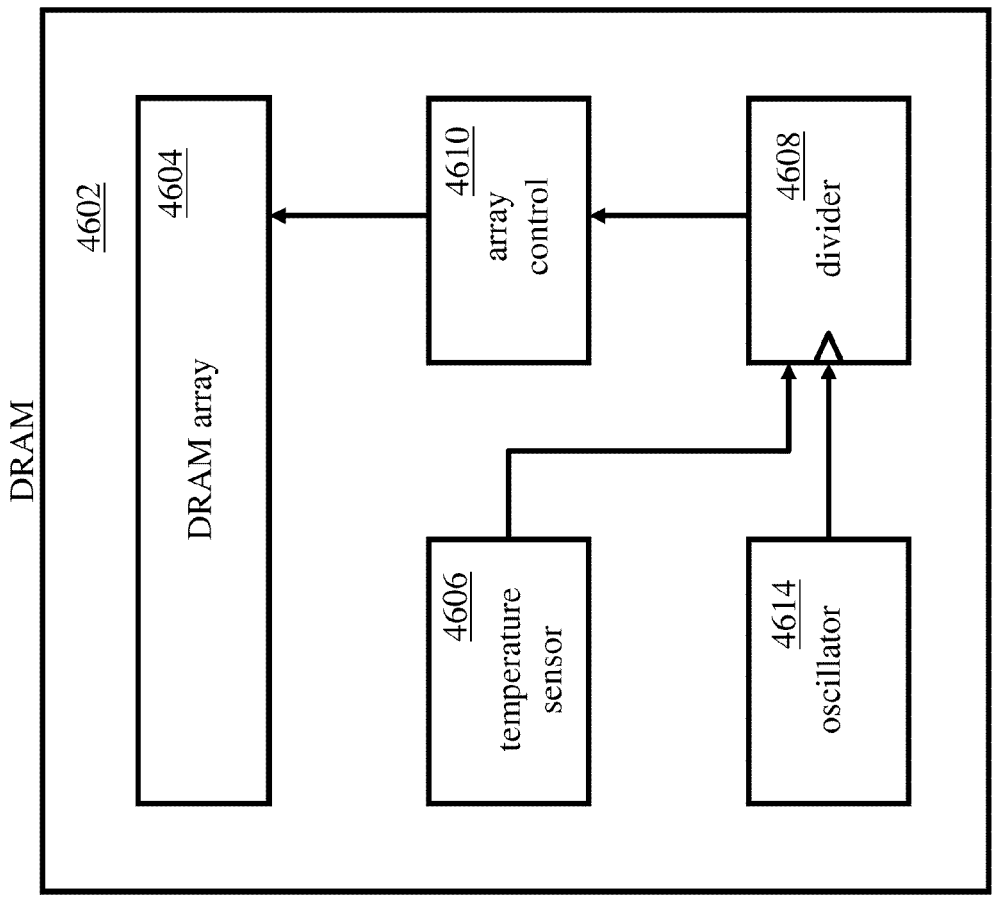
FIG. 46 depicts a DRAM having an internal temperature controlled self-refresh capability.

FIG. 46 depicts a DRAM having an internal temperature controlled self-refresh capability. The DRAM 4602 depicted in FIG. 46 includes a DRAM array 4604, an array control 4610, a temperature sensor 4606, an oscillator 4614, and a divider 4608 (also referred to herein as an edge detector). The oscillator 4614 regularly identifies the times at which a self refresh should occur and feeds this information to divider 4608 which determines, in conjunction with the data provided by temperature sensor 4606, whether a refresh operation, for that device, is appropriate at the given time. Should the temperature sensor input, in combination with the oscillator, indicate that a refresh is appropriate, the divider 4608 causes a signal to be sent to the array control 4610 to initiate a refresh of one or more memory cells (generally comprised in one or more word lines) in the DRAM array 4604. In this manner, the refresh can occur more often when the DRAM 4602 is at high temperature (e.g., as defined by a DRAM temperature sensor and/or in conjunction with a mode register setting based on a memory device specification) and less often when the DRAM 4602 is at a low temperature—thereby retaining data while reducing unnecessary power consumption for the device.

Figure 47:
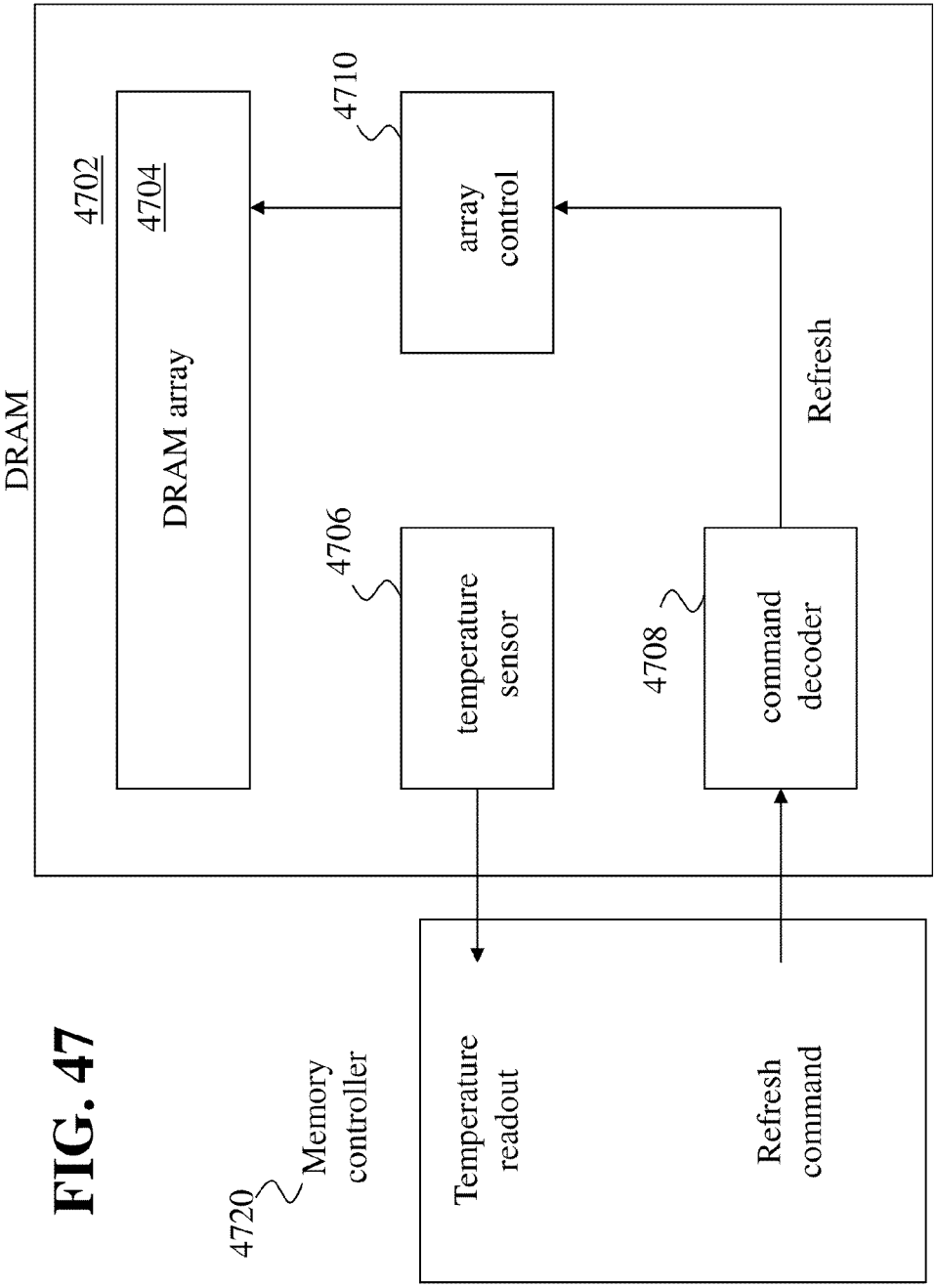
FIG. 47 depicts a DRAM having an external temperature controlled auto-refresh capability.

FIG. 47 depicts a DRAM having an external temperature controlled auto-refresh capability. The DRAM 4702 depicted in FIG. 47 includes a DRAM array 4704, an array control 4710, a temperature sensor 4706, and a command decoder 4708. The DRAM 4702 transmits temperature read out data from the temperature sensor 4706 to a memory controller (or buffer) 4720. In addition, the DRAM 4702 receives external refresh (or auto-refresh) commands from the memory controller 4720. In this manner, the memory controller 4720 monitors the temperature of the memory devices and controls the issuing of auto-refresh commands to the DRAM 4702. This method places a tremendous burden on the memory controller (or buffer) as it may need to monitor as many as all of the memory devices under its control and issuing numerous and potentially random refresh commands further reducing available command bandwidth.

Figure 48:
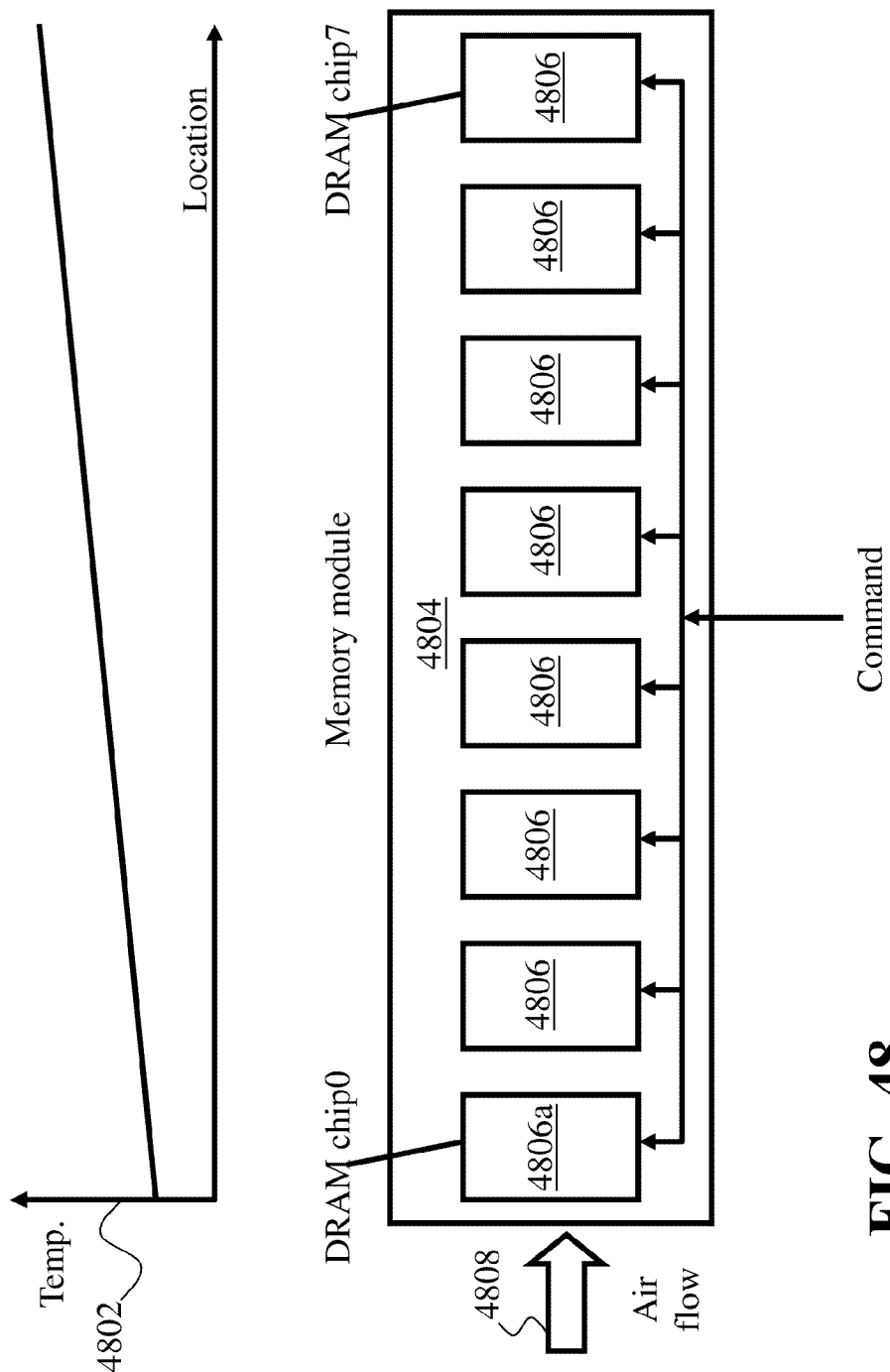
FIG. 48 depicts a temperature controlled external refresh of a group of memory devices located on a memory module.

FIG. 48 depicts a temperature controlled external refresh of a group of memory devices located on a memory module. FIG. 48 includes a memory module 4804 with an air flow 4808 coming in from the left and passing across eight DRAMs 4806 before exiting on the right. As shown in the graph 4802, the temperature of a memory devices may increase as the distance from the air flow source 4802 increases, in conjunction with the air temperature rise due to memory devices transferring heat to the air as it passes, air leakage as it passes across the module, etc. Thus, it is likely that the DRAM 4806 labeled DRAM chip 7 has a higher temperature than the DRAM 4806 labeled DRAM chip 0, if for no other reason, the distance from the initial air flow source—in addition to other elements previously described. As currently implemented, even though the DRAM 4806 labeled DRAM chip 0 could be refreshed at a slower rate, all of the DRAMs 4806 will be refreshed at the same rate to accommodate the hottest DRAM (likely DRAM chip 7) because all of the DRAMs 4806 in the memory module 4804 share the same refresh command from the memory controller. The diagram 4802 at the top of FIG. 48 represents a simplistic view of the increase in air temperature as the input air passes from the first DRAM (DRAM chip 0) to the last DRAM on the module (DRAM chip 7).

Figure 49:
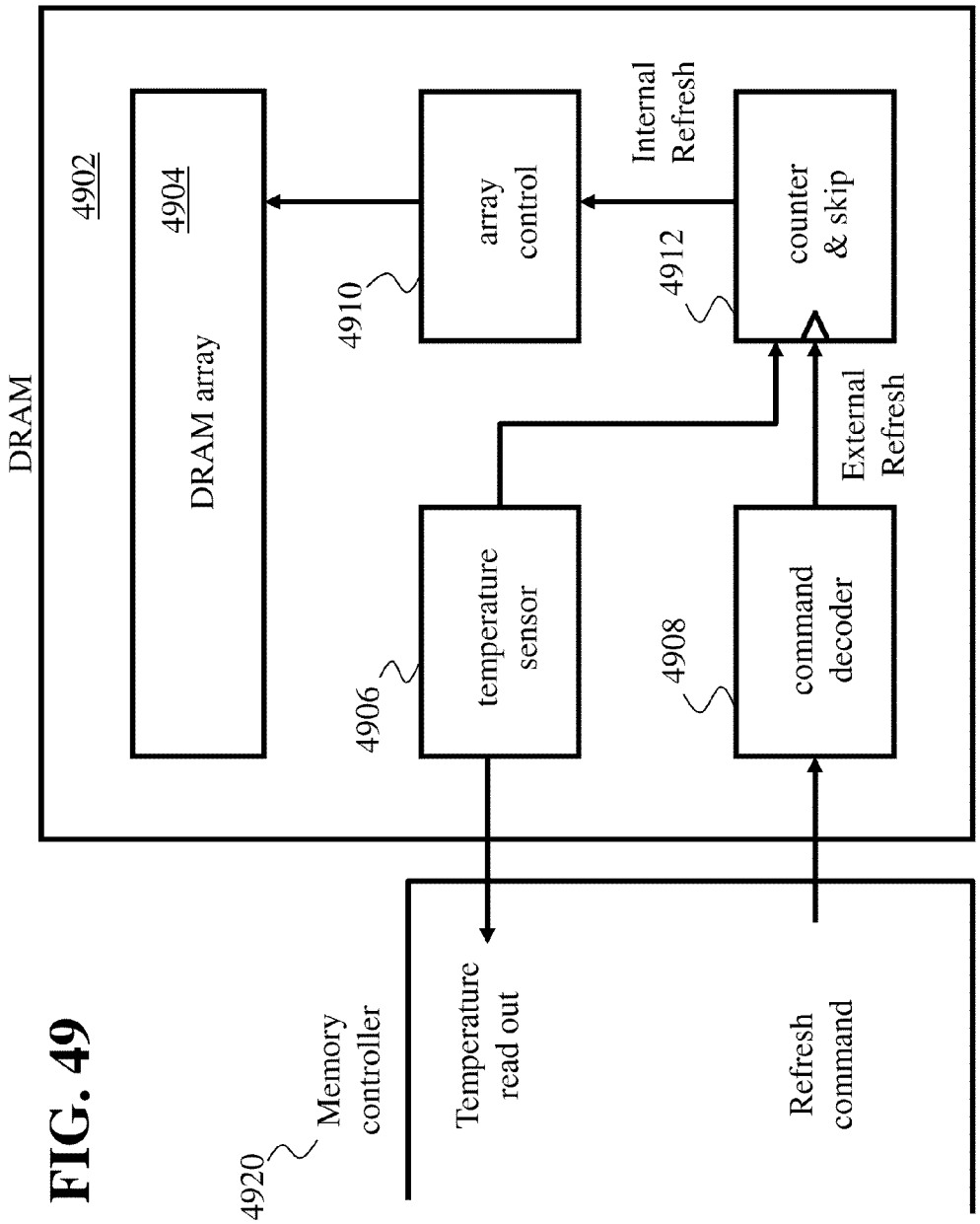
FIG. 49 depicts a DRAM having an internal temperature controlled auto-refresh capability that may be implemented by an exemplary embodiment.

FIG. 49 depicts a DRAM having an internal temperature controlled auto-refresh capability that may be implemented by an exemplary embodiment. The DRAM 4902 depicted in FIG. 49 includes a DRAM array 4904, an array control 4910, a temperature sensor 4906, a command decoder 4908, and counter and skip circuitry 4912. The DRAM 4902 may (or may not) transmit temperature read out data from the temperature sensor 4906 on the memory device to a memory controller 4920 while it transmits temperature data to the counter and skip circuitry 4912. In addition, the DRAM 4902 receives external refresh (or auto-refresh) commands from the memory controller 4920 and directs them to command decoder—once verified as auto refresh commands the commands are passed to the counter and skip circuitry 4912. The counter and skip circuitry 4912 further receives temperature sensor data from block 4906, and determines whether a refresh command from the memory controller 4920 will be applied to the DRAM 4902 based on a current temperature of the DRAM 4902. In this manner, auto refresh commands will either be executed (if required) or not executed (if not required)—based on local interpretation (e.g. by block 4912) of the current device temperature, the time since the last refresh operation execution, etc, the mode register information informing the DRAM of the refresh requirements for normal operation, etc.

In an exemplary embodiment, the counter and skip circuitry 4912 determines that based on a current temperature of the DRAM 4902 it will perform every other (or every one, or every third, or any other number) refresh command received from the memory controller 4920. In an alternate exemplary embodiment, the counter and skip circuitry 4912 waits a pre-specified number of clock cycles (e.g., depending on the current temperature of the DRAM) before executing the refresh command. In this manner, the memory controller 4920 monitors the temperature of the memory devices and each DRAM controls when or if the refresh commands from the memory controller 4920 will be applied. In an alternate exemplary embodiment, the current temperature from the temperature sensor 4906 is not output to the memory controller 4920, the memory controller 4920 issues periodic refresh commands, and each DRAM decides whether to apply the refresh commands from the memory controller based on a current temperature of the DRAM.

Figure 50:
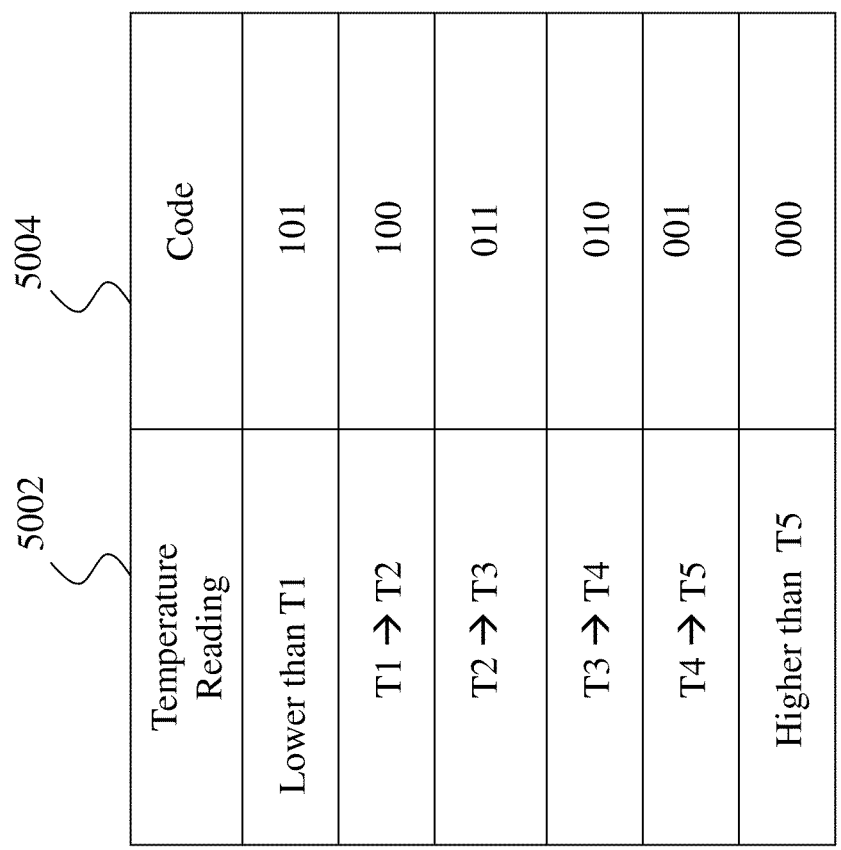
FIG. 50 depicts a table that may be implemented by an exemplary embodiment to convert a temperature reading from a temperature sensor into a binary code.

FIG. 50 depicts a table that may be implemented by an exemplary embodiment to convert a temperature reading 5002 from a temperature sensor into a binary code 5004. The binary code 5004 may be used to control when refreshes are performed. As depicted in FIG. 50, a temperature reading less than T1 (e.g., T1 equal forty five degrees) results in a code of "101", a temperature reading between T1 and T2 (e.g., between forty five degrees and fifty five degrees) converts into a code of "100", etc.

Figure 51:
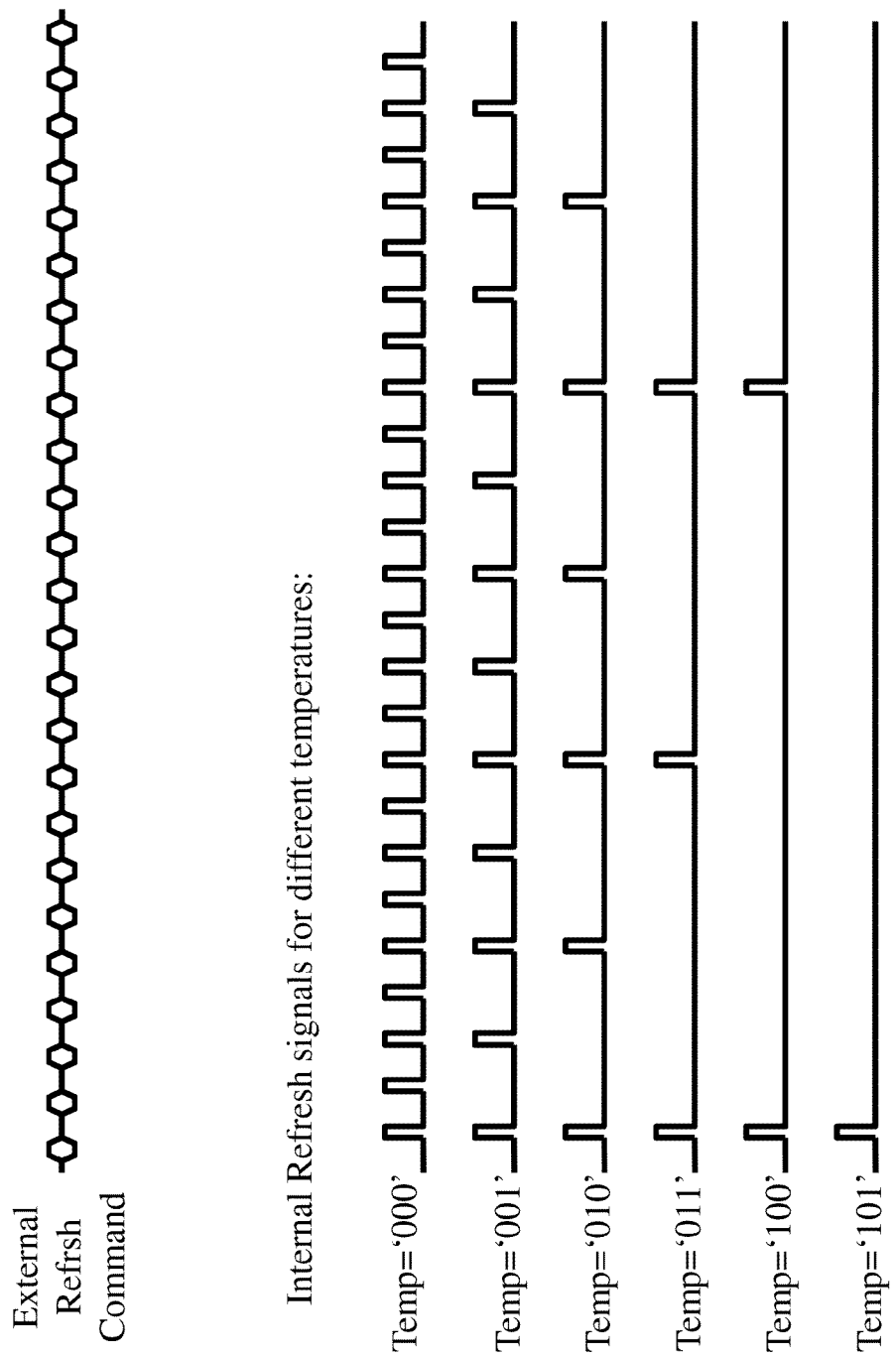
FIG. 51 shows how the codes in the table depicted in FIG. 50 may be used in an exemplary embodiment to control the frequency of internal refresh signals relative to refresh commands received from the memory controller.

FIG. 51 shows how the codes in the table depicted in FIG. 50 may be used in an exemplary embodiment to control the frequency of internal refresh signals relative to refresh commands received from the memory controller. In the embodiment depicted in FIG. 51, when the temperature is over the highest temperature limit (e.g. T5 in FIG. 50) the code 5004 is "000" and every refresh command received from the memory controller is executed. In FIG. 48, this may apply to DRAM chip 7. When the temperature is below a minimal temperature, T1, then the code 5004 is "101" and fewer than every sixteenth refresh command (e.g. every $32^{nd}$ refresh) received from the memory controller is executed by the DRAM. Similarly, if the temperature of the DRAM is between T1 and T2, every sixteenth refresh command is executed, between T2 and T3 every eighth, between T3 and T4 every fourth, and between T4 and T5 every second. In this manner, the memory controller does not need to know the temperature of the DRAM and it issues external refresh commands on a specified periodic basis to ensure that the worst case DRAM refresh requirement is met (e.g. based on the DRAM specification). Each DRAM then decides (e.g., via such elements as local device temperature information, mode register information related to the device, counter and skip circuitry) whether to execute a given refresh command received by the device.

Figure 52:
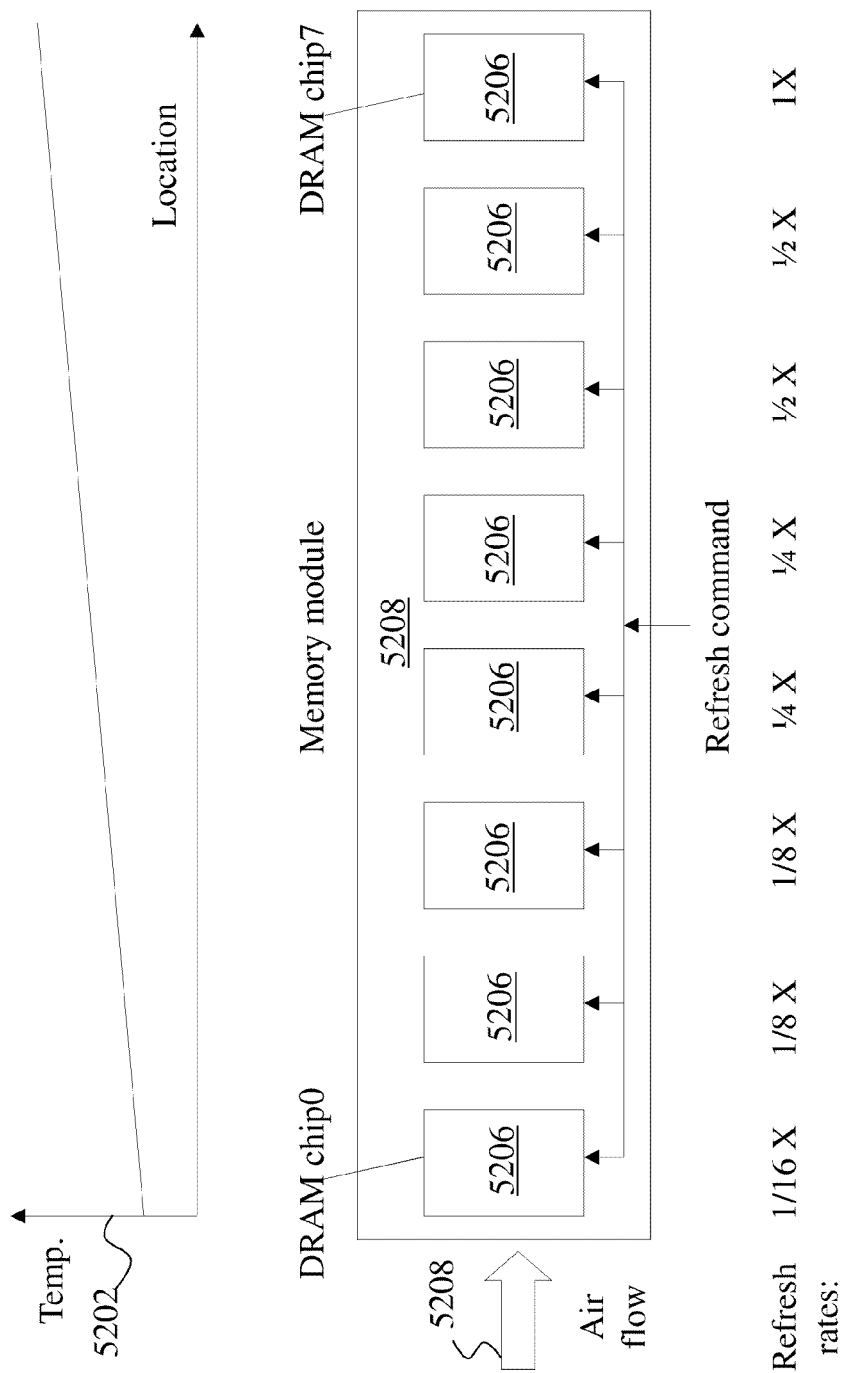
FIG. 52 depicts a memory module having DRAMs with internal temperature controlled auto-refresh capability that may be implemented by an exemplary embodiment.

FIG. 52 a memory module having DRAMs which include internal temperature controlled auto-refresh capability that may be implemented by an exemplary embodiment. FIG. 52 includes a memory module 5204 with an air flow 5208 coming in from the left, passing across eight DRAMs 5206 and exiting on the right of the module. As shown in the graph 5202, the temperature of the memory devices on the module may increase as the distance from each memory device from the input airflow 5202 increases. Thus, it is likely that the DRAM 5206 labeled DRAM chip 7 has a higher temperature than the DRAM 5206 labeled DRAM chip 0. As shown if FIG. 52, and at a given time, each DRAM has a certain frequency of refresh based in part on its location on a memory module 5208 (e.g., proximity to the air flow 5208) as well as other factors previously covered. As shown in FIG. 52, the DRAM 5206 closest to the air flow 5208 (the coolest DRAM 5206 labeled DRAM chip 0) performs one refresh for every sixteen external refresh commands that are received. The DRAM 5206 furthest from the airflow 5208 (the hottest DRAM 5206 labeled chip 7) performs a refresh every time that an external refresh command is received from the memory controller. In an exemplary embodiment, these ratios are implemented by the counter and skip circuitry in conjunction with local temperature sensing means, mode register data, etc (other counting means may be used) and the values are set during system initialization and are updated during run time based on local temperature variations. In an alternate exemplary embodiment, the ratios are dependent on the temperature and/or other information known to the memory device but not known to the memory controller such as cell leakage (with such information likely contained in a device register based on part number information, etc). In an alternate exemplary embodiment, memory cells in a portion of a memory device are refreshed at a different rate than memory cells in a different portion of the memory device as some cells have higher leakage. An exemplary embodiment of this invention accommodates the fact that a memory device that might not otherwise be classified as an "all good" memory device can function as an "all good" memory device by allowing increased refresh based on information known by and/or available to the memory device. Although not shown, refresh rates may be increased above that of the refresh rate (e.g. by the counter and skip logic 4912) provided by the memory controller to permit such memory devices to be utilized as "all good" devices. This feature may require the use of additional circuitry in one or more other devices such as the memory controller, a memory buffer, etc, to permit the return of data at an indeterminate (e.g. late) time if a refresh operation is underway on a DRAM upon receipt of a command from the memory controller (or buffer).

Figure 53:
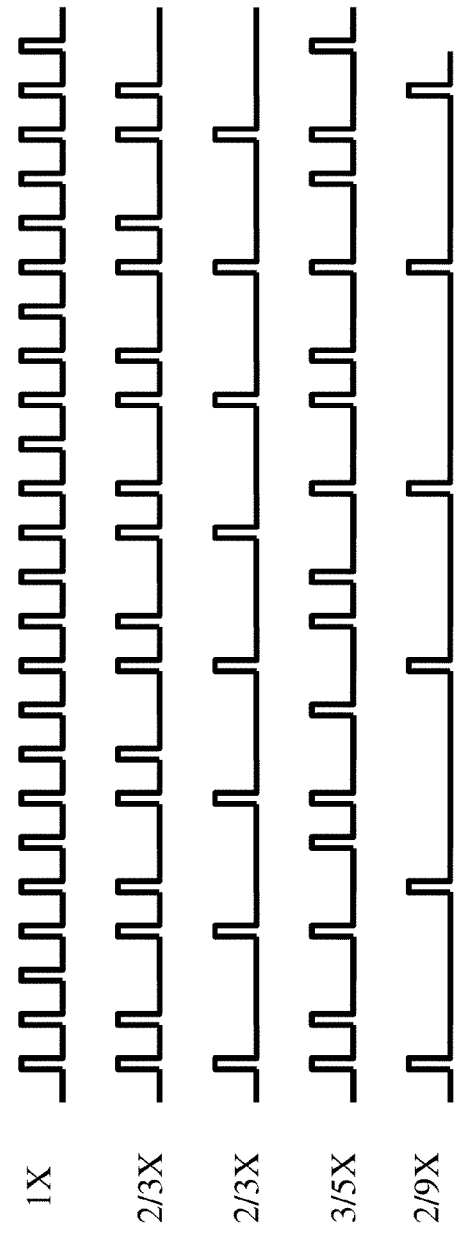
FIG. 53 shows an alternate exemplary embodiment having a different granularity for refresh rates than the embodiment depicted in FIG. 51.

FIG. 53 shows an alternate exemplary embodiment having a different granularity for refresh rates than the embodiment depicted in FIG. 51. Any number of ratios may be implemented by exemplary embodiments depending on implementation requirements, efforts to reduce on-chip noise, etc. These ratios may be implemented by one or more counters in the counter and skip circuitry.

Figure 54:
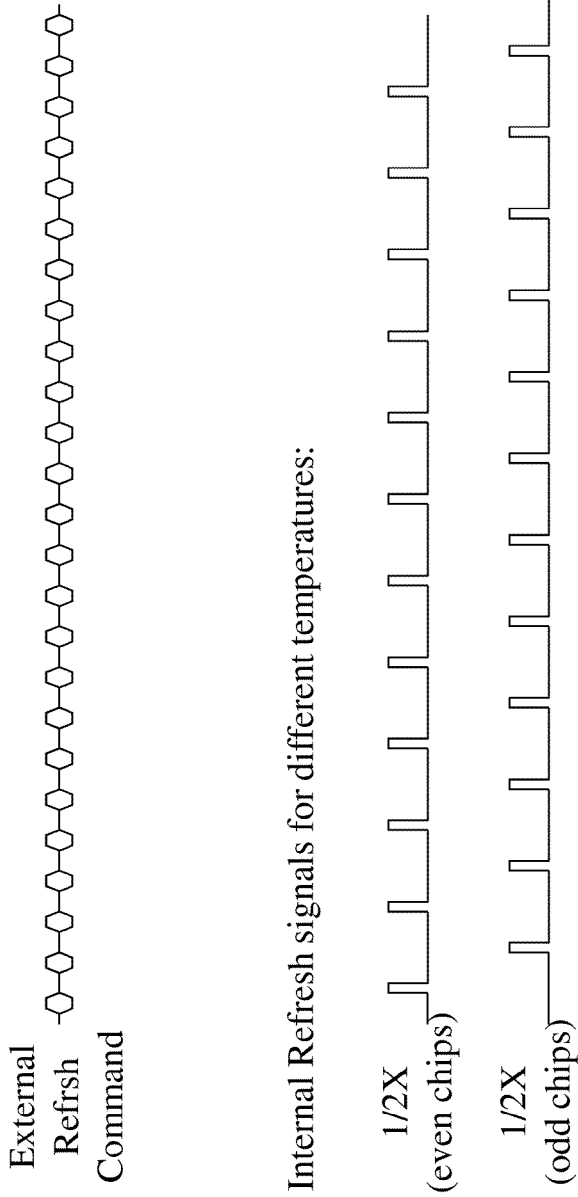
FIG. 54 depicts a method that may be implemented by an exemplary embodiment to distribute refreshes across a memory module to reduce peak currents.

FIG. 54 depicts a method that may be implemented by an exemplary embodiment to distribute refreshes across a memory module to reduce peak refresh currents. As depicted in FIG. 54, the even numbered DRAMs 5406 (as defined at system initialization) on the memory module 5408 are refreshed at the same time and the odd numbered DRAMs 5406 are refreshed at a different time. Alternate methods may be used to distribute refresh operations on a memory card or module, especially given the existence of on-DRAM temperature sensors and the means to communication DRAM temperatures (via a secondary bus such as a JTAG or I2C bus), a serial or alternate link connecting memory devices to a local buffer for the communication of local temperature and/or other informative device data, etc.

Figure 55:
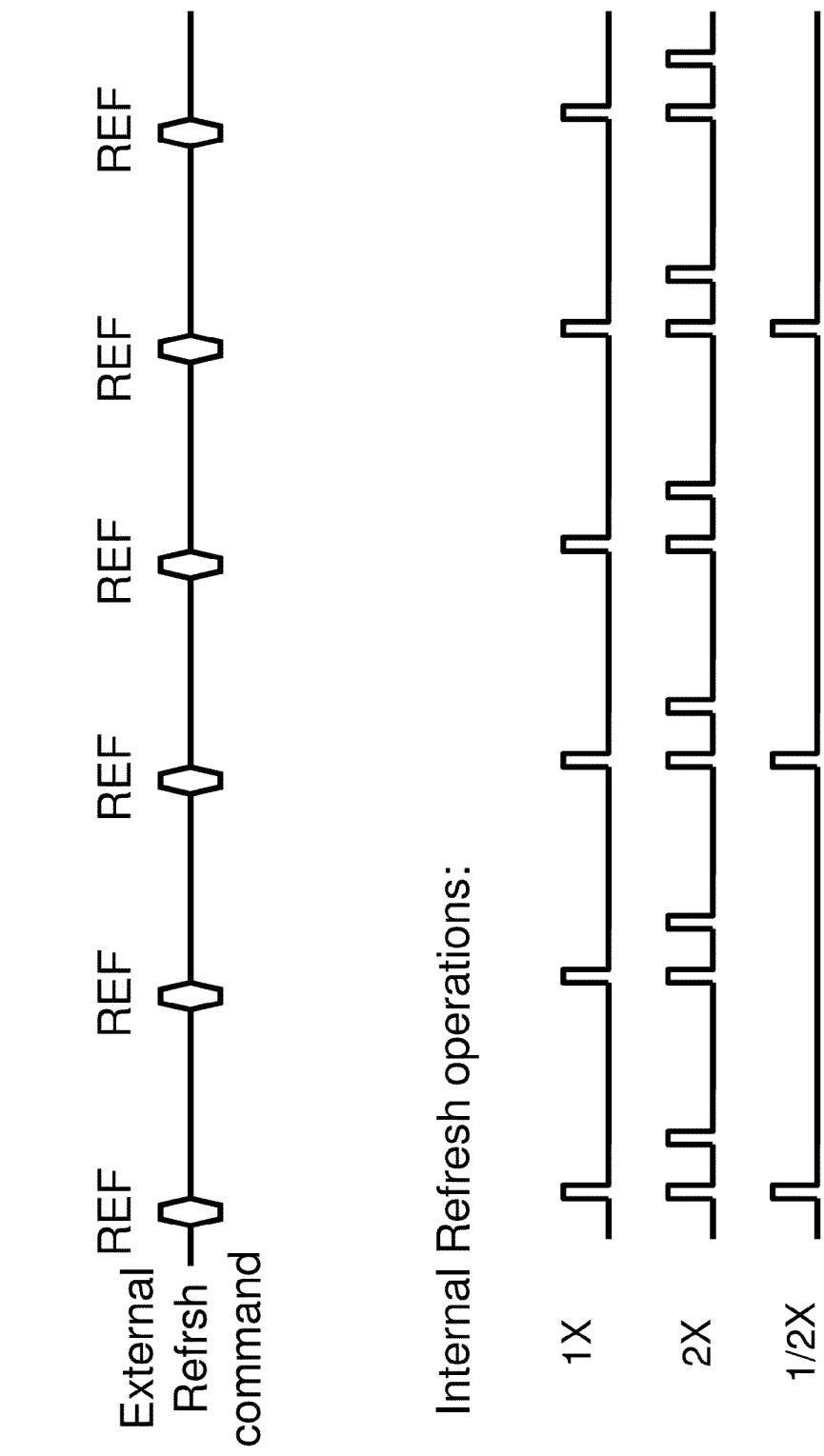
FIG. 55 shows an alternate exemplary embodiment for refresh rate granularity.

FIG. 55 shows an alternate exemplary embodiment having a different granularity for refresh rates. As depicted in FIG. 55, two internal refreshes may be performed for each external refresh command that is received. Thus, exemplary embodiments may be utilized to cause more than one refresh per external refresh command to occur. Any number of ratios may be implemented by exemplary embodiments depending on implementation requirements, efforts to reduce on-chip noise, etc. These ratios may be implemented by one or more counters in the counter and skip circuitry.

Figure 56:
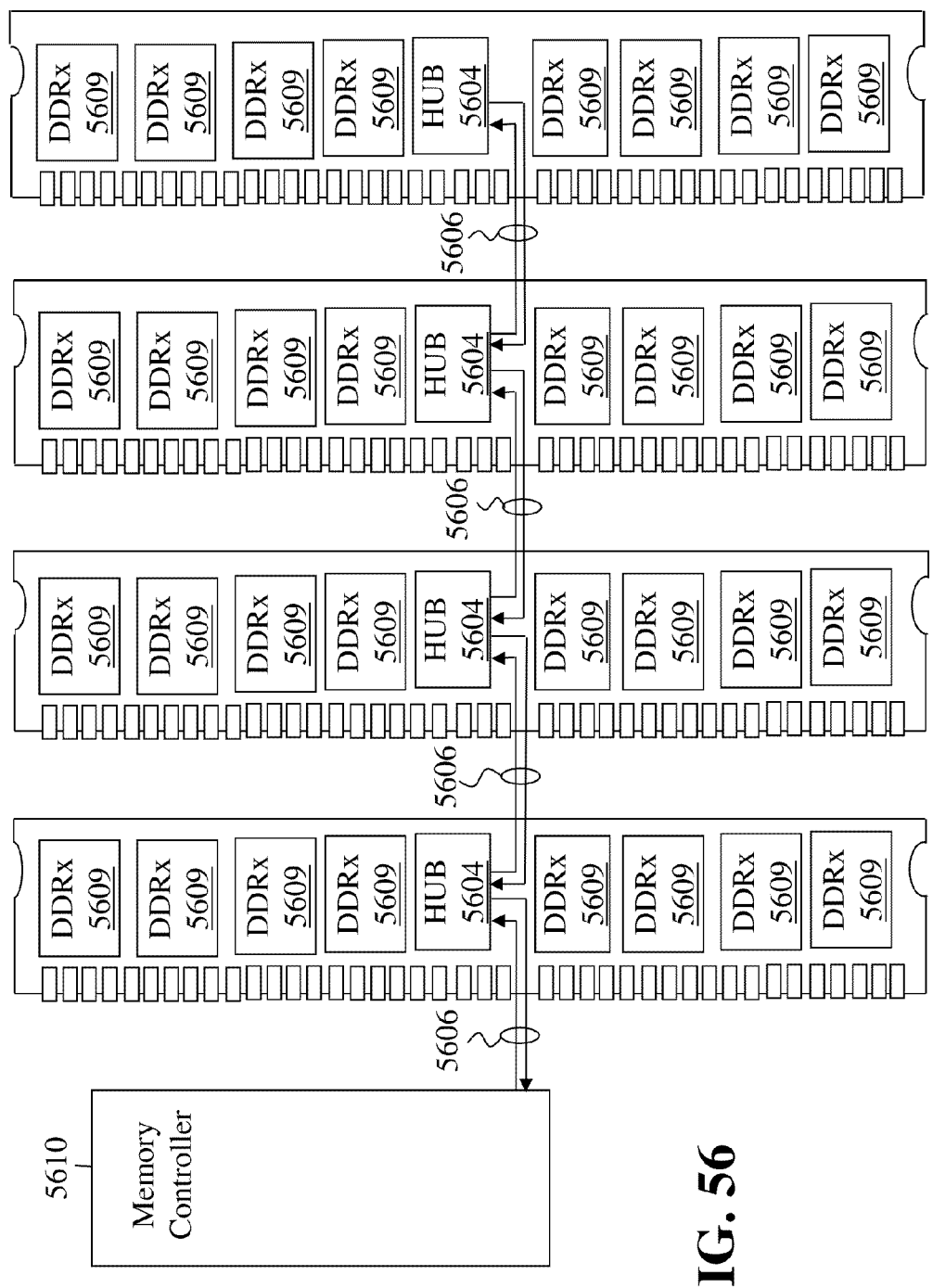
FIG. 56 depicts a memory system that may be implemented by exemplary embodiments.

FIG. 56 depicts a memory system with cascade-interconnected buffered memory modules 5603 and unidirectional buses 5606 that may be implemented by an exemplary embodiment. Although only a single channel is shown on the memory controller, most controllers will include additional memory channel(s), with those channels also connected or not connected to one or more buffered memory modules in a given memory system/configuration. One of the functions provided by the hub devices 5604 on the memory modules 5603 in the cascade structure is a cascade-interconnect (e.g. re-drive and/or re-sync and re-drive) function, which, in exemplary embodiments, is programmable to send or not send signals on the unidirectional buses 5606 to other memory modules 5603 or to the memory controller 5610. The final module in the cascade interconnect communication system may not utilize available unidirectional buses 5606 for connection to further buffered memory modules, although in the exemplary embodiment, such buses are present but powered-down to reduce system power consumption. FIG. 56 includes the memory controller 5610 and four memory modules 5603, each module connected to one or more memory buses 5606 (with each bus 5606 comprising a downstream memory bus and an upstream memory bus), connected to the memory controller 5610 in either a direct or cascaded manner.

The memory module 5603 next to the memory controller 5610 is connected to the memory controller 5610 in a direct manner. The other memory modules 5603 are connected to the memory controller 5610 in a cascaded manner (e.g. via a hub or buffer device). Each memory module 5603 may include one or more ranks of memory devices 5609 (or memory modules), such as the exemplary memory devices described herein.

In an exemplary embodiment, the speed of the memory buses 5606 is a multiple of the speed of the memory module data rate (e.g. the bus(es) that communicate such information as address, control and data between the hub, buffer and/or register device(s) and the memory devices), operating at a higher speed than the memory device interface(s). Although not shown, the memory devices may include additional signals (such as reset and error reporting) which may communicate with the buffer device 5604 and/or with other devices on the module or external to the module by way of one or more other signals and/or bus(es)—e.g. to a service processor. For example, the high-speed memory data bus(es) 5606 may transfer information at a rate that is four times faster than the memory module data rate (e.g. the data rate of the interface between the buffer device and the memory devices). In addition, in exemplary embodiments the signals received on the memory buses 5606 are in a packetized format and it may require several transfers (e.g., four, five, six or eight) to receive a packet. For packets intended for a given memory module, the signals received in the packetized memory interface format are converted into a memory module interface format by the hub devices 5604 once sufficient information transfers are received to permit communication with the memory device(s). In exemplary embodiments, a packet may comprise one or more memory device operations and less than a full packet may be needed to initiate a first memory operation. In an exemplary embodiment, the memory module interface format is a serialized format. In addition, the signals received in the packetized memory interface format are re-driven on the high-speed memory buses (e.g., after error checking and re-routing of any signals (e.g. by use of bitlane sparing between any two devices in the cascade interconnect bus) has been completed).

In the exemplary embodiment, the unidirectional buses 5606 include an upstream bus and a downstream bus each with full differential signaling, although other signaling methods may be used such as single-ended signaling, multi-level signaling, optical signaling, etc. As described previously, an exemplary downstream bus from the memory controller 5610 to the hub device 5604 includes sixteen differential signal pairs made up of thirteen active logical signals, two spare lanes, and a bus clock. An exemplary upstream bus from the hub device 5604 to the memory controller 5610 includes twenty-three differential signal pairs made up of twenty active logical signals, two spare lanes, and a bus clock.

Memory devices are generally defined as integrated circuits that are comprised primarily of memory (storage) cells, such as DRAMs (dynamic random access memories), SRAMs (static random access memories), FeRAMs (ferro-electric RAMs), MRAMs (magnetic random access memories), ORAMs (optical random access memories), flash memories and other forms of random access and/or pseudo random access storage devices that store information in the form of electrical, optical, magnetic, biological or other means. Dynamic memory device types may include asynchronous memory devices such as FPM DRAMs (fast page mode dynamic random access memories), EDO (extended data out) DRAMs, BEDO (burst EDO) DRAMs, SDR (single data rate) synchronous DRAMs, DDR (double data rate) synchronous DRAMs, QDR (quad data rate) synchronous DRAMs, toggle-mode DRAMs or any of the expected follow-on devices such as DDR2, DDR3, DDR4 and related technologies such as graphics RAMs, video RAMs, LP RAMs (low power DRAMs) which are often based on at least a subset of the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

The capabilities of the present invention can be implemented in software, firmware, hardware, or some combination thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A memory device comprising:
   an internal clock for generating clock signals;
   a command receiver for receiving commands;
   a data strobe driver for generating a data strobe signal, the data strobe signal utilized to capture data on a data bus, the capturing upon completion of a data strobe preamble time, wherein the completion of the data strobe preamble time indicates that the data strobe signal has achieved a steady switching state and is measured from receipt of a command on the command receiver;
   programmable preamble control circuitry in communication with the data strobe driver for determining when the data strobe preamble is completed, the programmable preamble control circuitry programmed during memory device initialization;
   a mode register storing a bit decoding table for determining a preamble length, the preamble length utilized by the programmable preamble control circuitry for determining when the preamble is completed, wherein the preamble length is a number of one or more clock cycles selected from the bit decoding table based on a current data rate of the memory device and a bus loading condition of the memory device,
   wherein the preamble length is further based on: a location of the memory device accessed by a previous command, and based on the location of the memory device accessed by the command.

2. The memory device of claim 1, wherein the programmable preamble control circuitry is further programmed while the memory device is during memory device run-time.

3. The memory device of claim 1, wherein the preamble includes at least one of a toggling preamble and a static preamble.

4. The memory device of claim 1, wherein the preamble length is responsive to one or more of an expected access rate on the memory device and speed of the data bus.

5. The memory device of claim 1, wherein the mode register includes two or more bits that are used to specify the preamble length.

* * * * *